(12) United States Patent
Kanai et al.

(10) Patent No.: US 9,224,729 B2
(45) Date of Patent: Dec. 29, 2015

(54) SEMICONDUCTOR DEVICE

(71) Applicant: FUJITSU SEMICONDUCTOR LIMITED, Yokohama, Kanagawa (JP)

(72) Inventors: Dai Kanai, Akiruno (JP); Taiji Ema, Inabe (JP); Kazushi Fujita, Kuwana (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/307,097

(22) Filed: Jun. 17, 2014

(65) Prior Publication Data

US 2015/0021732 A1 Jan. 22, 2015

(30) Foreign Application Priority Data

Jul. 19, 2013 (JP) .................................. 2013-150673

(51) Int. Cl.
*H01L 27/06* (2006.01)
(52) U.S. Cl.
CPC ........ *H01L 27/0629* (2013.01); *H01L 27/0676* (2013.01)
(58) Field of Classification Search
USPC ....................................................... 257/476
See application file for complete search history.

(56) References Cited

U.S. PATENT DOCUMENTS

| 4,260,431 A * | 4/1981 | Piotrowski .................... 438/328 |
| 6,175,143 B1 | 1/2001 | Fujihira et al. |
| 6,221,688 B1 | 4/2001 | Fujihira et al. |
| 6,383,836 B2 | 5/2002 | Fujihira et al. |
| 6,975,013 B2 | 12/2005 | Fujihira et al. |
| 7,112,865 B2 | 9/2006 | Fujihira et al. |
| 7,187,154 B2 | 3/2007 | Ta et al. |
| 7,276,771 B2 | 10/2007 | Fujihira et al. |
| 2001/0035560 A1 | 11/2001 | Fujihira et al. |
| 2006/0202264 A1* | 9/2006 | Bhalla et al. .................. 257/330 |
| 2008/0029812 A1* | 2/2008 | Bhalla ........................... 257/330 |
| 2008/0296721 A1* | 12/2008 | Girdhar et al. ................ 257/476 |
| 2012/0212164 A1 | 8/2012 | Terakawa et al. |
| 2012/0217541 A1* | 8/2012 | Hsieh ............................ 257/140 |

FOREIGN PATENT DOCUMENTS

| JP | 62-179142 A | 8/1987 |
| JP | 10-335679 A | 12/1998 |
| JP | 2012-174878 A | 9/2012 |

* cited by examiner

*Primary Examiner* — Thao P Le
(74) *Attorney, Agent, or Firm* — Westerman, Hattori, Daniels & Adrian, LLP

(57) ABSTRACT

A semiconductor device includes: a first well provided in a semiconductor substrate; a second well provided in the semiconductor substrate, so as to be isolated from the first well; a Schottky barrier diode formed in the first well; and a PN junction diode formed in the second well, with an impurity concentration of the PN junction thereof set higher than an impurity concentration of the Schottky junction of the Schottky barrier diode, and being connected antiparallel with the Schottky barrier diode.

11 Claims, 51 Drawing Sheets

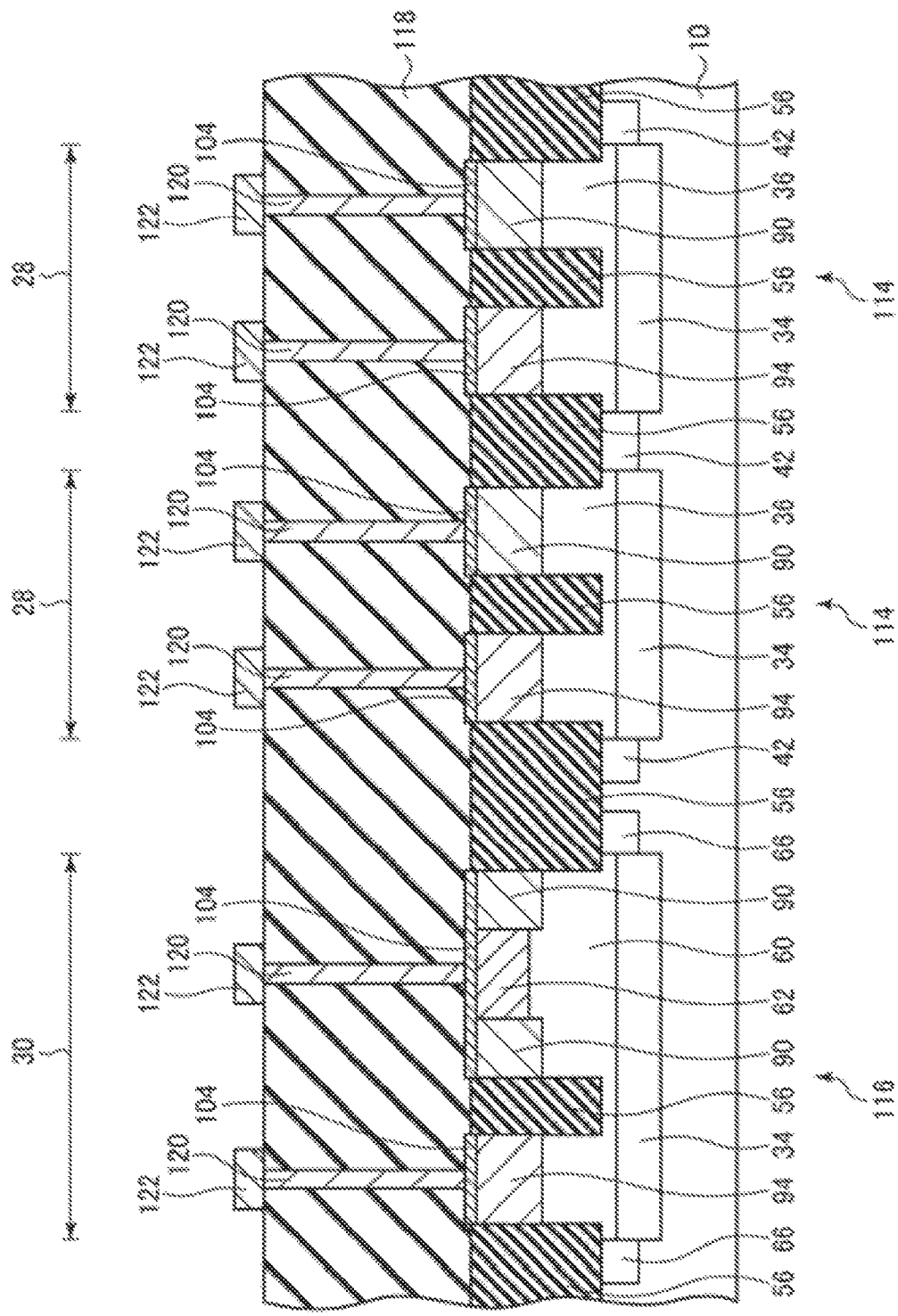

SEMICONDUCTOR DEVICE

CROSS-REFERENCE TO RELATED APPLICATION

This application is based upon and claims the benefit of priority of the prior Japanese Patent Application No. 2013-150673, filed on Jul. 19, 2013, the entire con events of which are incorporated herein by reference.

FIELD

The embodiments discussed herein are directed to a semiconductor device.

BACKGROUND

With advancement in shrinkage and higher integration of semiconductor devices, variation in the threshold voltage of transistors due to statistical fluctuation of channel impurities has become more apparent. The threshold voltage is one of critical parameters which determine performances of the transistors. In order to manufacture the semiconductor devices with high performance and high reliability, it is important to reduce the variation in the threshold voltage due to the statistical fluctuation of impurity.

As one technique of reducing the variation in the threshold voltage due to the statistical fluctuation of impurity, there has been proposed a transistor structure called DDC transistor (Deeply Depleted Channel transistor). The DDC transistor is configured by a high-concentration channel impurity layer having a sharp distribution of impurity concentration, and a non-doped, epitaxially-grown silicon layer forced thereon.

Patent Document 1: Japanese Laid-open Patent Publication No. S62-179142
Patent Document 2: Japanese Laid-open Patent Publication No. H10-335679
Patent Document 3: Japanese Laid-open Patent Publication No. 2012-174878

The transistors having the DDC structure are very effective in terms to suppressing the variation in the threshold voltage due to the statistical fluctuation of impurity, but cannot suppress variation in the threshold voltage typically due to gate length which fluctuates from chip to chip. For low voltage operation of the transistors, it is necessary to suppress both types of variations in the threshold voltage. While the transistors having the DDC structure are effectively corrected in the inter-chip fluctuation by applying a back bias, this makes a voltage to be applied to the veil different frost a source voltage and a reference voltage, so that the latch-up immunity may degrade due to noise induced by inverted voltage.

SUMMARY

According to one aspect of embodiment, there is provided a semiconductor device which includes: a first well provided in a semiconductor substrate; a second well provided in the semiconductor substrate, so as to be isolated from the first well; a Schottky barrier diode termed in the first well; and a first PN junction diode formed in the second well, with an impurity concentration of the PW junction thereof set higher than an impurity concentration of the Schottky junction of the Schottky barrier diode, and being connected antiparallel with the Schottky terrier diode.

According to another aspect of embodiment, there is provided a semiconductor device which includes: a first well provided in a semiconductor substrate; a second well provided in the semiconductor substrate, so as to be isolated from the first well; a Schottky barrier diode provided in the first well; a transistor formed in the second well; a first signal line connected to one terminal of the Schottky barrier diode, through which a source voltage or a reference voltage is applied; and a second signal line connected to the other terminal of the Schottky barrier diode and the second well, through which a voltage different from the source voltage and from the reference voltage is applied.

The object and advantages of the invention will be realized and attained by means of the elements and combinations particularly pointed cut in the claims.

It is to be understood that both the foregoing general description and the following detailed description are exemplary and explanatory and are not restrictive of the invention.

BRIEF DESCRIPTION TO DRAWINGS

FIG. 52 is a schematic cross sectional view illustrating a semiconductor device according to a fourth embodiment.

DESCRIPTION OF EMBODIMENTS

First Embodiment

A semiconductor device and a method of manufacturing the same according to a first embodiment will be explained referring to FIGS. 1 to 34.

Figure 1:
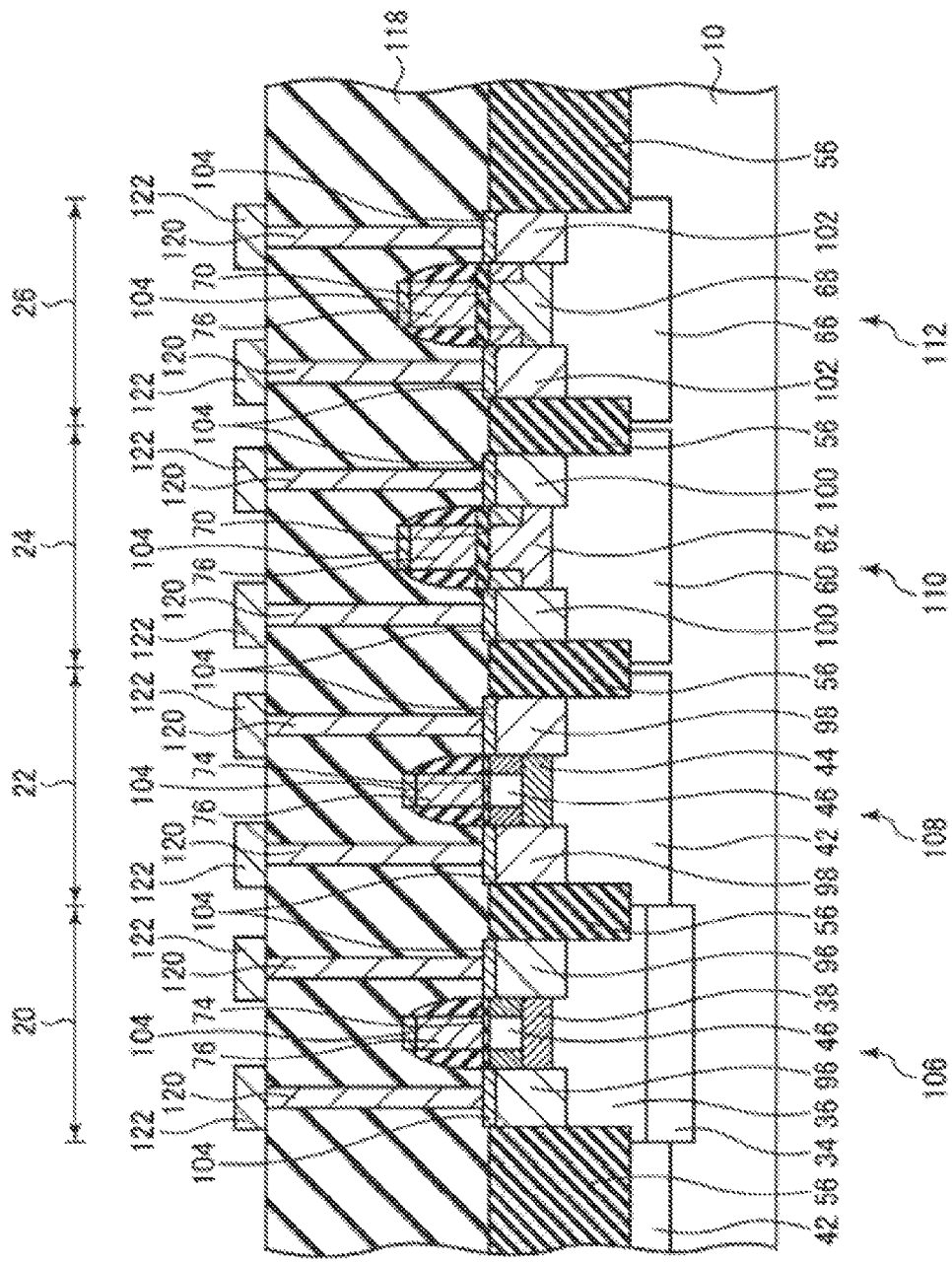
FIG. 1 and FIG. 2 are schematic cross sectional views (part 1 and part 2) illustrating configurations or a semiconductor device according to a first embodiment.
Figure 2:
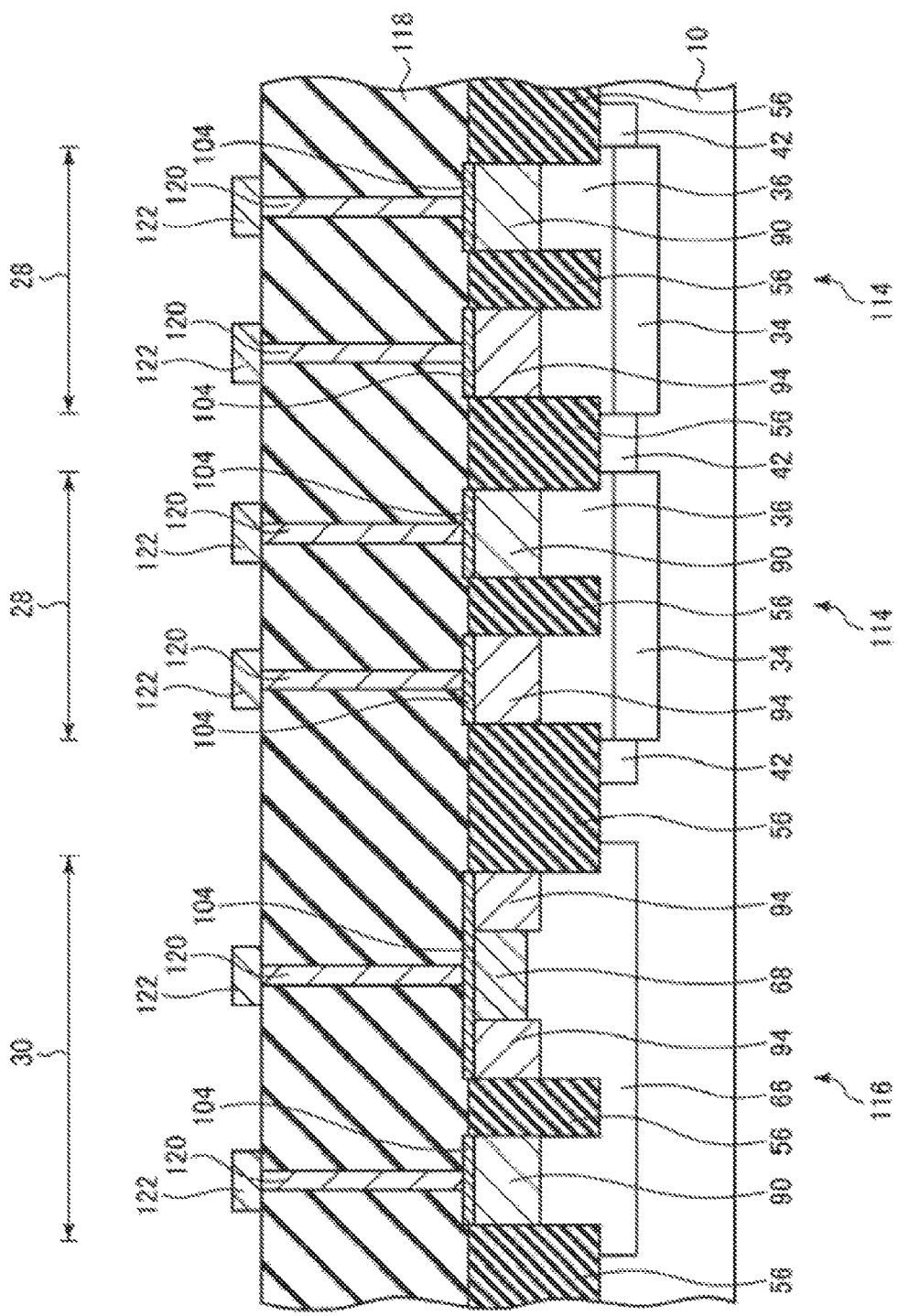
Figure 3:
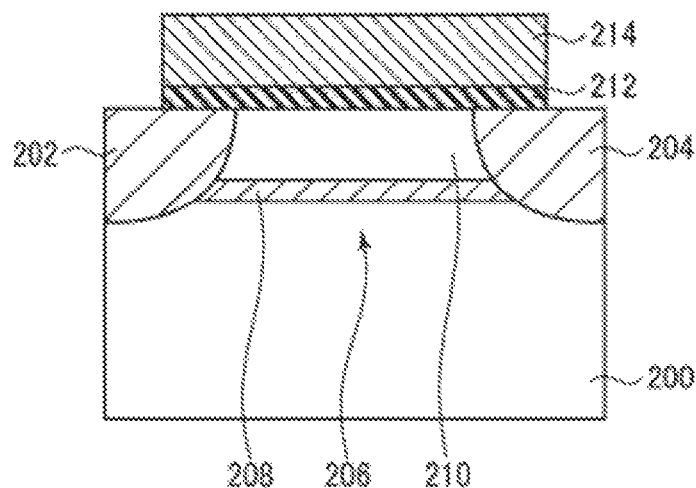
FIG. 3 is a schematic cross sectional view illustrating a configuration of a DDC transistor.
Figure 8:
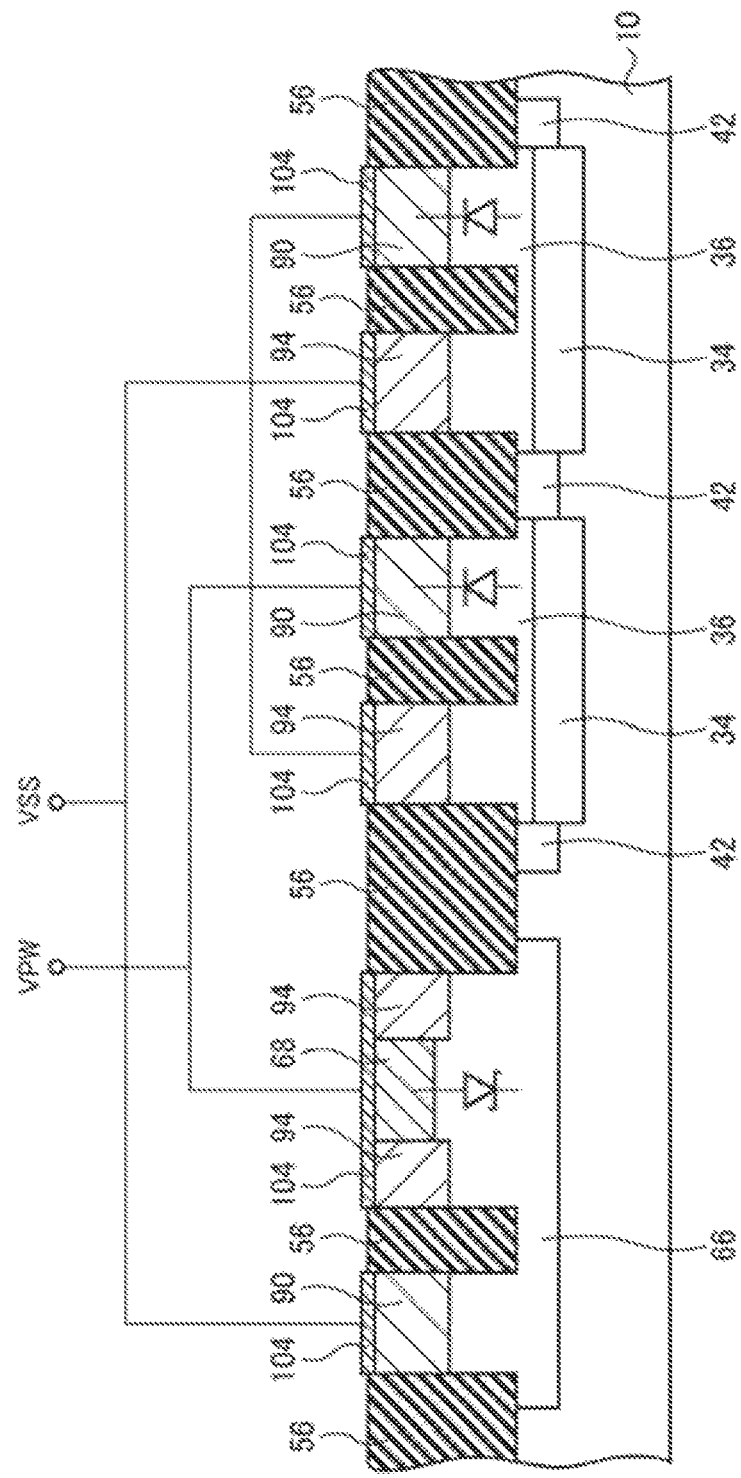
FIG. 8 is a schematic cross sectional view illustrating a protection circuit of the semiconductor device according to the first embodiment.
Figure 9:
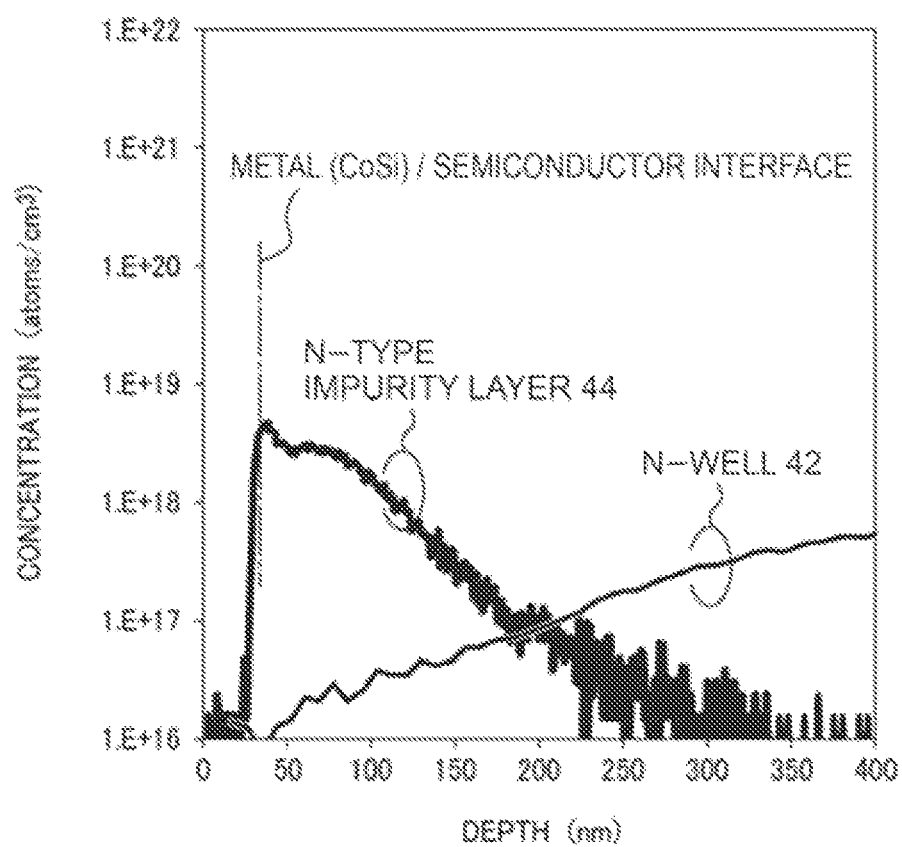
FIG. 9 is a graph illustrating an impurity concentration distribution produced when a Schottky barrier diode was formed in a well of a low-voltage transistor.
Figure 10:
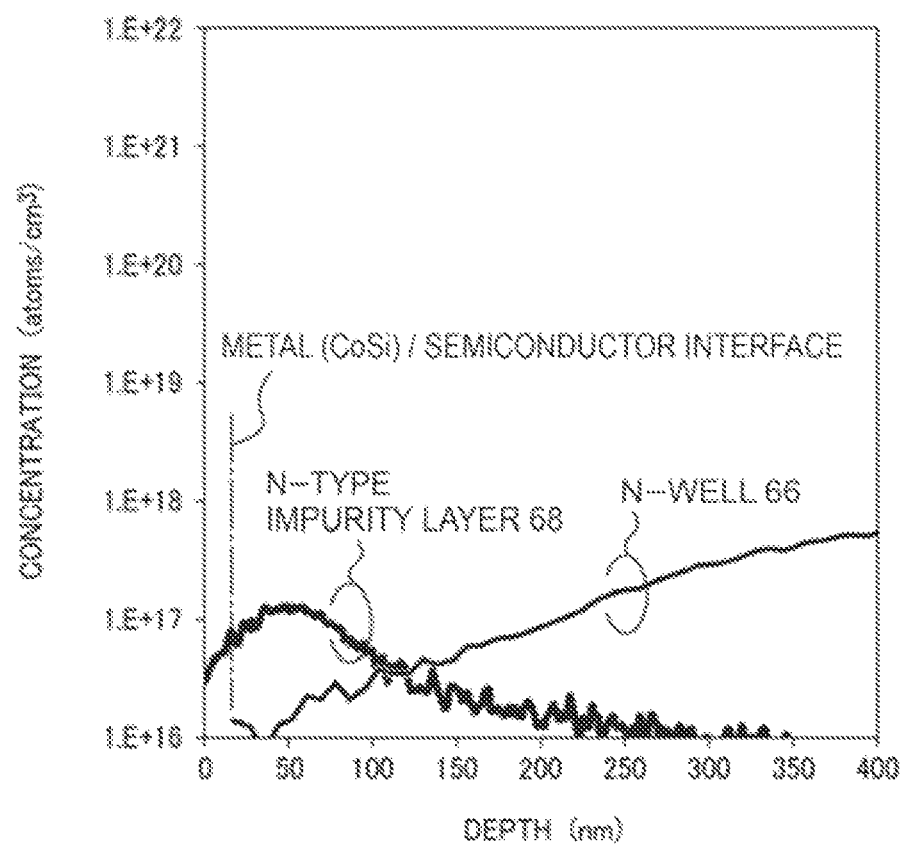
FIG. 10 is a graph illustrating an impurity concentration distribution produced when the Schottky barrier diode was formed in a well of a high-voltage transistor.
Figure 11:
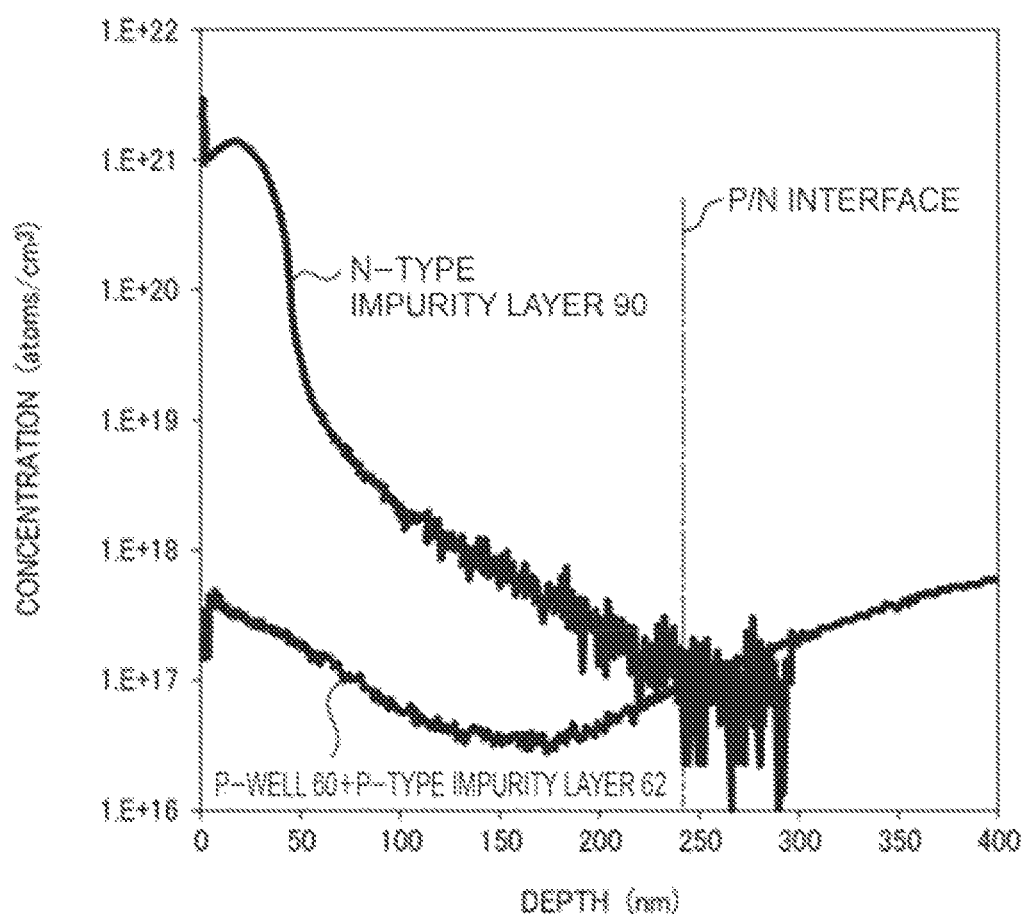
FIG. 11 is a graph illustrating an impurity concentration distribution produced when a PN junction diode was formed in the well of the high-voltage transistor.
Figure 12:
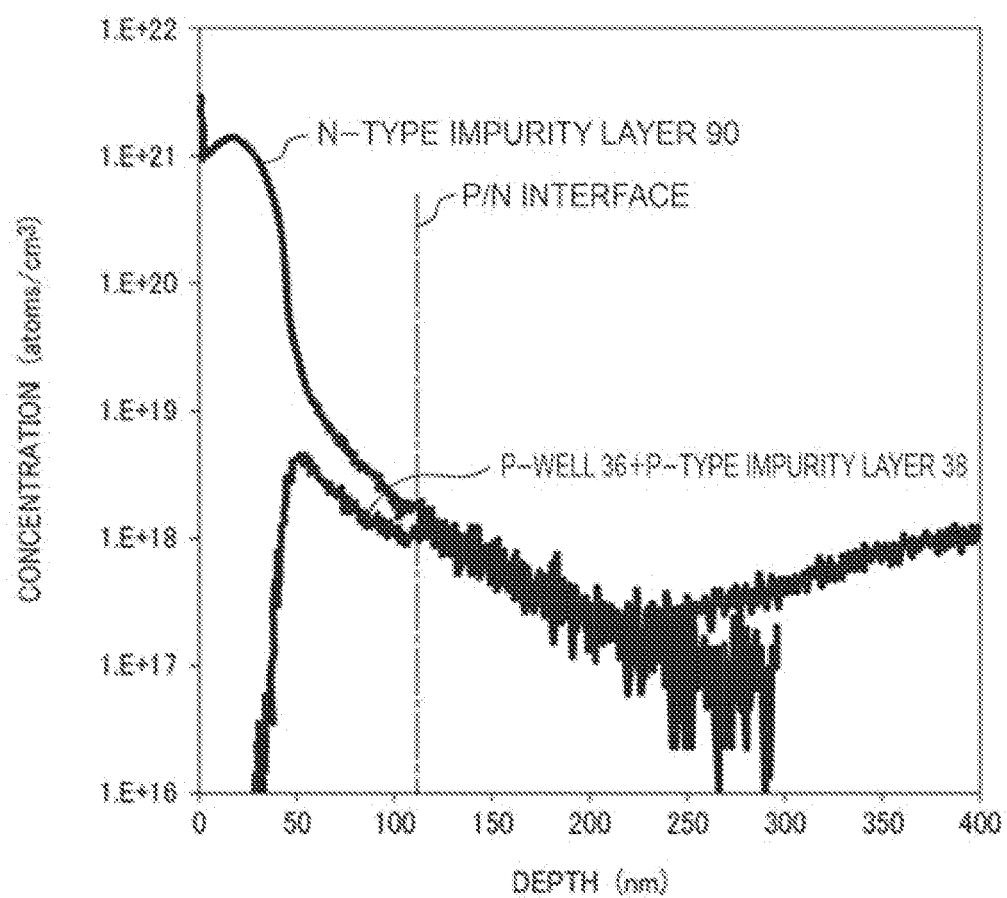
FIG. 12 is a graph illustrating an impurity concentration distribution produced when the PN junction diode was formed in the well of the low-voltage transistor.
Figure 13:
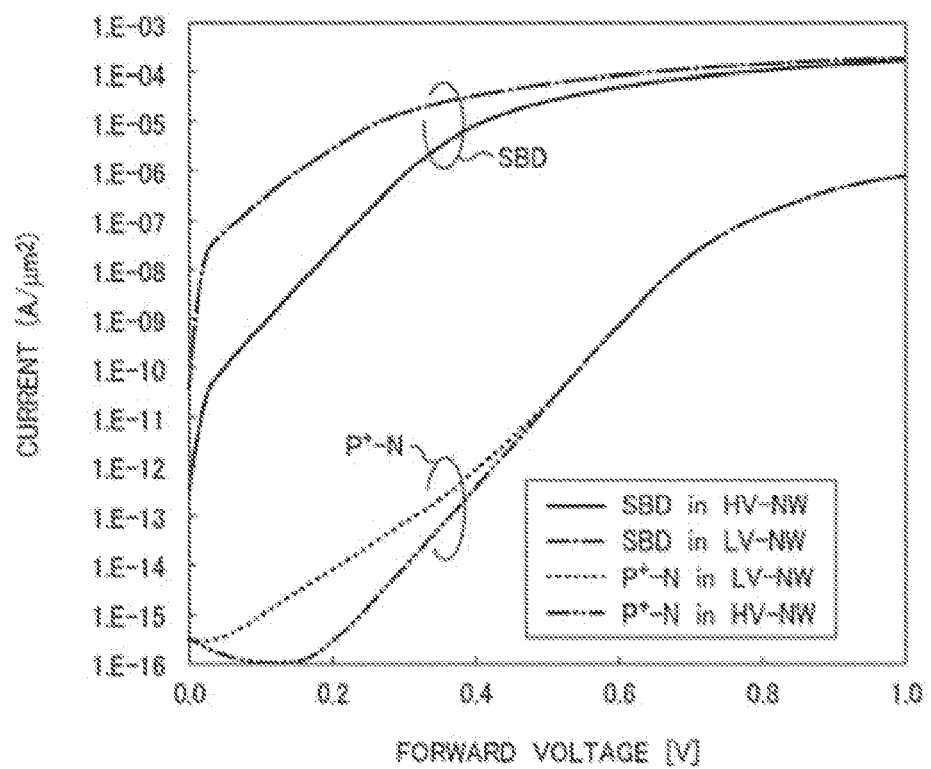
FIG. 13 is a graph (part 1) illustrating forward I-V characteristics of the PN junction diode and the Schottky barrier diode.
Figure 14:
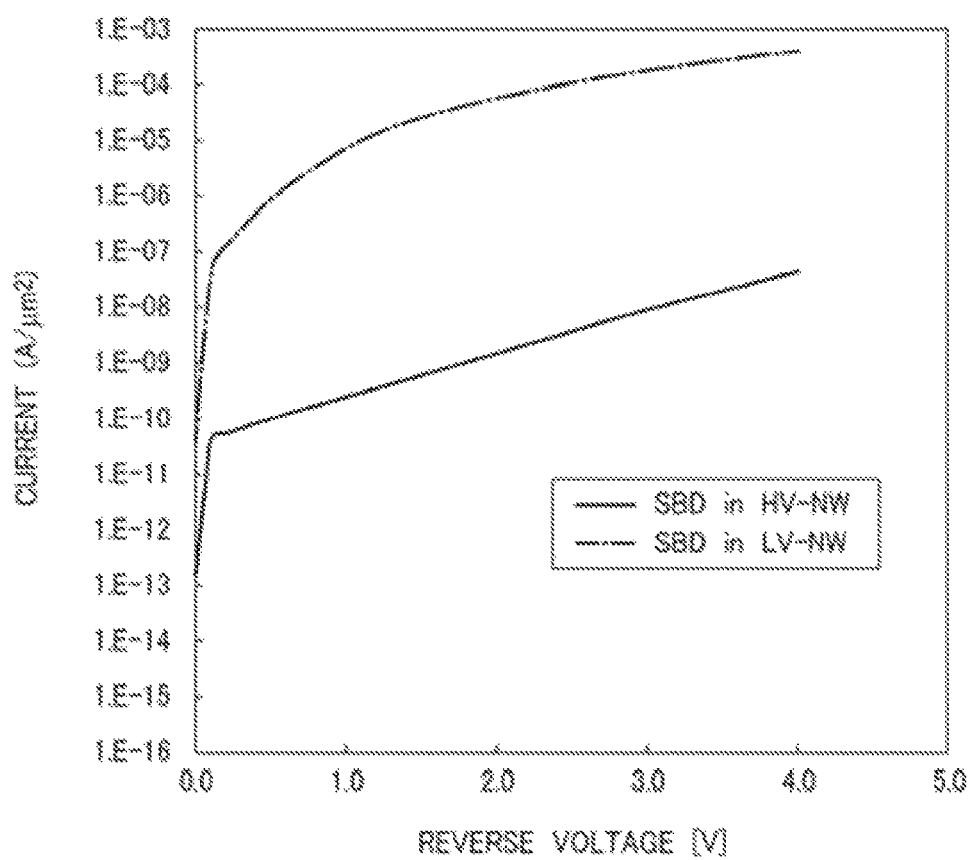
FIG. 14 is a graph (part 1) illustrating reverse I-V characteristics of the Schottky barrier diode.
Figure 15:
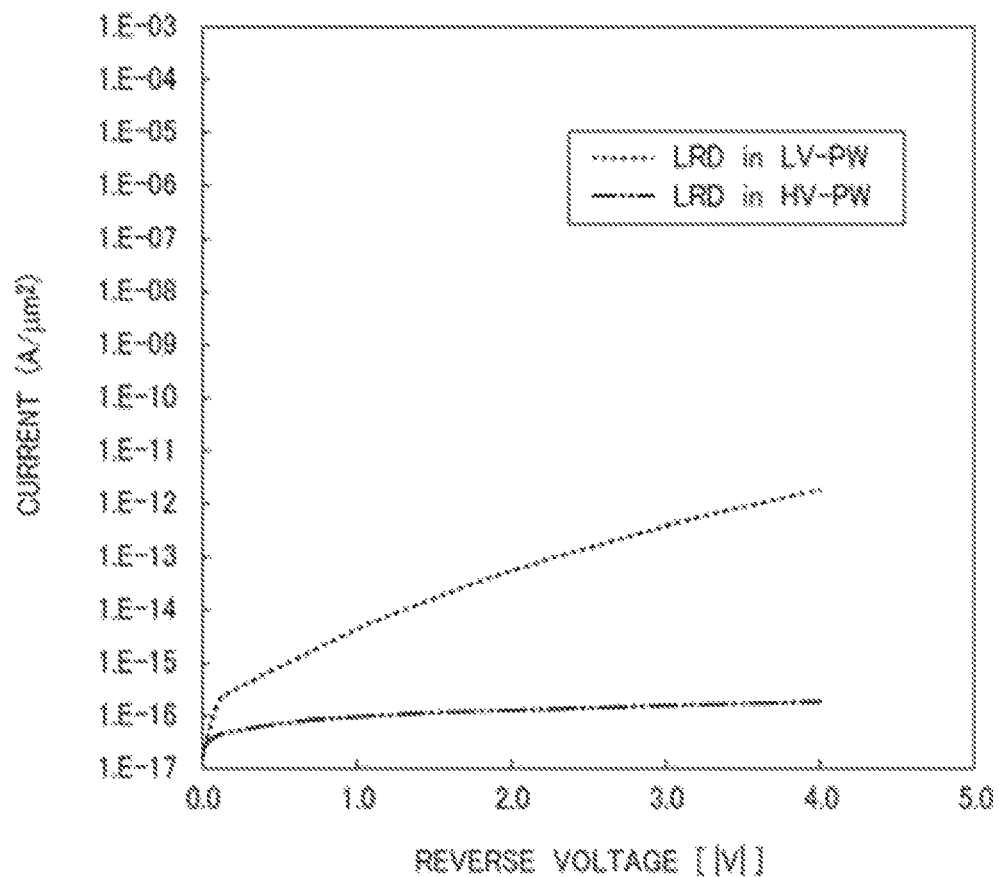
FIG. 15 is a graph (part 1) illustrating reverse I-V characteristics of the PN junction diode.

FIG. 1 and FIG. 2 are schematic cross sectional views illustrating a configuration of a semiconductor device of this embodiment. FIG. 3 is a schematic cross sectional view illustrating a configuration of a DDC transistor. FIG. 4 to FIG. 7 are circuit diagrams illustrating protection circuits to the semiconductor device according to this embodiment. FIG. 8 is a schematic cross sectional view illustrating a protection circuit of the semiconductor device according to trots embodiment. FIG. 9 is a graph illustrating an impurity concentration distribution produced when a Schottky barrier diode (SBD) was formed in a well of a low-voltage transistor. FIG. 10 is an impurity concentration distribution produced when the Schottky barrier diode (SBD) was termed in the well of the high-voltage transistor. FIG. 11 is a graph illustrating an impurity concentration distribution produced when the PN junction diode (LRD) was formed in the well of the high-voltage transistor. FIG. 12 is a graph illustrating an impurity concentration distribution produced when a PN junction diode (LRD) was formed in the well or the low-voltage transistor. FIG. 13 to FIG. 15 are graphs illustrating I-V characteristics of the PN junction diode (LED) and Schottky barrier diode (SBD). FIG. 16 to FIG. 35 are cross sectional process diagrams illustrating a method of manufacturing the semiconductor device according to this embodiment.

First, a configuration of the semiconductor device according to this embodiment will be explained referring to FIG. 1 to FIG. 12.

As illustrated in FIG. 1, a P-type silicon substrate 10 is provided with a DDC-NMOS transistor region 20, a DDC-PMOS transistor region 22, a high-voltage NMOS transistor region 24, and a high-voltage PMOS transistor region 26. Also, as illustrated in FIG. 2, to the silicon substrate 10, LRD regions 28 and a SBD region 30 are provided. Each region has an active region as demarcated by an element isolation insulating film 56 buried in the silicon substrate 10, and a predetermined element is formed in each active region.

In the silicon substrate 10 in the DDC-NMOS transistor, region 20, formed are a P-well 36, and a buried N-well 34 provided below the bottom of the P-well 36. Around the periphery of the P-well 36, an N-well 42 is formed. The P-well 36 is thus configured as a double well surrounded by the buried N-well 34 and the N-well 42. In the surficial portion of the P-well 36, a P-type impurity layer 38 is formed as a channel impurity layer. While the P-well 36 and the P-type impurity layer 38 are given different reference numerals in this specification, the P-type impurity layer 38 is understood as a part of the P-well 36, so that the P-well 36 and the P-type impurity layer 38 will occasionally be referred to as the P-well 36 en bloc.

Over the P-type impurity layer 36, an epitaxially-grown silicon layer 46 is formed. Over the epitaxially-grown silicon layer 46, a gate insulating film 74 is formed. Over the gate insulating film 74, a gate electrode 76 is formed. In the epitaxially-grown silicon layer 46 and the silicon substrate 10, on both sides of the gate electrode 76, N-type source/drain regions 96 are formed. Over the gate electrode 76 and over the N-type source/drain regions 36, a metal silicide film 104 is formed.

With these constituents, a DOC-NMOS transistor 106 is formed in the DDC-NMOS transistor region 20.

In the silicon substrate 10 in the DDC-PMOS transistor region 22, the N-well 42 is formed. In the surficial portion of the N-well 42, an N-type impurity layer 44 is formed as a channel imparity layer. While the N-well 42 and the N-type impurity layer 44 are given different reference minerals in this specification, the N-type impurity layer 44 is understood as a part of the N-well 42, so that the N-well 42 and the P-type impurity layer 44 may occasionally be referred to as the N-well 42 en bloc.

Over, the N-type impurity layer 44, the epitaxially-grown silicon layer 46 is formed. Over the epitaxially-grown silicon layer 46, the gate insulating film 74 is formed. Over the gate insulating film 74, the gate electrode 76 is formed. In the epitaxially-grown silicon layer 46 and the silicon substrate 10, on both sides of the gate insulating film 74, P-type source/drain regions 98 are formed. Over the gate electrode 76 and the P-type source/drain regions 98, the metal silicide film 104 is formed.

With these constituents, a DDC-PMOS transistor 108 is formed in the DDC-PMOS transistor region 22.

As illustrated in FIG. 3, each of the DDC-NMOS transistor 106 and the DDC-PMOS transistor 108 has, in their channel regions 206, a threshold voltage controlling layer 208 which contains a high-concentration impurity layer, and a non-doped, epitaxially-grown layer 210 formed on the threshold voltage controlling layer 208. The threshold voltage controlling layer 208 corresponds to the P-type impurity layer 38 of the DDC-NMOS transistor 106, and also to the N-type impurity layer 44 of the DDC-PMOS transistor 108. The epitaxially-grown layer 210 corresponds to the epitaxially-grown silicon layer 46 of the DDC-NMOS transistor 106 and the DDC-PMOS transistor 108. The thus-configured transistor, called DDC transistor (Deeply Depleted Channel transistor), is very effective in suppressing variation in the threshold voltage due to statistical fluctuation of impurity, and is typically useful for high-speed transistors operated at low voltage (0.9V, for example) directed to logic circuits or the like.

The reason why the DDC-NMOS transistor 106 is formed in the double well is that the DDC-NMOS transistor 106 may also be back-biased by a voltage different from the source voltage and from the reference voltage.

In the silicon substrate 10 in the high-voltage NMOS transistor region 24, a P-well 60 is formed. In the surficial portion of the P-well 60, a P-type impurity layer 62 is formed. Note that the epitaxially-grown silicon layer 46 is formed also on the silicon substrate 10 in the high-voltage PMOS transistor region 24. Unlike the P-type impurity layer 38 and the N-type impurity layer 44, the P-type impurity layer 62 is formed in the surficial portion of a substrate configured by stacking the epitaxially-grown silicon layer 46 on the silicon substrate 10. While the P-well 60 and the P-type impurity layer 62 are given different reference numerals in this specification, the P-type impurity layer 62 is understood as a part of the P-well 60, so that the P-well 60 and the P-type impurity layer 62 will occasionally be referred to as the P-well 60 en bloc.

Over the epitaxially-grown silicon layer 46 having the P-type impurity layer 62 formed therein, a gate insulating film 70 is formed. Over the gate insulating film 70, a gate electrode 76 is formed. In the epitaxially-grown silicon layer 46 and the silicon substrate 10, on both sides of the gate electrode 76, N-type source/drain regions 100 are formed. Over the gate electrode 76 and the N-type source/drain regions 100, the metal silicide film 104 is formed.

With these constituents, a high-voltage NMOS transistor 110 is formed in the high-voltage NMOS transistor region 24.

In the silicon substrate 10 in the high-voltage PMOS transistor region 26, an N-well 66 is formed. In the surficial portion of the N-well 66, an N-type impurity layer 68 is formed. Note that, the epitaxially-grown silicon layer 46 is formed also on the silicon substrate 10 in the high-voltage PMOS transistor region 26. Like the P-type impurity layer 62, the N-type impurity layer 68 is formed in the surficial portion of a substrate configured by stacking the epitaxially-grown silicon layer 46 on the silicon substrate 10. While the N-well 66 and the N-type impurity layer 68 are given different reference numerals in this specification, the N-type impurity layer 68 is understood as a part of the N-well 66, so that the N-well 66 and the N-type impurity layer 68 will occasionally be referred to as the N-well 66 en bloc.

Over the epitaxially-grown silicon layer 46 having the N-type impurity layer 68 formed therein, a gate insulating film 70 is formed. Over the gate insulating film 70, a gate electrode 76 is formed. In the epitaxially-grown silicon layer 46 and the silicon substrate 10, on both sides of the gate electrode 76, P-type source/drain regions 102 are formed. Over the gate insulating films 76 and the N-type source/drain regions 102, the metal silicide film 104 is formed.

With these constituents, a high-voltage PMOS transistor 112 is formed in the high-voltage NMOS transistor region 26.

The high-voltage NMOS transistor 110 and the high-voltage PMOS transistor 112 are used for a circuit portion where a voltage of 3.3 V I/O, for example, which is higher than the operating voltage of the DDC transistor, is applied. For this purpose, the gate insulating film 70 of the high-voltage transistor is made thicker than the gate insulating film 74 of the DDC transistor.

In the silicon substrate 10 in the LRD region 28, formed are the P-well 36, and the buried N-well 34 provided below the bottom of the P-well 36. Around the periphery of the P-well 36, the N-well 42 is formed. The P-well 36 is thus configured as a double well surrounded by the buried N-well 34 and the N-well 42. The P-well 36 is formed at the same time with the P-well 36 of the DDC-NMOS transistor region 20.

In the P-well 36 in the LRD region 28, an active region (left in the drawing) which serves as an electrode lead-cut portion from an anode region, and an active region (right in the drawing) which serves as an electrode lead-out portion from a cathode region, are demarcated by the element isolation insulating film 56. In the active region which serves as the electrode lead-out portion from the anode region, a P-type impurity layer 94 is formed as a layer for assisting contact to the P-well 36. In the active region which serves as the electrode lead-out portion from the cathode region, an N-type impurity layer 90 is formed as the cathode region.

Note that the P-type impurity layer 94 is formed at the same time with high-concentration portions of the P-type source/drain regions 98 of the DDC-PMOS transistor 108, and the P-type source/drain regions 102 of the high-voltage PMOS transistor 112. Meanwhile, the N-type imparity layer 90 is formed at the same time with high-concentration portions of the N-type source/drain regions 96 of the DDC-NMOS transistor 106, and the N-type source/drain regions 100 of the high-voltage NMOS transistor 110.

Over the N-type impurity layer 90 and the P-type impurity layer 94, the metal silicide film 104 is formed.

As a consequence, in the LRD region 28, a low resistance diode (LRD) 114 configured by a PN junction formed between the P-well 36 and the N-type impurity layer 90 is formed.

In the silicon substrate 10 in the SBD region 30, an N-well 66 is formed. The N-well 66 is formed at the same time with the N-well 66 of the high-voltage PMOS transistor 26. Accordingly, like the N-well 66 in the high-voltage PMOS transistor 26, the N-well 66 has in the surficial portion thereof the N-type imparity layer 68.

In the N-well 66 in the SBD region 30, an active region (right in the drawing) which serves as an electrode lead-out portion from tune anode region, and an active region (left in the drawing) which serves as an electrode lead-out portion from the cathode region, are formed as demarcated by the element isolation insulating film 56. In the surface peripheral portion of the active region which serves as the electrode lead-out portion from the anode region, the P-type impurity layer 94 is formed as a guard ring. In the surficial portion of the active region which serves as the electrode lead-out portion from the cathode region, the N-type impurity layer 90 is termed as a layer for assisting contact to the N-well 66.

The P-type impurity layer 94 is formed at the same time with high-concentration portions of the P-type source/drain regions 98 of the DDC-PMOS transistor 108, and the P-type source/drain regions 102 of the high-voltage PMOS transistor 112. The N-type impurity layer 90 is formed at the same time with the N-type source/drain regions 96 of the DDC-NMOS transistor 106, and the N-type source/drain regions 100 of the high-voltage NMOS transistor 110.

Over the N-type impurity layer 90 and the N-type impurity layer 68, a metal silicide film 104 is formed.

As a consequence, in the SBD region 30, a Schottky barrier diode (SBD) 116 configured by a Schottky junction formed between the N-type impurity layer 68 and the metal silicide film 104 is formed.

Over the silicon substrate 10 having the transistors and the diodes formed therein, an interlayer insulating film 118 is formed. In the interlayer insulating-film 118, buried are contact plugs 120 connected to the individual terminals of the transistors and the diodes. To each contact plug 120, an interconnect 122 is connected.

As described above, the semiconductor device of this embodiment has the low-voltage transistors with the DDC structure, the high-voltage transistors, the PN junction diode (LRD 114), and the Schottky barrier diode (SBD 116), all of which being mounted on the single silicon substrate 10.

Figure 4:
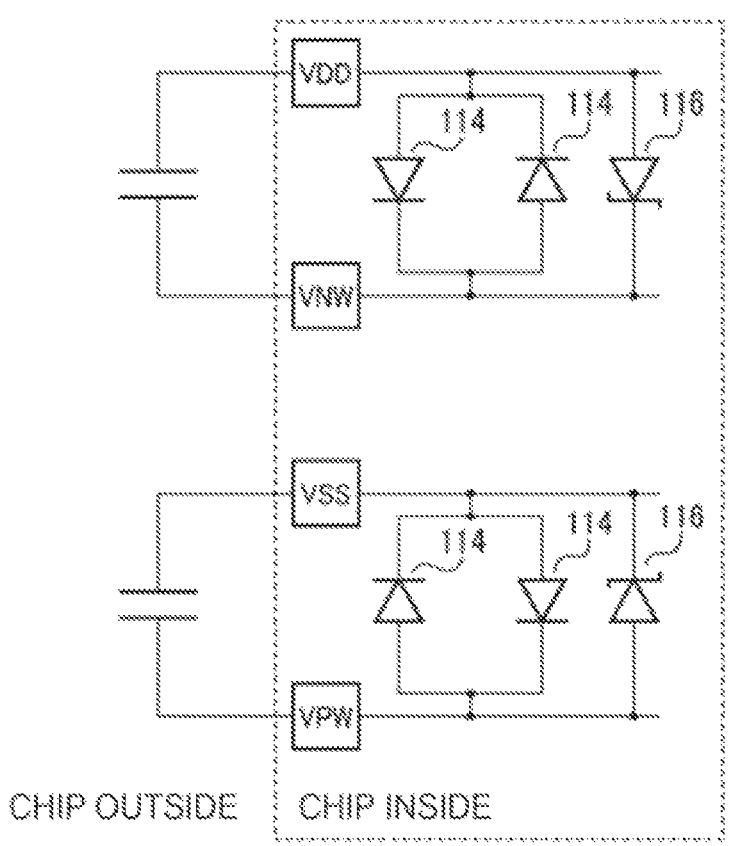
FIG. 4 to FIG. 7 are circuit diagrams (part 1 to part 4) illustrating protection circuits of the semiconductor device according to the first embodiment.

The LRD 114 and the SBD 116 are circuit elements winch form a protection circuit of the semiconductor device. Typically as illustrated in FIG. 4, they are connected in a reversely parallel manner (anti-parallel) between a VDD line and a VNW line, and between a VSS line and a VPW line. The VDD line herein means a source voltage line. The VSS line is a reference voltage line. VNW line is a voltage line connected to the N-well 42 of the DDC-PMOS transistor 108, directed to apply a back-bias voltage, different from the source voltage and reference voltage, to the DDC-PMOS transistor 108. The VPW line is a voltage line connected to the P-well 36 of the DDC-NMOS transistor 106, directed to apply a back-bias voltage, different from the source voltage and the reference voltage, to the DDC-NMOS transistor 106.

The SBD 116 is a diode directed to prevent latch-up. The transistors with the DDC structure are very effective in terms of suppressing variation in the threshold voltage due to statistical fluctuation of impurity, but cannot suppress variation in the threshold voltage which varies from chip to chip. While the transistors having the DDC structure are effectively suppressed in terms of the inter-chip fluctuation in the threshold voltage by applying the back bias, this needs a voltage to be applied to the well different from the source voltage and the reference voltage, so that the latch-up immunity may degrade due to noise caused by inverted voltage. Now by providing the SBD 116 between the VDD line and the VNW line, and between the VSS line and the VPW line, the latch-up immunity may be improved, and concurrently the power consumption of the transistors having the DDC structure may be reduced.

The LED 114 is a surge protection diode, and is configured as a bidirectional diode by two LRDs 114 connected anti-parallel.

Figure 5:
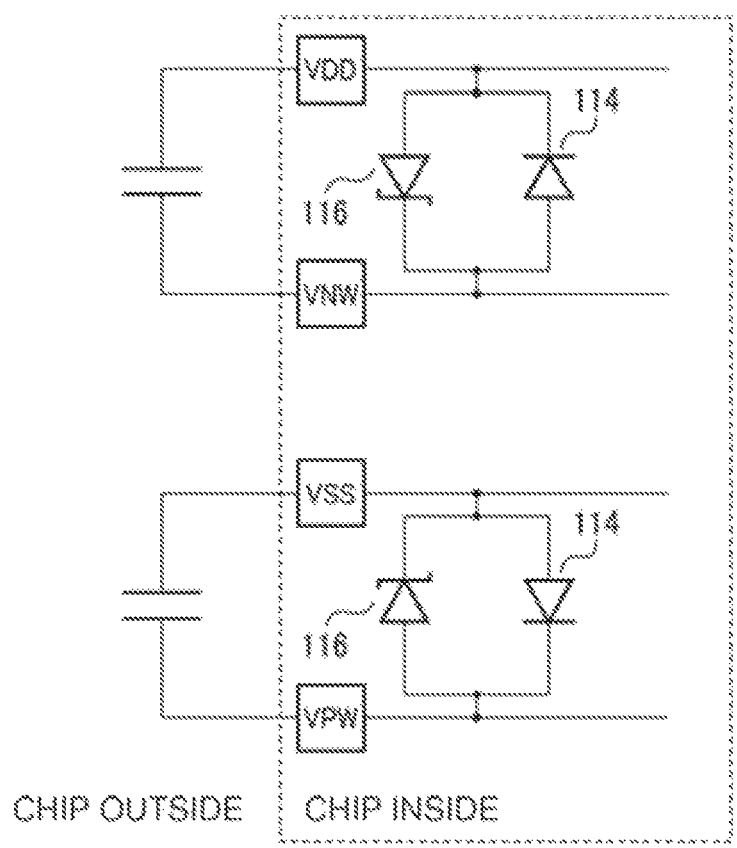
Figure 6:
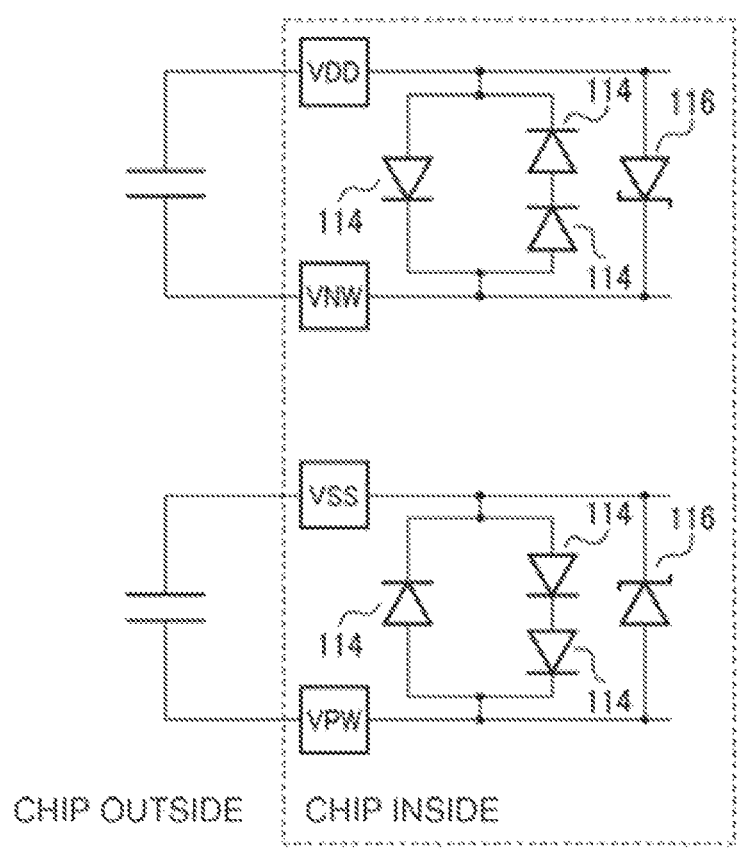
Figure 7:
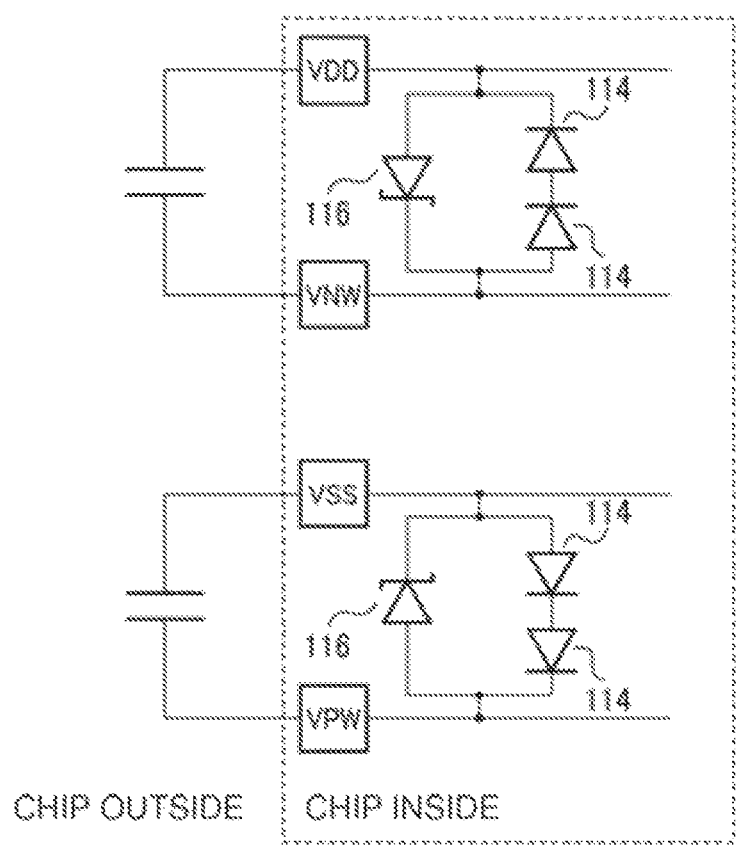

FIG. 5 to FIG. 7 illustrate other examples of the protection circuit configured by the LRD 114 and the SBD 116. The protection circuit illustrated in FIG. 5 is configured to allow the SBD 116 to also act as the LRD 114 which has been connected in the protection circuit of FIG. 4 in the same direction with the SBD 116. The SBD 116 functions as a diode for preventing latch-up, and an anti-parallel set of the LRD 114 and the SBD 116 functions as a bidirectional diode for surge protection.

A protection circuit illustrated in FIG. 6 is configured by modifying the LED 114, which has been connected in the protection circuit of FIG. 4 antiparallel to the SBD 116, to have a double-stage configuration. A protection circuit illustrated in FIG. 7 is configured by modifying the LRD 114, which has been connected in the protection circuit illustrated in FIG. 7 is configured by modifying double-stage configuration. Depending on voltage applied to the VNW line or the VPW line, only with a single-stage LRD 114, a stationary current may flow from VNW to VDD, or from VSS to VPW. Given, for example, that VPW is –0.6 V, a voltage exceeding the threshold, voltage of the LRD 114 is applied between VSS and VPW, then a stationary current flows from VSS to VPW. With the double-stage LRD 114, such stationary current is suppressed from flowing.

In either case, the individual diodes are arranged in independent wells electrically isolated from each other. For example, given the silicon substrate 10 is P-type, the individual diodes are arranged in N-wells, or in P-well located in N-well.

Note that the SBD 116 is not always necessarily provided to both points between the VOID line and the VNW line, and between the VSS line and the VPW line. The SBD 116 may be used only either one of them, for example, for the protection circuit between the VSS line and the VPW line.

The protection circuit illustrated in FIG. 7 may be materialized by connecting the individual diodes as illustrated in FIG. 8.

In some cases, a Schottky barrier diode for latch-up protection is manufactured as a discrete product, and additionally mounted on a circuit board on which a semiconductor chip is mounted. This, however, increases the number of components, and pushes up the cost. Even in some cases, latch-up still occurs despite that the Schottky barrier diode is mounted on the circuit board. The present inventors found out from our thorough investigation that this was caused by contact failure of the semiconductor chip. Operation of the semiconductor chip is checked in a state that the semiconductor chip is inserted into a socket formed on the circuit board, wherein any contact failure between the socket and the semiconductor chip may be causative of latch-up, even if the Schottky barrier diode is mounted.

The above-described problem anticipated when the Schottky barrier diode is provided as an external part is now solved by incorporating the Schottky barrier diode into the semiconductor chip, just like the semiconductor device of this embodiment.

In the semiconductor device of this embodiment, as described previously, the SBD 116 is formed in the N-well 66 of the high-voltage PMOS transistor 26. The reason why will be explained below.

From the viewpoint of reducing leakage current, the SBD 116 is preferably formed by a Schottky junction between a semiconductor with a relatively low impurity concentration, and a metal (metal silicide). One possible configuration is to use a junction between an impurity layer which composes the well, and a metal. The semiconductor device of this embodiment has a well (N-well 42) of the low-voltage (DDC) transistor, and a well (N-well 66) of the high-voltage transistor, so that the SBD 116 is possibly formed between either well and a metal.

FIG. 9 is a graph illustrating a depth profile of an N-type impurity composing the N-well 42, measured by SIMS (Secondary Ion Mass Spectrometry).

When the SBD 116 is formed in the N-well 42, as seen in FIG. 9, a high concentration N-type impurity layer 44 is formed right under the metal-semiconductor interface. Accordingly, a depletion layer is less likely to extend towards the semiconductor layer, so that the electric field is intensified at the Schottky junction, to thereby increase leakage current under applied reverse voltage.

FIG. 10 is a graph illustrating a depth profile of an N-type imparity composing the N-well 66, measured by SIMS.

When the SBD 116 is formed is the N-well 66, as seen in FIG. 10, a metal-semiconductor interface (Schottky junction) is formed in a region having a relatively low impurity concentration of $1\times10^{17}$ cm$^{-2}$ or around. Accordingly, the depletion layer is more likely to extend towards the semiconductor layer, and this weakens the electric field strength at the Schottky junction, and contributes to suppress the leakage current which could occur under applied reverse voltage.

From the above, the SBD 116 is more preferably formed in the well (N-well 66) for the high-voltage transistor, rather than in the well (N-well 42) for the low-voltage transistor.

On the other hand, in the semiconductor device of this embodiment, the LRD 114 is formed in the P-well 36 for the low-voltage PMOS transistor. The reason why will be explained below.

From the functional reason expected as a surge protection element, the LRD 114 preferably has a low voltage at which forward current rises up, and is preferably formed, from this point of view, by a PN junction formed between semiconductors having relatively nigh concentration values. One possible case is to use a PN junction between the impurity layer composing the well, and the high-concentration impurity layer composing the source/drain regions. The semiconductor device of this embodiment has the well (P-well 36) of the low-voltage (DDC) transistor, and the well (P-well 60) of the high-voltage transistor, so that the LRD 114 is possibly formed by a junction between either well and the source/drain regions (N-type impurity layer 90).

FIG. 11 is a graph illustrating a depth profile of a P-type impurity composing the P-well 60, and the N-type impurity layer 90, measured by SIMS.

When the LRD 114 is formed in the P-well 60, as seen in FIG. 11, a PN junction is formed in a region having a relatively low impurity concentration of $1\times10^{17}$ cm$^{-2}$ or around. Accordingly, the voltage at which the reverse current rises up is elevated, so that the LRD 114 is not suitable to function as the surge protection element.

FIG. 12 is a graph illustrating a depth profile of a P-type impurity composing the P-well 36 and the N-type impurity layer 90, measured by SIMS.

When the LRD 114 is formed in the P-well 36, as seen in FIG. 12, a PN junction is formed in a region having a relatively high impurity concentration exceeding $1 \times 10^{18}$ cm$^{-2}$. Accordingly, the voltage at which the reverse current rises up may be lowered.

From the above, the LRD 114 is more preferably formed in the well (P-well 36) of the low-voltage transistor, rather than in the well (P-well 60) of the high-voltage transistor.

FIG. 13 comparatively illustrates the forward characteristics of the SBDs 116, and the forward characteristics of the P$^+$-N junction diodes, all formed in either of the N-wells 42, 66. In the drawing, the solid line represents the SBD (SBD in HV-NW) formed in the N-well 66 of the high-voltage transistor. The chain single-dashed line represents the SBD (SBD in LV-NW) formed in the N-well 42 of the low-voltage transistor. The dotted line represents the P$^+$-N junction diode (P$^+$-N in LV-NW) formed in the N-well 42 of the low-voltage transistor. The chain double-dashed line represents the P$^+$-N junction diode (P$^+$-N in HV-NW) formed in the N-well 66 of the high-voltage transistor. Current and voltage values are given in absolute values.

As may be understood from the forward characteristics illustrated in FIG. 13, the SBD turns ON with a lower voltage than the P$^+$-N junction diode does, irrespective of in which N-well the SBD was formed, so that the SBD can release electric charge induced by noise or the like, before the forward current induced by noise or the life flows through the P$^+$-N junction, diode to cause latch-up, and thereby the latch-up is avoidable.

FIG. 14 comparatively illustrates the reverse characteristics of the SBD 116. In the drawing, the solid line represents the SBD (SBD in HV-NW) formed in the N-well of the high-voltage transistor. The chain single-dashed line represents the SBD (SBD in LV-NW) formed in the N-well of the low-voltage transistor. Current and voltage values are given in absolute values.

As may be understood from FIG. 14, the reverse leakage current is much larger in SBD 116 formed in the N-well 42 of the low-voltage transistor, than in the SBD 116 formed in the N-well 66 of the high-voltage transistor.

It was verified from these results that, by forming the SBD 116 in the N-well 66, obtained were electrical characteristics suitable for the Schottky barrier diode for preventing latch-up, exemplified by that it can turn ON with a low forward voltage and causes only a small reverse current.

FIG. 15 comparatively illustrates the reverse characteristics of the LRD 114. In the drawing, the dotted line represents the LRD (LRD in LV-PW) formed in the P-well of the low-voltage transistor. The chain double-dashed line represents the LRD (LRD in HV-PW) formed in the P-well of the high-voltage transistor. Current and voltage values are given in absolute values.

As may be understood from FIG. 15, the LRD 114 when formed in the P-well 68 shows only a very small voltage dependence of the reverse current, so that current does not flow therethrough even applied with a very high voltage, indicating that the LRD 114 cannot discharge a high surge voltage applied, thereto. On the other hand, the LRD 114 when formed in the P-well 36 shows a large voltage dependence of the reverse current, and a low breakdown voltage, indicating that, the LRD 114 can rapidly discharge a high surge voltage even if applied thereto.

It was verified from these results that, by forming the LRD 114 in the P-well 36, electrical characteristics suitable for the PN junction diode used as a surge protection element, exemplified by a low voltage at which forward current rises up, were obtained.

Next, a method of manufacturing the semiconductor device according to this embodiment will be explained referring to FIG. 16 to FIG. 35. Note that, in FIG. 16 to FIG. 35, the LRD 114 is represented only by the PN junction portion (the right active region in FIG. 2) out from the LRD region 28. The SBD 116 is represented only by a Schottky junction portion (the right active region in FIG. 2) out from the SBD region 30.

First, over the F-type silicon substrate 10, a photoresist film 12 is formed by photolithography. The photoresist film 12 has an opening 14 formed in a region where a trench 16, later serves as a mask alignment mark, will be formed. The opening 14 is formed outside the product-forming region of the silicon substrate 10, typically in the scribe region.

Figure 16:
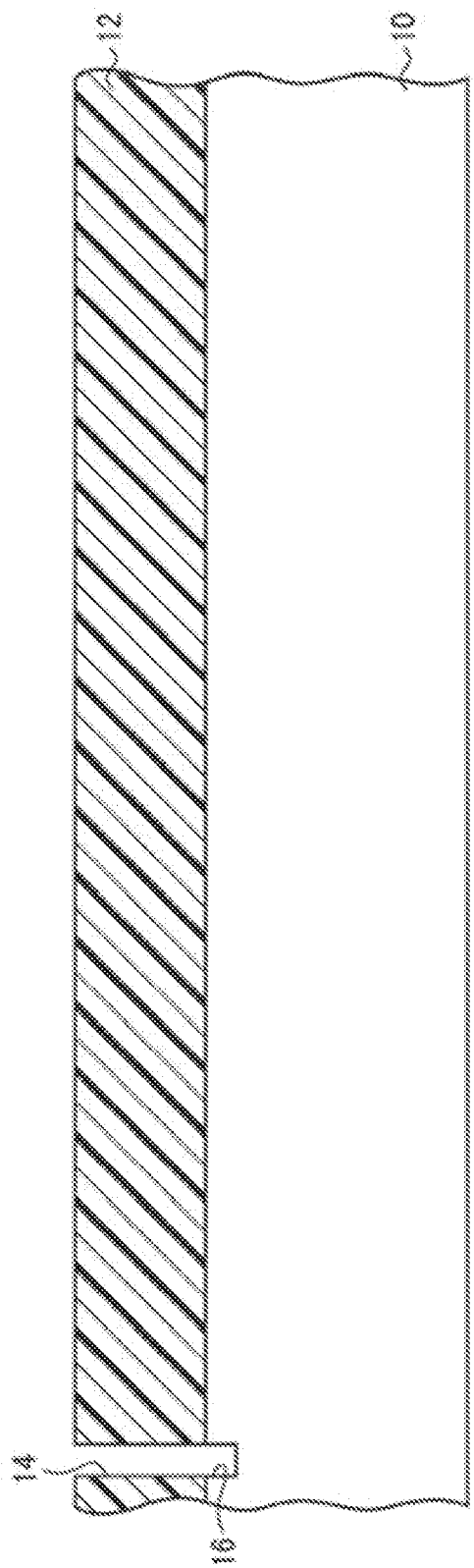
FIG. 16 to FIG. 35 are cross sectional process diagrams (part 1 to part 20) illustrating a method of manufacturing the semiconductor device according to the first embodiment.

Next, the silicon substrate 10, masked by the photoresist film 12, is etched in the opening 14 to form the trench 16 in the silicon substrate 10 (FIG. 16).

In the method of manufacturing a semiconductor device of this embodiment, a part of wells and channel impurity layers are formed, before the element isolation insulating film 56 is formed. The trench 16 is used as a mask alignment mark used in photographic processes (for forming the wells, channel impurity layers, etc.) which take place before the element isolation insulating film 56 is formed.

Next, the photoresist film 12 is removed typically by ashing.

Figure 17:
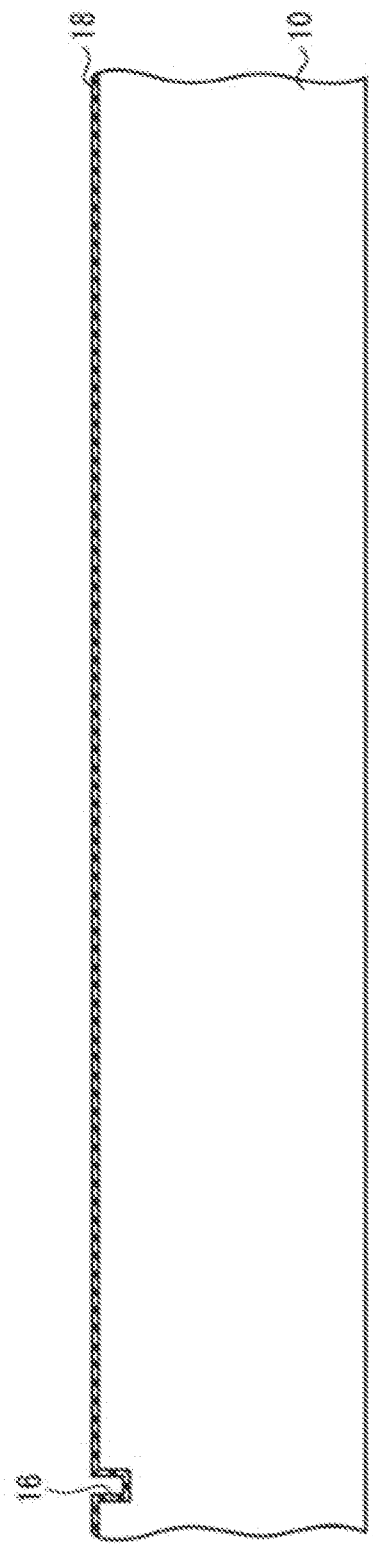

Next, over the silicon substrate 10, a silicon oxide film 18 is formed, typically by thermal oxidation, as a surface protective film for the silicon substrate 10 (FIG. 17).

Next, a photoresist film 32 is formed by photolithography so as to expose the DDC-NMOS transistor region 20 and the LRD region 28, and to cover the residual region. The trench 16 is used as an alignment mark in the photolithography.

Figure 18:
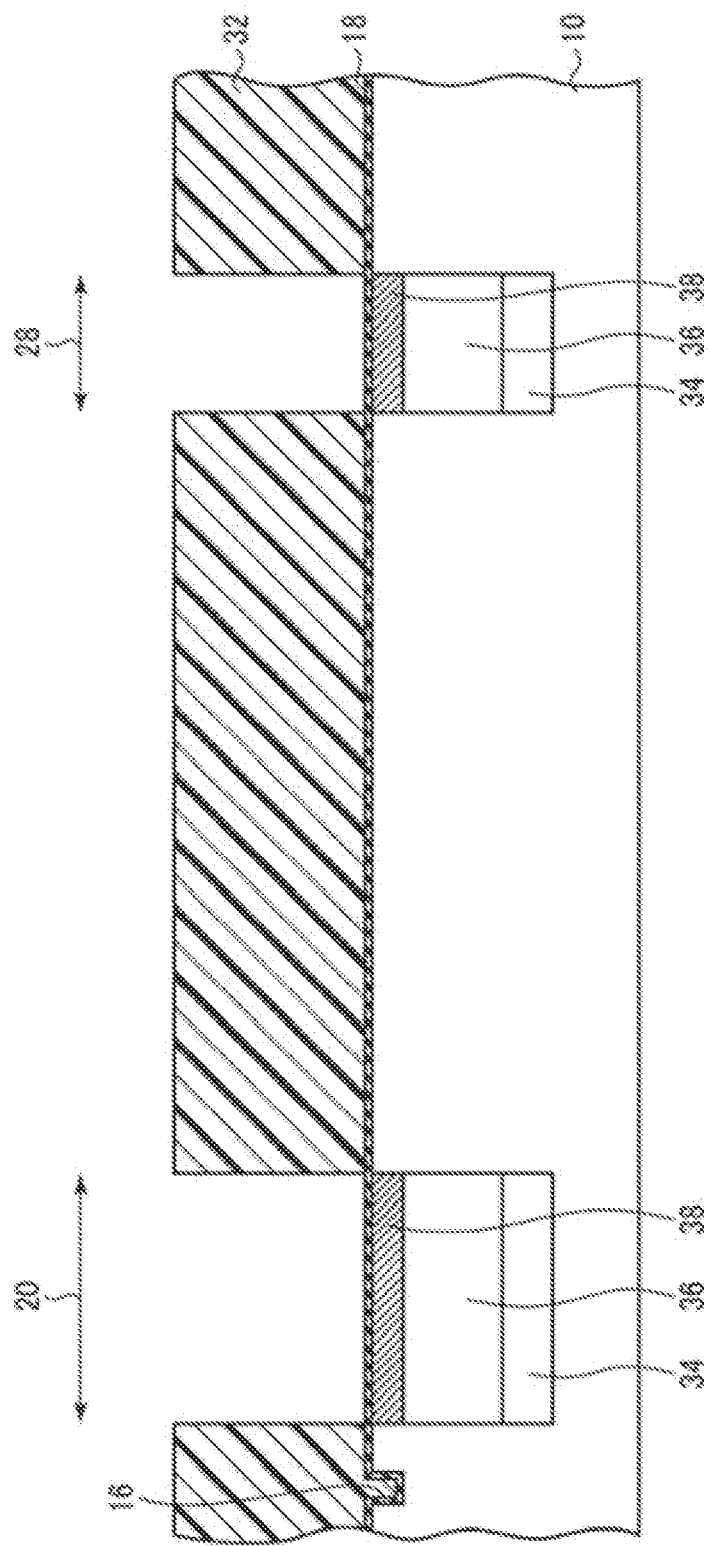

Next, ion implantation is conducted using the photoresist film 32 as a mask, to thereby form the buried N-well 34, the P-well 36, and the P-type imparity layer 38 respectively into the DDC-NMOS transistor region 20 and the LRD region 28 (FIG. 18).

The buried N-well 34 is typically formed by implanting phosphorus ion (P+) at an acceleration energy of 700 keV, and a dose of $1.5 \times 10^{13}$ cm$^{-2}$. The P-well 36 is typically formed by implanting boron ion (B$^+$) at an acceleration energy of 135 keV, and a dose of $1.0 \times 10^{13}$ cm$^{-2}$, respectively from four directions inclined away from the direction of normal line on the substrate.

The P-type impurity layer 38 is formed typically by implanting germanium ion (Ge$^+$) at an acceleration energy of 30 keV and a dose of $5 \times 10^{14}$ cm$^{-2}$; by implanting carbon ion (C$^+$) at an acceleration energy of 5 keV and a dose of $5 \times 10^{14}$ cm$^{-2}$; by implanting boron ion at an acceleration energy of 10 keV and a dose of $1.8 \times 10^{13}$ cm$^{-2}$; and by implanting boron fluoride ion (BF$_2^+$) at an acceleration energy of 25 keV and a dose of $6 \times 10^{12}$ cm$^{-2}$ or at an acceleration energy of 10 keV and a dose of $2.3 \times 10^{12}$ cm$^{-2}$, respectively. Germanium acts to amorphize the silicon, substrate 10 to thereby prevent channeling of boron ion, and to amorphize the silicon substrate 10 to thereby make a carbon atom more likely to be located at a lattice point. Carbon atom located at the lattice point acts to suppress boron from diffusing. From this point of view, germanium ion is implanted prior to carbon and boron. The P-well 36 is preferably formed prior to the P-type impurity layer 38.

Next, the photoresist film 32 is removed typically by ashing.

Next, a photoresist film 40 is formed by photolithography so as to expose the DDC-PMOS transistor region 22, the DDC-NMOS transistor region 20, and a region around the P-well 36 in the LRD region 28, and to cover the residual region. The trench 16 is used as an alignment mark in the photolithography.

Figure 19:
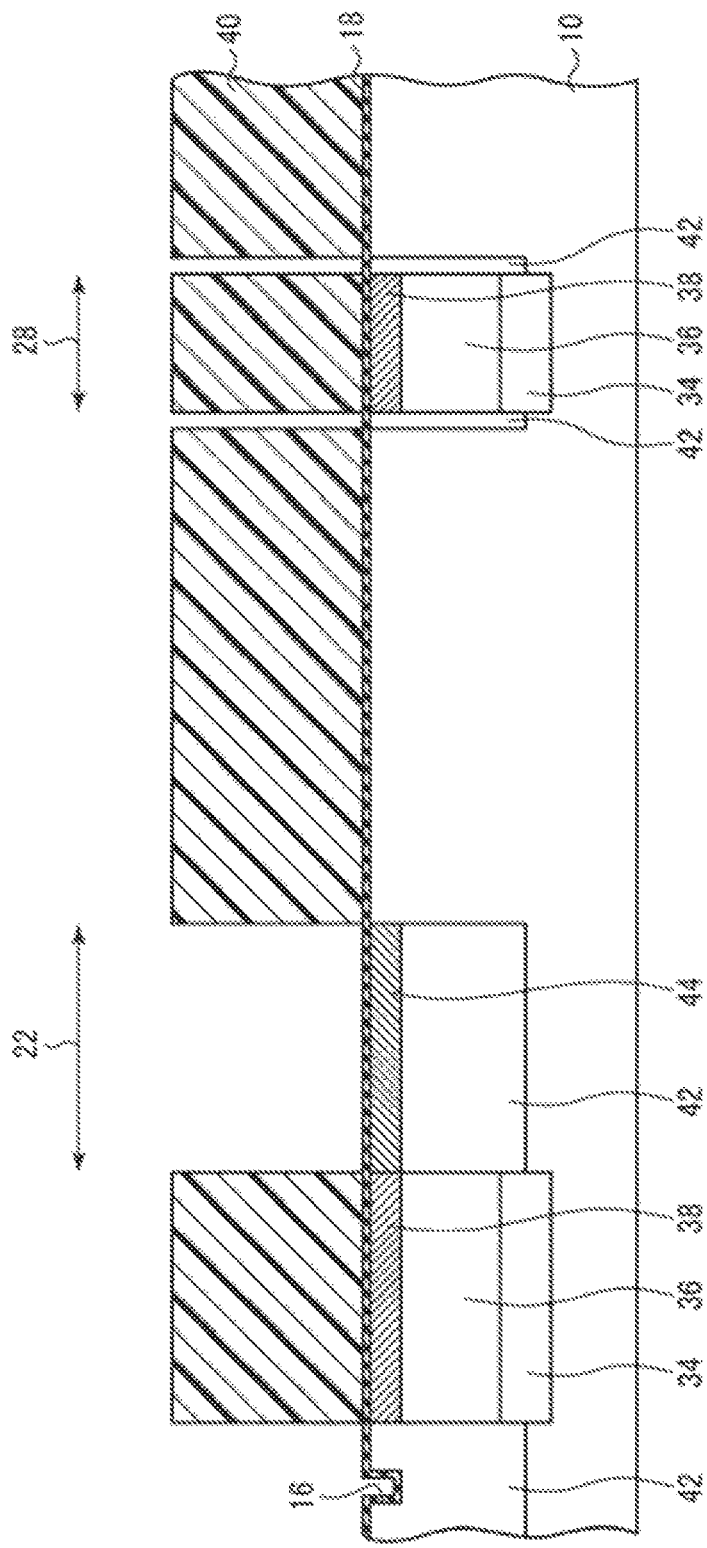

Next, ion implantation is conducted using the photoresist film 40 as a mask, to thereby form the P-well 42 and the N-type impurity layer 44 in the DDC-PMOS transistor region 22 and in the region around the P-well 36 (FIG. 19).

The N-well 42 is typically formed by implanting phosphorus ion at an acceleration energy or 330 keV and a dose of $7.5 \times 10^{12}$ cm$^{-2}$, respectively from four directions inclined away from the direction of normal line on the substrate; and by implanting antimony ion (Sb$^+$) at an acceleration energy of 80 keV and a dose of $1.2 \times 10^{13}$ cm$^{-2}$, and at an acceleration energy of 130 keV and a dose of $6 \times 10^{12}$ cm$^{-2}$.

The N-type impurity layer 44 is typically formed by implanting antimony ion at an acceleration energy of 20 keV and a dose of $6 \times 10^{12}$ cm$^{-2}$.

In this way, the P-well 36 is now given as a double well surrounded by the N-well 42 and the buried N-well 34. The N-well which surrounds the P-well 36 may alternatively be the N-well 66 described later.

Next, the photoresist film 40 is removed typically by ashing.

Having described an exemplary case where two kinds of DDC transistor are formed, an additional DDC transistor having a different threshold voltage value or a different operating voltage value may be formed by repeating the same processes as described above, or, only by adding ion implantation for controlling the threshold voltage, so thereby form a predetermined well and an impurity layer which serves as a channel region.

Next, the product is annealed in an inert atmosphere, to thereby restore damaged portions induced in the silicon substrate 10 by ion implantation, and to activate the implanted impurities. For example, the product is annealed in a nitrogen atmosphere at a temperature of 600° C. for 150 seconds.

Next, the silicon oxide film 18 is removed typically by wet etching using an aqueous hydrofluoric acid, solution.

Figure 20:
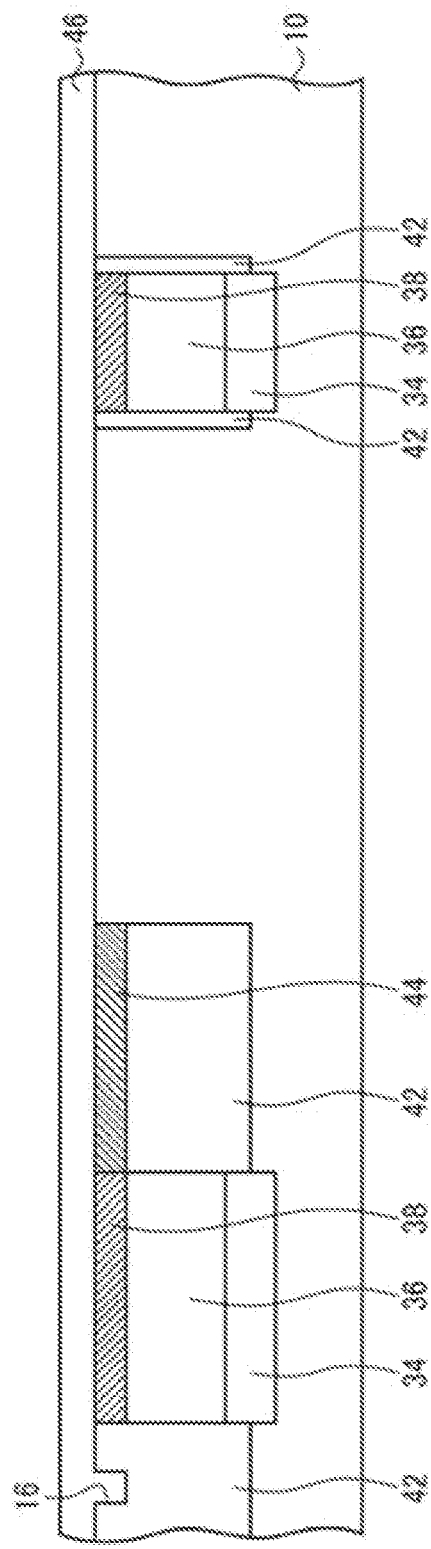

Next, over the surface of the silicon substrate 10, a non-doped silicon layer (epitaxially-grown silicon layer) 46 of, for example, 25 nm thick is epitaxially grown, typically by CVD (FIG. 20).

Next, the surface of the epitaxially-grown silicon layer 46 is wet-oxidized under a reduced pressure typically by the ISSG (in-situ steam generation) process, to thereby form a silicon oxide film 48 of, for example, 3 nm thick. The annealing is typically conducted at 810° C. for 20 seconds.

Next, over the silicon oxide film 48, typically by reduced-pressure CVD, a silicon nitride film 50 of, for example, 80 nm thick is deposited. The deposition is typically conducted at 700° C. for 150 minutes.

Next, over the silicon nitride film 50, a photoresist film 52 is formed by photolithography so as to expose the element, isolation region. The trench 16 is used as an alignment mark in the photolithography.

Figure 21:
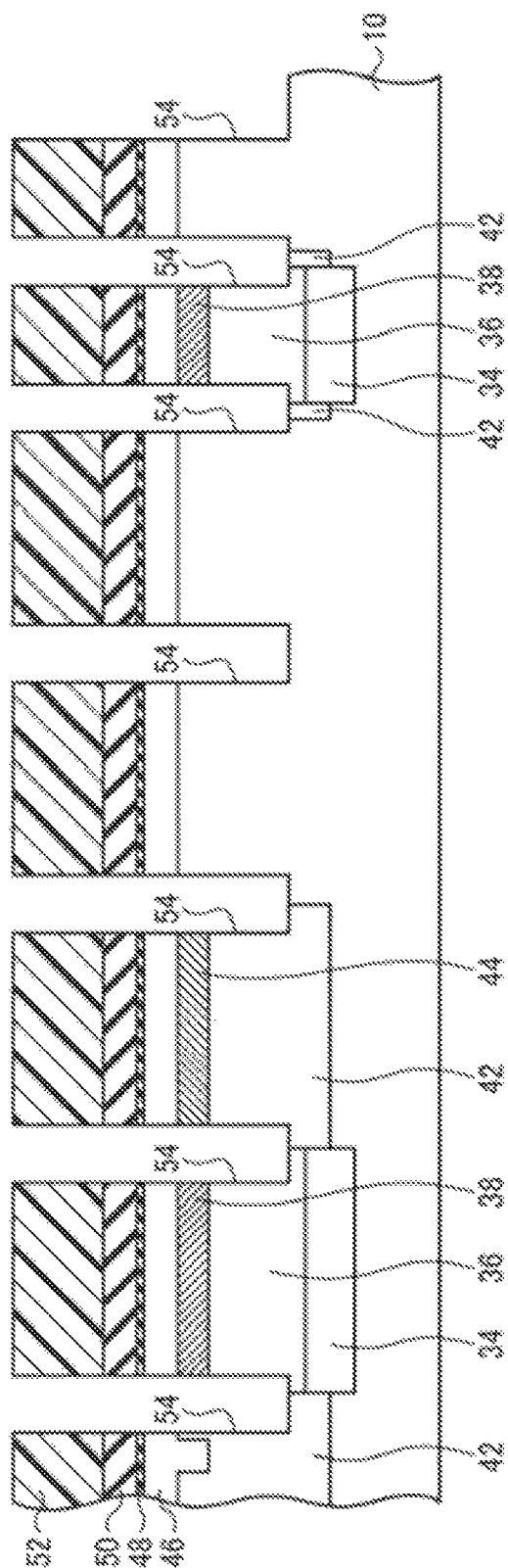

Next, the silicon nitride film 50, the silicon oxide film 48, the epitaxially-grown silicon layer 46 and the silicon, substrate 10, masked by the photoresist film 52, are anisotropically etched by dry etching. In this way, element isolation trenches 54 are formed in the element isolation region of the silicon substrate 10 and the epitaxially-grown silicon layer 46 (FIG. 21).

Next, the photoresist film 52 is removed typically by ashing.

Next, the surfaces of the epitaxially-grown silicon layer 46 and silicon substrate 10 are thermally oxidized, to thereby form a silicon oxide film of, for example, 10 nm thick, as a liner film, over the inner walls of the element isolation trenches 54. The oxidation is typically conducted at 650° C.

Next, typically by high density plasma-assisted CVD, a silicon oxide film of, for example, 475 nm thick is deposited so as to fill up the element isolation trenches 54.

Figure 22:
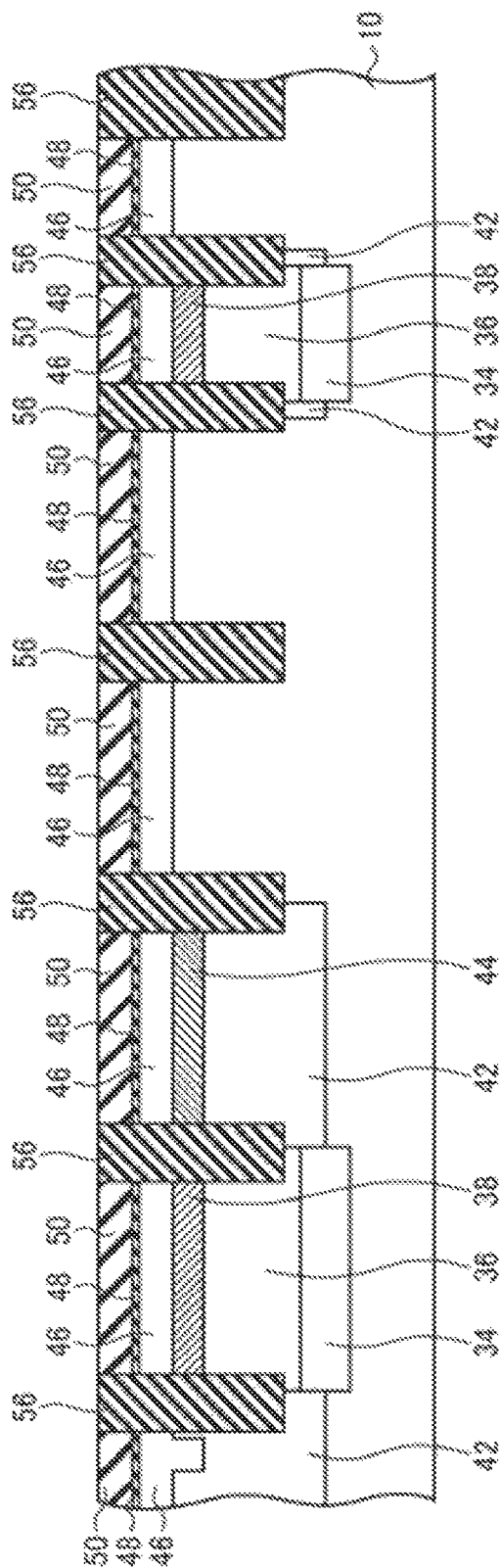

Next, a portion of the silicon oxide film which resides on the surface of the silicon nitride film 50 is removed typically by CMP (Chemical Mechanical Polishing). In this way, according to the so-called STI (Shallow Trench Isolation) process, the element isolation insulating films 56 is formed by the silicon oxide film filled in the element isolation trenches 54 (FIG. 22).

Next, the element isolation insulating film 56, masked by the silicon nitride film 50, as etched to a depth of, for example, 50 nm or around, typically by wet etching using an aqueous hydrofluoric acid solution. The etching is directed to almost equalize the level of height of the surface of the epitaxially-grown silicon layer 46 and the level of height of the surface of the element isolation insulating film 56, in a finished form of the semiconductor device.

Figure 23:
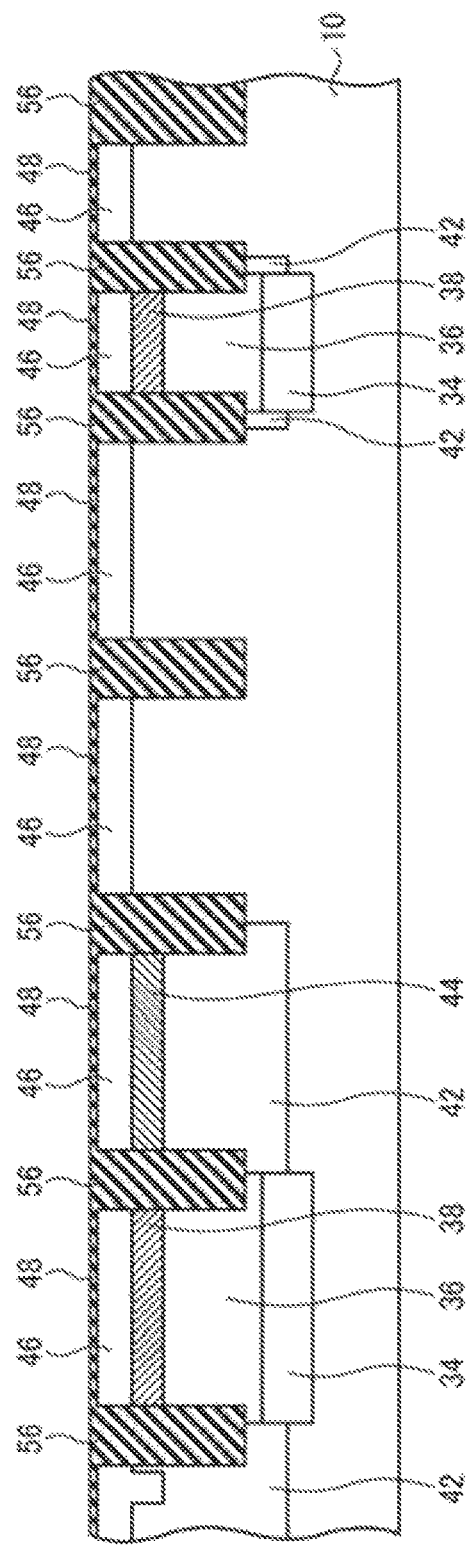

Next, the silicon nitride film 40 is removed typically by wet etching using a hot phosphoric acid solution (FIG. 23).

Next, a photoresist film 58 is formed by photolithography, so as to expose the high-voltage NMOS transistor region 24 and to cover the residual region.

Figure 24:
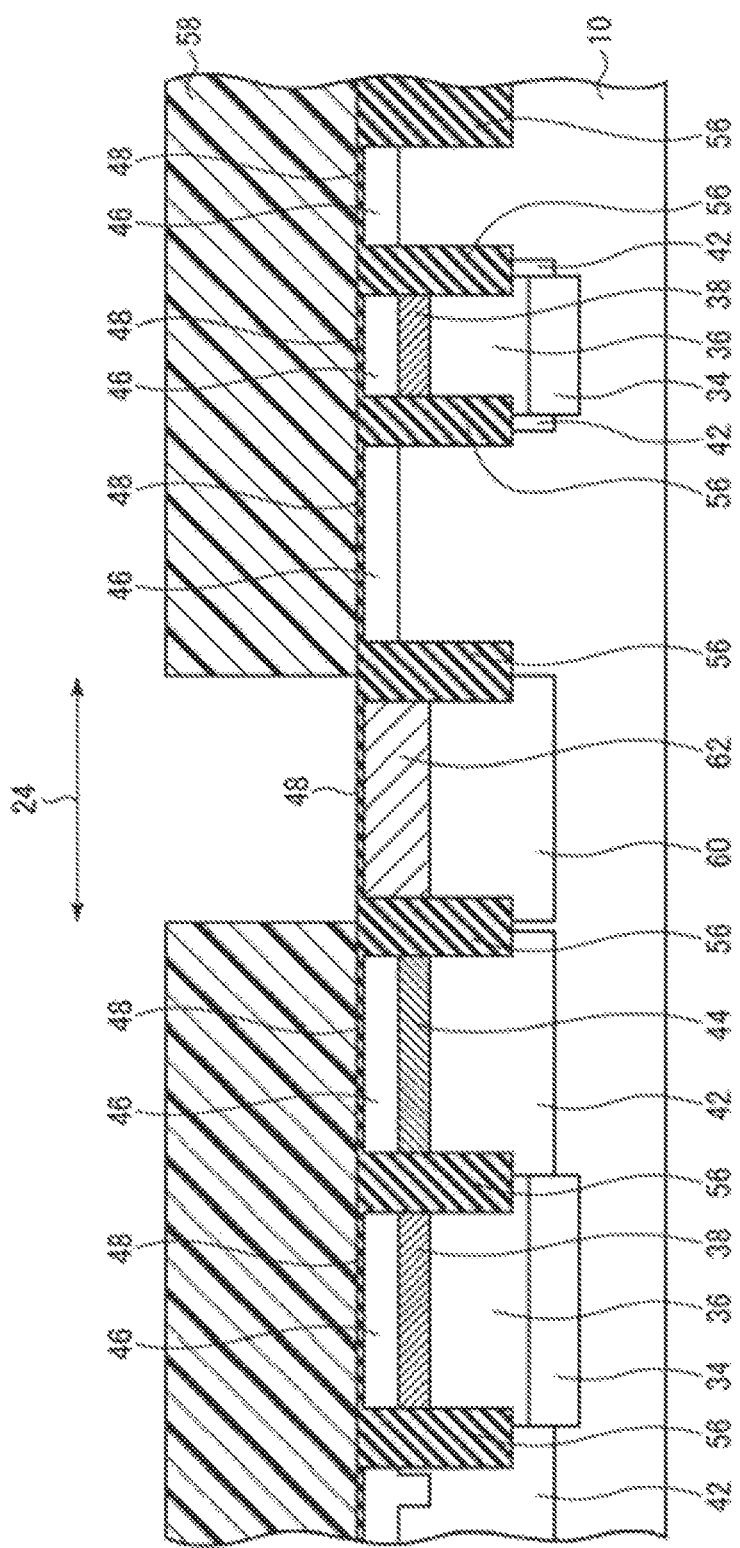

Next, ion implantation is conducted using the photoresist film 58 as a mask, to thereby form the P-well 60 and the P-type impurity layer 62 in the high-voltage NMOS transistor region 24 (FIG. 24).

The P-well 60 is formed, for example, by implanting boron ion at an acceleration energy of 150 keV and a dose of $7.5 \times 10^{12}$ cm$^{-2}$, respectively from four directions inclined away from the direction of normal line on the substrate.

The P-type impurity layer 62 is formed, for example, by implanting boron fluoride ion at an acceleration energy of 5 keV and a dose of $3.2 \times 10^{12}$ cm$^{-2}$.

Next, the photoresist film 58 is removed typically by ashing.

Next, a photoresist film 64 is formed by photolithography, so as to expose the high-voltage PMOS transistor region 26 and the SBD region 30.

Figure 25:
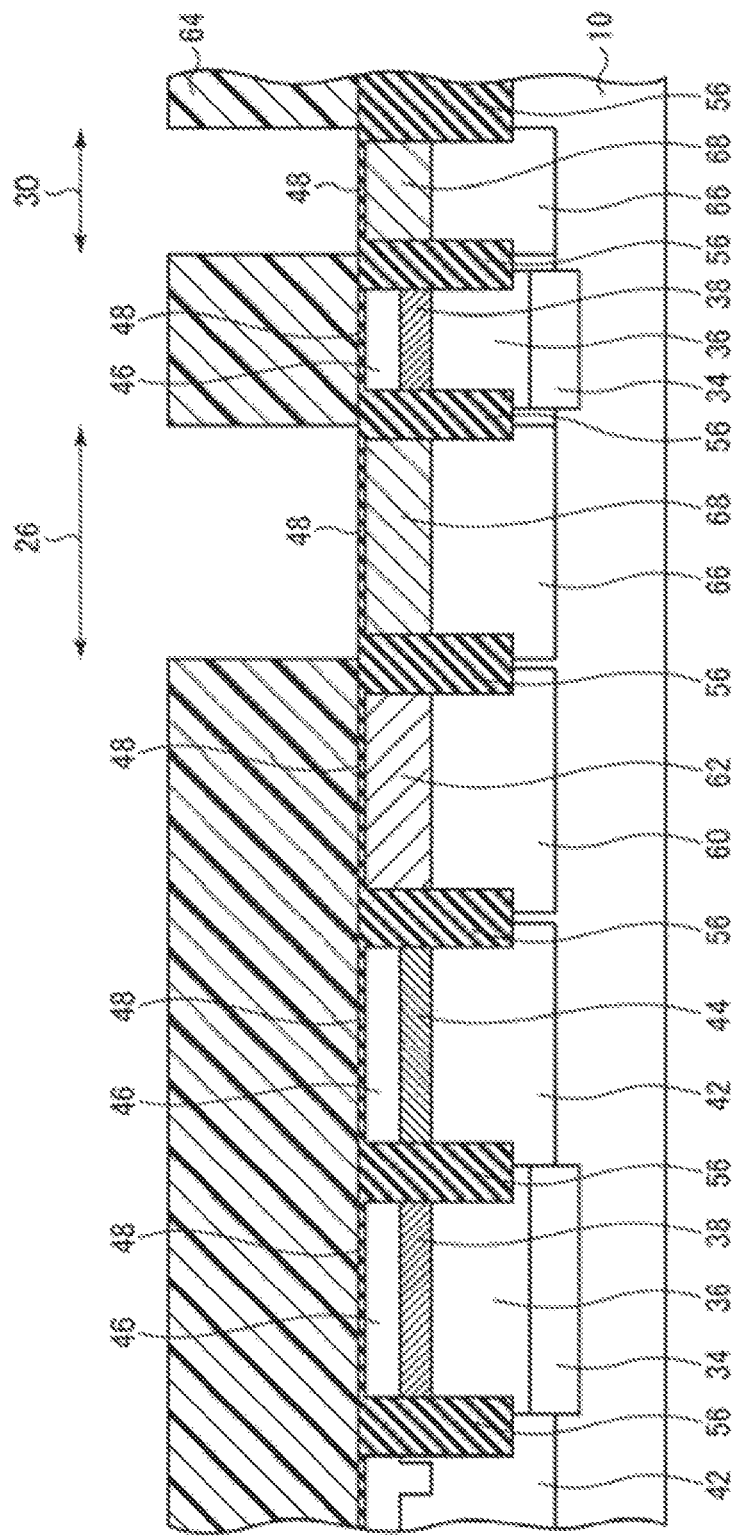

Next, the iron implantation is conducted using the photoresist film 64 as a mask, to thereby form the N-well 66 and the N-type impurity layer 68, in the high-voltage PMOS transistor region 26 and in the SBD region 30 (FIG. 25).

The N-well 66 is formed typically by implanting phosphorus ion at an acceleration energy of 360 keV and a dose of $7.5 \times 10^{12}$ cm$^{-2}$, respectively from four directions inclined away from the direction of normal line on the substrate.

The N-type impurity layer 68 is formed typically by implanting arsenic ion (As$^+$) at an acceleration energy of 100 keV and a dose of $1.2 \times 10^{12}$ cm$^{-2}$.

Next, the photoresist film 64 is removed typically by ashing.

Next, the silicon oxide film 48 is removed typically by wet etching using an aqueous hydrofluoric acid solution.

Figure 26:
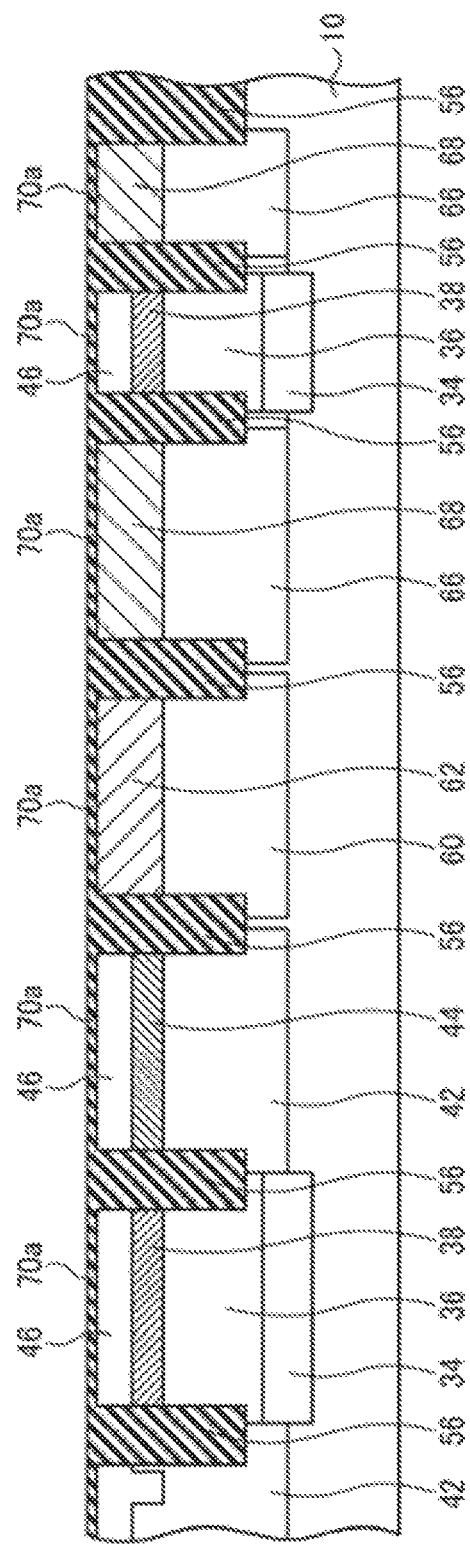

Next, the surface of the epitaxially-grown silicon layer 46 is thermally oxidized in a wet atmosphere, to thereby form a silicon oxide film 70a of, for example, 7 nm thick over the surface of the epitaxially-grown silicon layer 46 (FIG. 26). The silicon oxide film 70a is formed, for example, at 750° C. for 52 minutes.

Next, a photoresist film 72 is formed by photolithography, so as to expose the DDC-NMOS transistor region 20, the DDC-PMOS transistor region 22, the LRD region 28 and the SBD region 30, and to cover the residual region.

Figure 27:
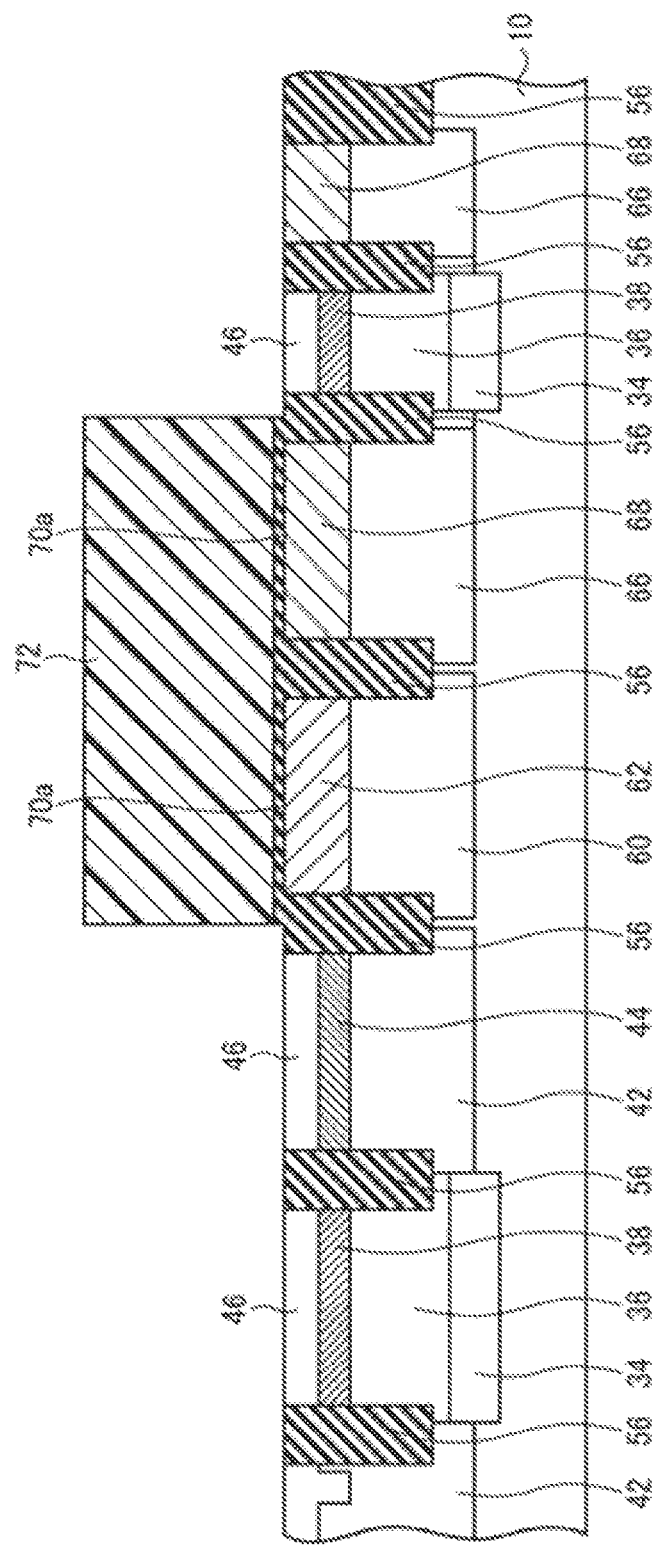

Next, the silicon oxide film 70a, masked by the photoresist film 72, is etched typically by wet etching using an aqueous hydrofluoric acid solution. By the etching, silicon oxide film 70a is removed in the DDC-NMOS transistor region 20, the DDC-PMOS transistor region 22, the LRD region 28 and the SBD region 30 (FIG. 27).

Next, the photoresist film 72 is removed typically by ashing.

Next, the product is wet-oxidized under a reduced pressure typically by the ISSG process, typically at 810° C. for 8 seconds, followed by annealing in an NO atmosphere, for example, at 870° C. for 13 seconds. In this way, a silicon oxide film 74a of, for example, 2 nm thick is formed, and the silicon oxide film 70a is additionally oxidized, in the DDC-NMOS transistor region 20, the DDC-PMOS transistor region 22, the LRD region 23 and the SBD region 30.

In this way, the gate insulating film 74 composed of the silicon oxide film 74a is formed in the DDC-NMOS transistor region 20 and the DDC-PMOS transistor region 22.

Figure 28:
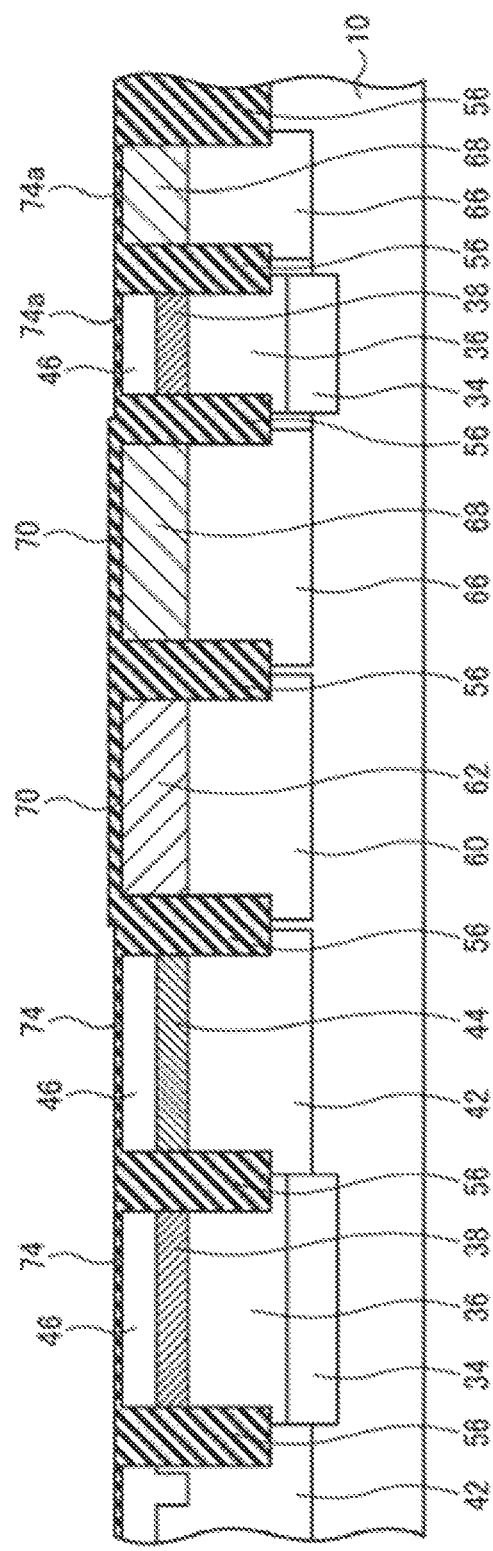

In the high-voltage NMOS transistor region 24 and the high-voltage PMOS transistor region 26, the gate insulating film 70, which is composed of a silicon oxide film obtained by additionally oxidizing the silicon oxide film 70a, is formed (FIG. 28).

Next, a non-doped polysilicon film of, for example, 100 nm thick is deposited over the entire surface typically by reduced-pressure CVD. The deposition is conducted typically at 605° C.

Figure 29:
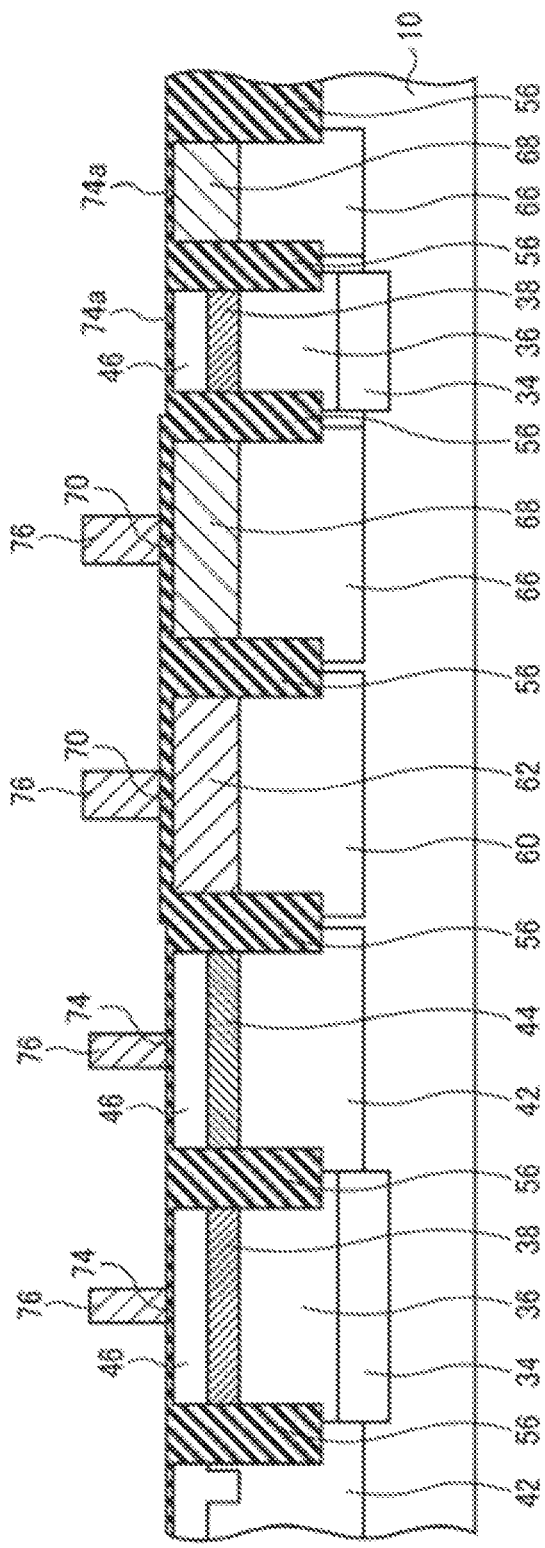

Next, the polysilicon film is patterned by photolithography and dry etching. In this way, the gate electrodes 76 are formed respectively in the DDC-NMOS transistor region 20, the DDC-PMOS transistor region 22, the high-voltage NMOS transistor region 24, and the high-voltage PMOS transistor region 26 (FIG. 29).

Next, an N-type impurity layer 73 which serves as an extension region is termed by photolithography and ion implantation in the DDC-NMOS transistor region 20. The N-type impurity layer 78 is formed typically by implanting arsenic ion at an acceleration energy of 1.5 keV said a dose of $9.0 \times 10^{14}$ cm$^{-2}$.

Again by photolithography and ion implantation, a P-type impurity layer 80 which serves as an extension region is formed in the DDC-PMOS transistor region 22. The P-type impurity layer 80 is formed, for example, by implanting boron ion at an acceleration energy of 0.5 keV and a dose of $3.2 \times 10^{14}$ cm$^{-2}$.

Again by photolithography and ion implantation, an N-type impurity layer 82 which serves as an LCD region is formed in the high-voltage NMOS transistor region 24. The N-type impurity layer 82 is formed, for example, by implanting phosphorus ion at an acceleration energy of 35 keV, and a dose of $1.0 \times 10^{3}$ cm$^{-2}$.

Figure 30:
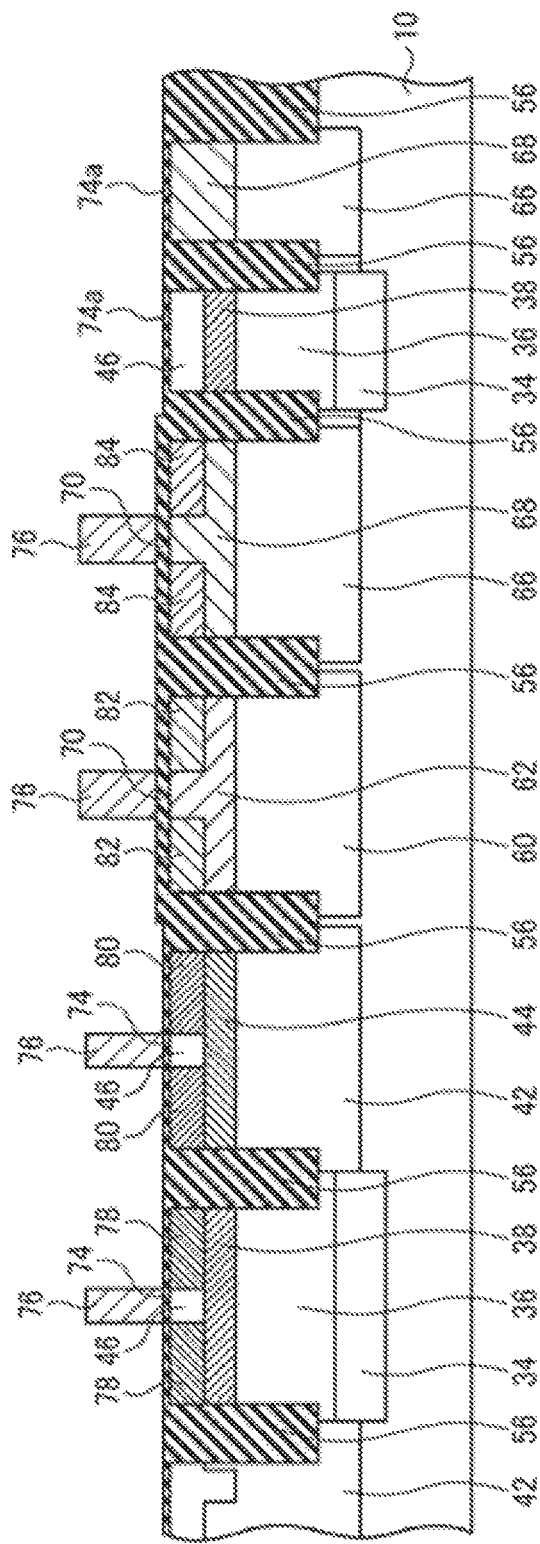

Again by photolithography and ion implantation, a P-type impurity layer 84 which serves as an LDD region is formed in the high-voltage PMOS transistor region 26 (FIG. 30). The P-type impurity layer 84 is formed, for example, by implanting boron ion at an acceleration energy of 0.5 keV and a dose of $1.8 \times 10^{14}$ cm$^{-2}$.

Next, a silicon oxide film of, for example, 74 nm thick is formed typically by reduced pressure CVD. The deposition is conducted typically at 520° C.

Figure 31:
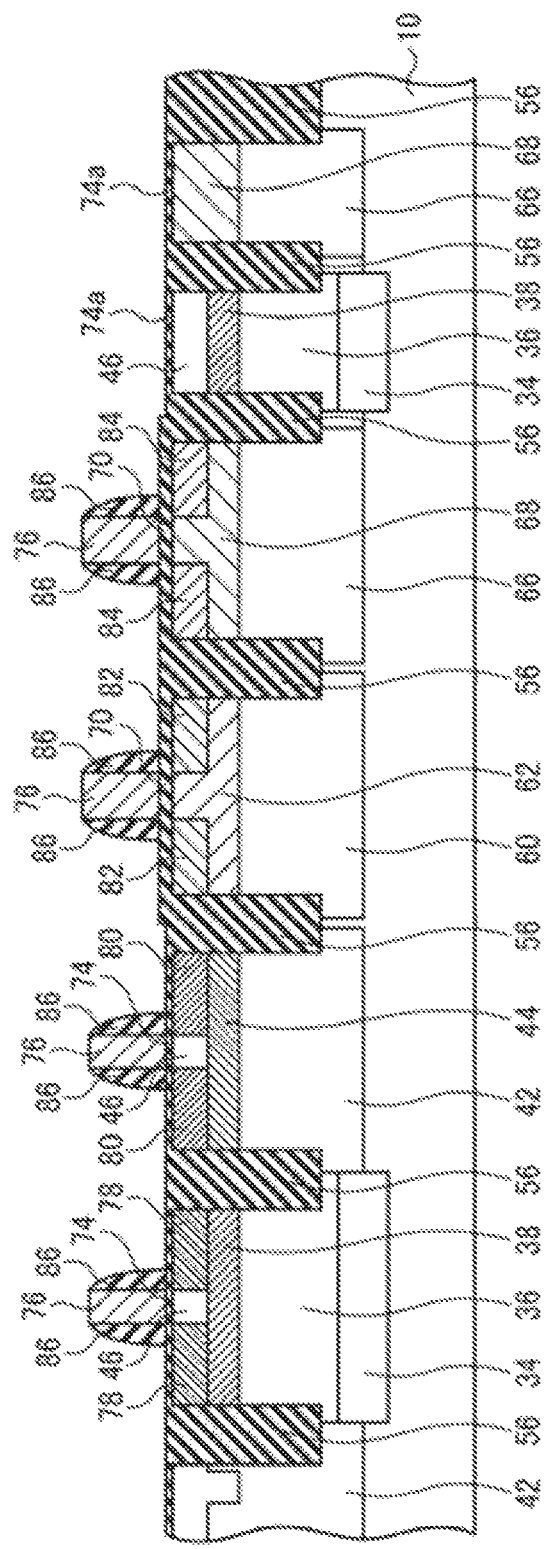

Next, the silicon oxide film is anisotropically etched to thereby form sidewall insulating films 86 composed of the silicon oxide film, on the sidewalk portions of the gate electrodes 76 (FIG. 31).

Next, a photoresist film 88 is formed by photolithography, so as to expose the DDC-NMOS transistor region 20, the high-voltage NMOS transistor region 24, the cathode region of the LED 114, and the well contact region of the SBD 116, and to cover the residual region. The cathode region of the LRD 114 is the right active region in FIG. 2. The well contact region of the SBD 116 is the left active region in FIG. 2.

Figure 32:
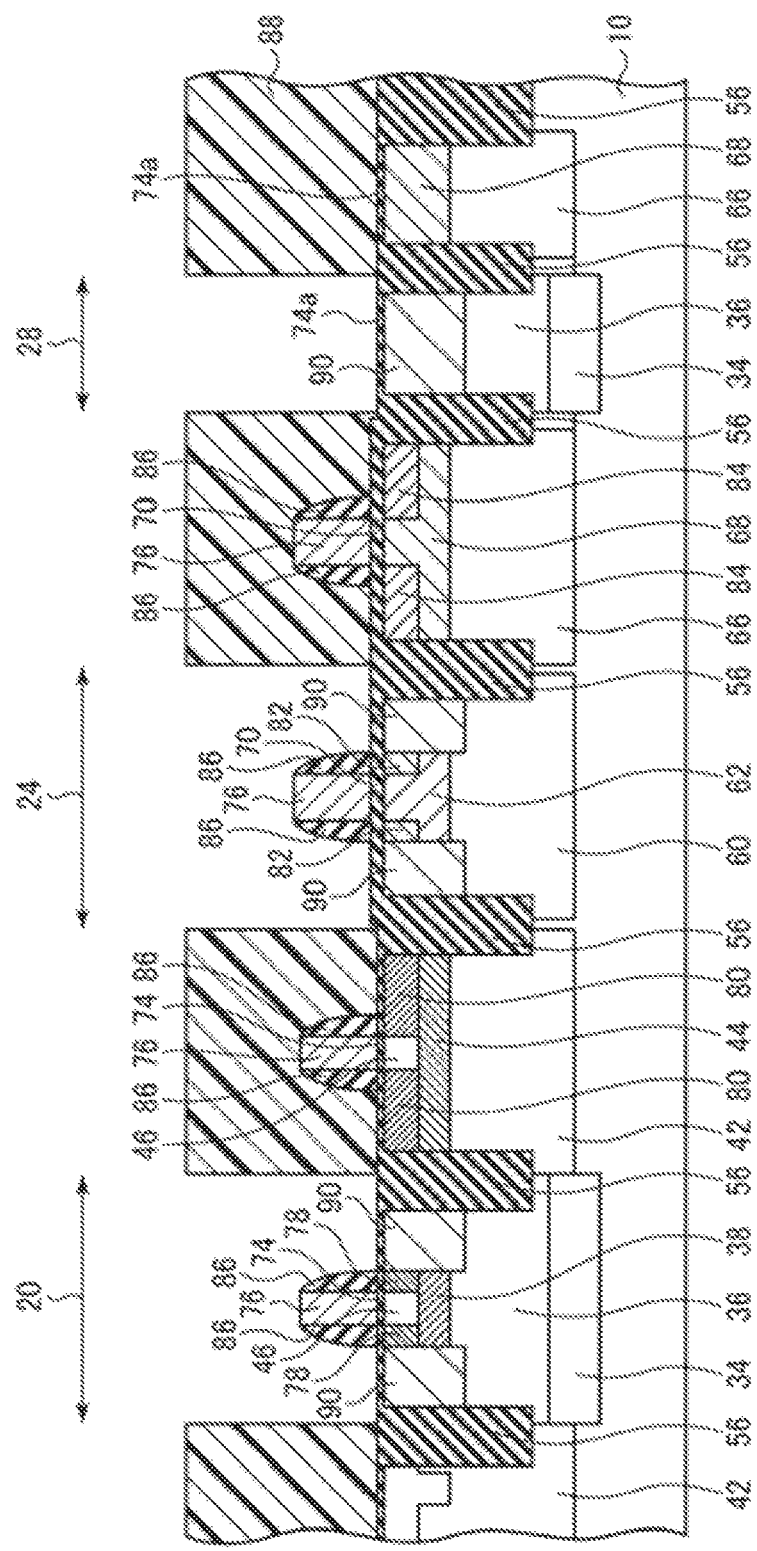

Next, ion implantation is conducted using the photoresist film 88, the gate electrode 76 and the sidewall insulating films 86 as a mask. In this way, the N-type impurity layer 90 is formed in the DDC-NMOS transistor region 20, the high-voltage NMOS transistor region 24, the cathode region of the LRD 114, and the well contact region of the SBD 116 (FIG. 32). The N-type impurity layer 80 is formed, for example, by implanting phosphorus ion at an acceleration energy of 8 keV and a dose of $1.2 \times 10^{16}$ cm$^{-2}$.

The N-type impurity layer 90 of the DDC-NMOS transistor region 20 and the high-voltage NMOS transistor region 24 serves as the high concentration portions of the source/drain regions. The N-type impurity layer 90 of the LRD region 28 serves as a cathode region or LRD. The N-type imparity layer 90 or the SBD region 30 serves as a well contact layer of SBD (see FIG. 2).

Next, the photoresist film 88 is removed typically by ashing.

Next, a photoresist film 92 is formed by photolithography, so as to expose the DDC-PMOS transistor region 22, the high-voltage PMOS transistor region 26, the well contact region of the LRD 114, and a circumferential portion of the SBD region 30, and to cover the residual portion. The well contact region of the LRD 114 corresponds to the left active region in FIG. 2.

Figure 33:
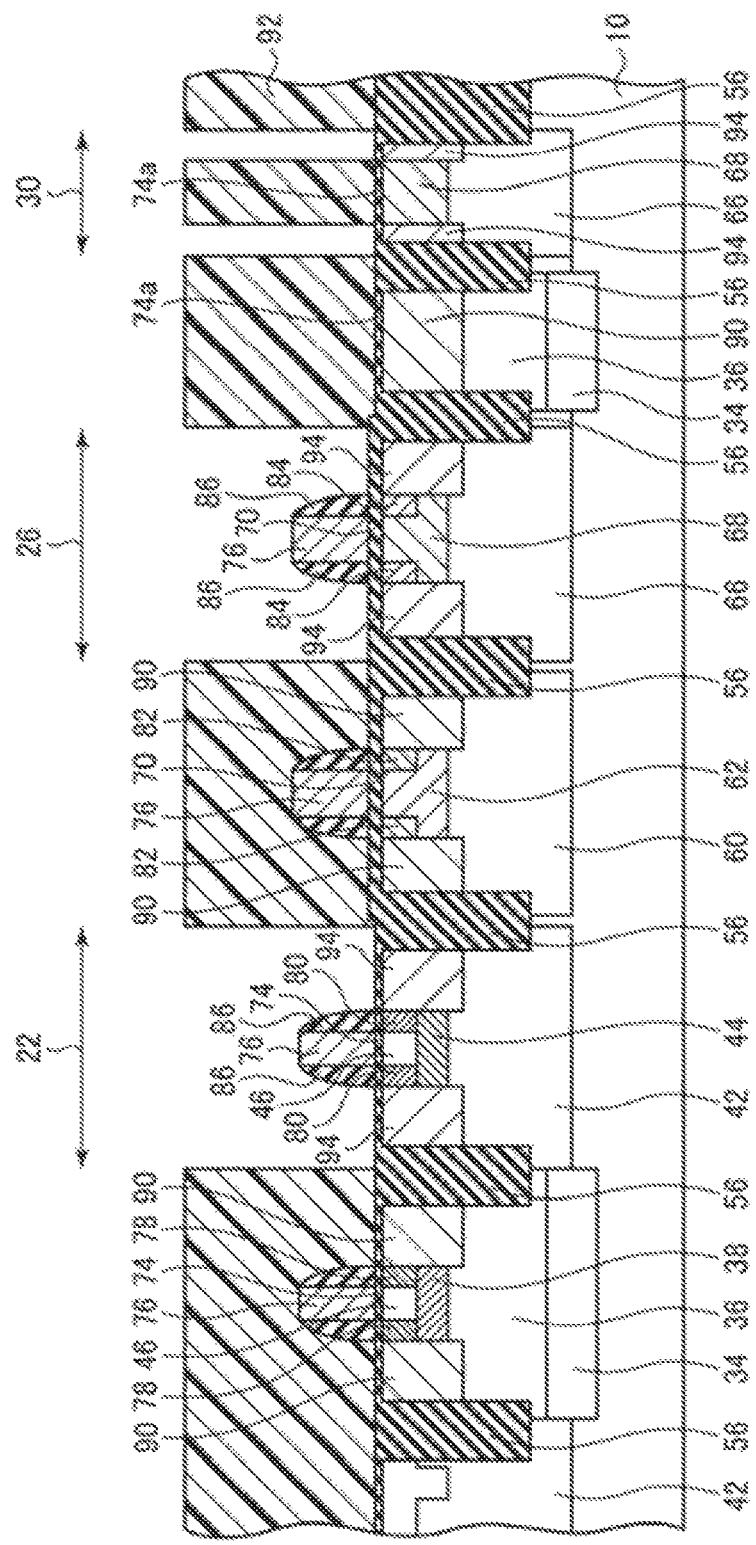

Next, ion implanted: ion is conducted using the photoresist film 92, the gate electrodes 76 and the sidewall insulating films 86 as a mask. In this way, a P-type impurity layer 94 is formed in the DDC-PMOS transistor region 22, the high-voltage PMOS transistor region 26, the well contact region of the LRD 1314 and the SBD region 30 (FIG. 33). The P-type imparity layer 94 is formed typically by implanting boron ion at an acceleration energy of 4 keV and a dose of $6.0 \times 10^{15}$ cm$^{-2}$.

The P-type impurity layer 94 in the DDC-PMOS transistor region 22 and the high-voltage PMOS transistor region 26 serves as high-concentration portions of the source/drain regions. The P-type impurity layer 94 in the LRD region 28 serves as a well contact layer of LRD (see FIG. 2). The P-type impurity layer 94 in the SBD region 30 serves as a guard ring of SBD.

Next, the photoresist film 92 is removed typically by ashing.

Next, the product is annealed within a short, time in an inert atmosphere typically at 1025° C. for 0 seconds, to thereby activate the implanted impurities, and to allow them to diffuse in the gate electrodes 76.

By the annealing, in the DDC-NMOS transistor region 20, the N-type source/drain regions 96 configured by the N-type impurity layers 78, 90 are formed. In the DDC-PMOS transistor region 22, the P-type source/drain regions 98 configured by the P-type impurity layers 80, 94 are formed. In the high-voltage NMOS transistor region 24, the N-type source/drain regions 100 configured by the N-type impurity layers 82, 90 are formed. In the high-voltage PMOS transistor region 26, the P-type source/drain regions 102 configured by the P-type impurity layers 84, 94 are formed.

Figure 34:
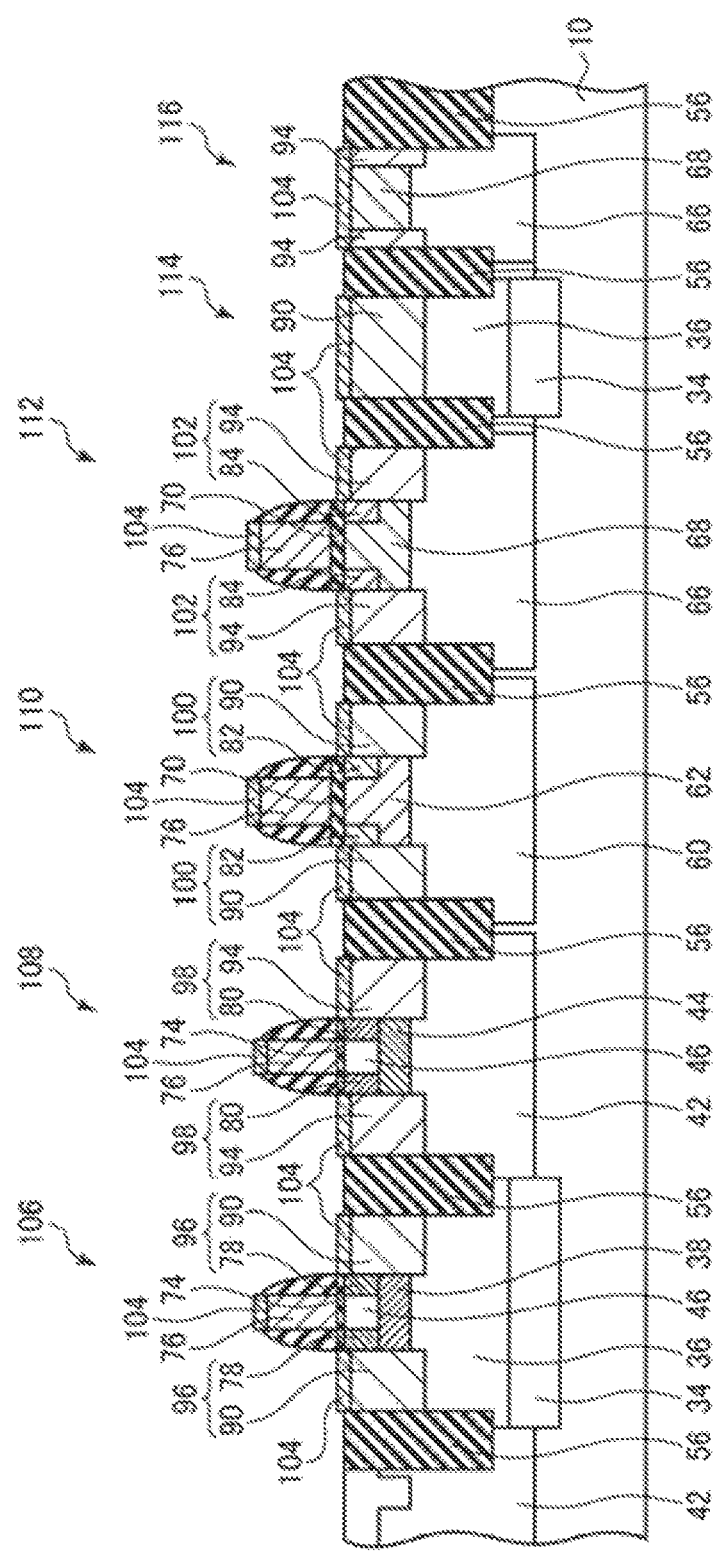

Next, the metal silicide film 104 is selectively formed, respectively over the gate electrodes 76, over the N-type source/drain regions 96, 100, P-type source/drain regions 98, 100, over the N-type impurity layer 90 in the LRD region 28, and over the N-type impurity layer 68 in the SBD region (FIG. 34).

For example, the silicon oxide film is removed from the surface, a cobalt film of 3.8 nm thick and a TiN film of 3 nm thick are deposited, annealed in a nitrogen atmosphere at 520° C. for 30 minutes, the TiN film and an unreacted portion of the cobalt film are removed, and the product is annealed in a nitrogen atmosphere at 700° C. for 30 minutes. According to such so-called SALICIDE process, the metal silicide film 104 composed of a cobalt silicide film of, for example, 15.9 nm thick is formed.

In this way, the DDC-NMOS transistor 106 is formed in the DDC-NMOS transistor region 20. The DDC-PMOS transistor 108 is formed in the DDC-PMOS transistor region 22. The high-voltage PMOS transistor 110 is formed in the high-voltage NMOS transistor region 24. The high-voltage PMOS transistor 112 is formed in the high-voltage PMOS transistor region 26. The LDR 114 is formed in the LRD region 23. The SBD 116 is formed in the SBD region 30.

Next, a silicon nitride film of, for example, 50 nm thick is formed over the entire surface by CVD, as an etching stopper film.

Next, a silicon oxide film of, for example, 500 nm thick is formed over the silicon nitride film, typically by high density plasma-assisted CVD.

In this way, the interlayer insulating film 118, configured by a stack of the silicon nitride film and the silicon oxide film, is formed.

Next, the surface of the interlayer insulating film 118 is polished and planerized, typically by CMP.

Figure 35:
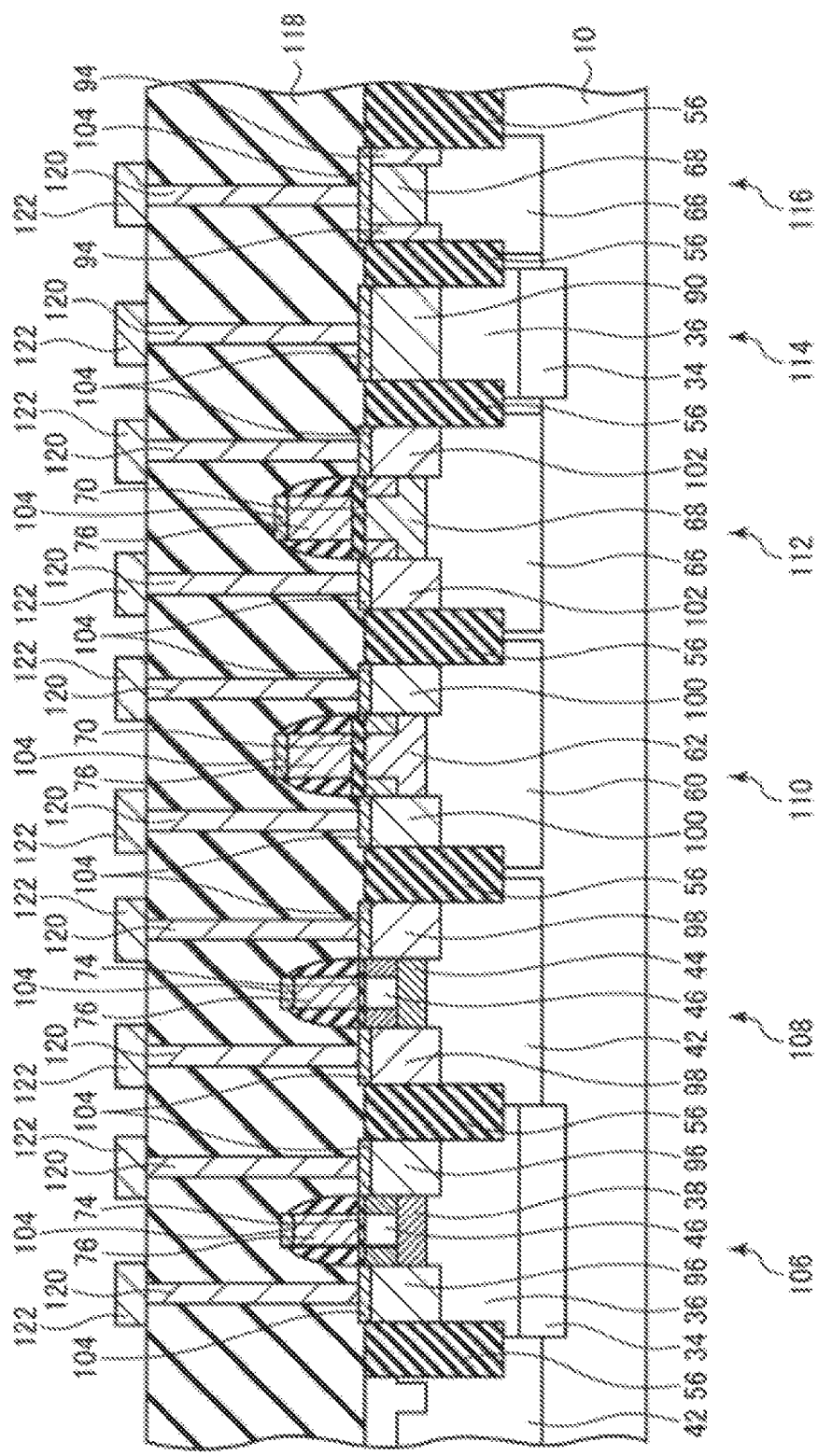

Next, the contact plugs 120 buried in the interlayer insulating film 118, and the interconnects 122 which are connected to the contact plugs 120 buried in the interlayer insulating film 118, are formed (FIG. 35).

After some necessary back end process, the semiconductor device of this embodiment is completed.

As described above, according to this embodiment the Schottky barrier diode for preventing latch-up is incorporated in a semiconductor chip, so that the latch-up is effectively avoidable even if the DDC transistor is back-biased. The semiconductor device of this embodiment is therefore improved in the reliability.

Second Embodiment

A semiconductor device and a method of manufacturing the same according to a second, embodiment will be explained, referring to FIG. 36 to FIG. 50. Note that ail constituents, same as those of the semiconductor device send the method of manufacturing the same in the first embodiment illustrated in FIG. 1 to FIG. 35, are given same reference numerals or symbols, in order to avoid the explanation or to skip the detail.

Figure 36:
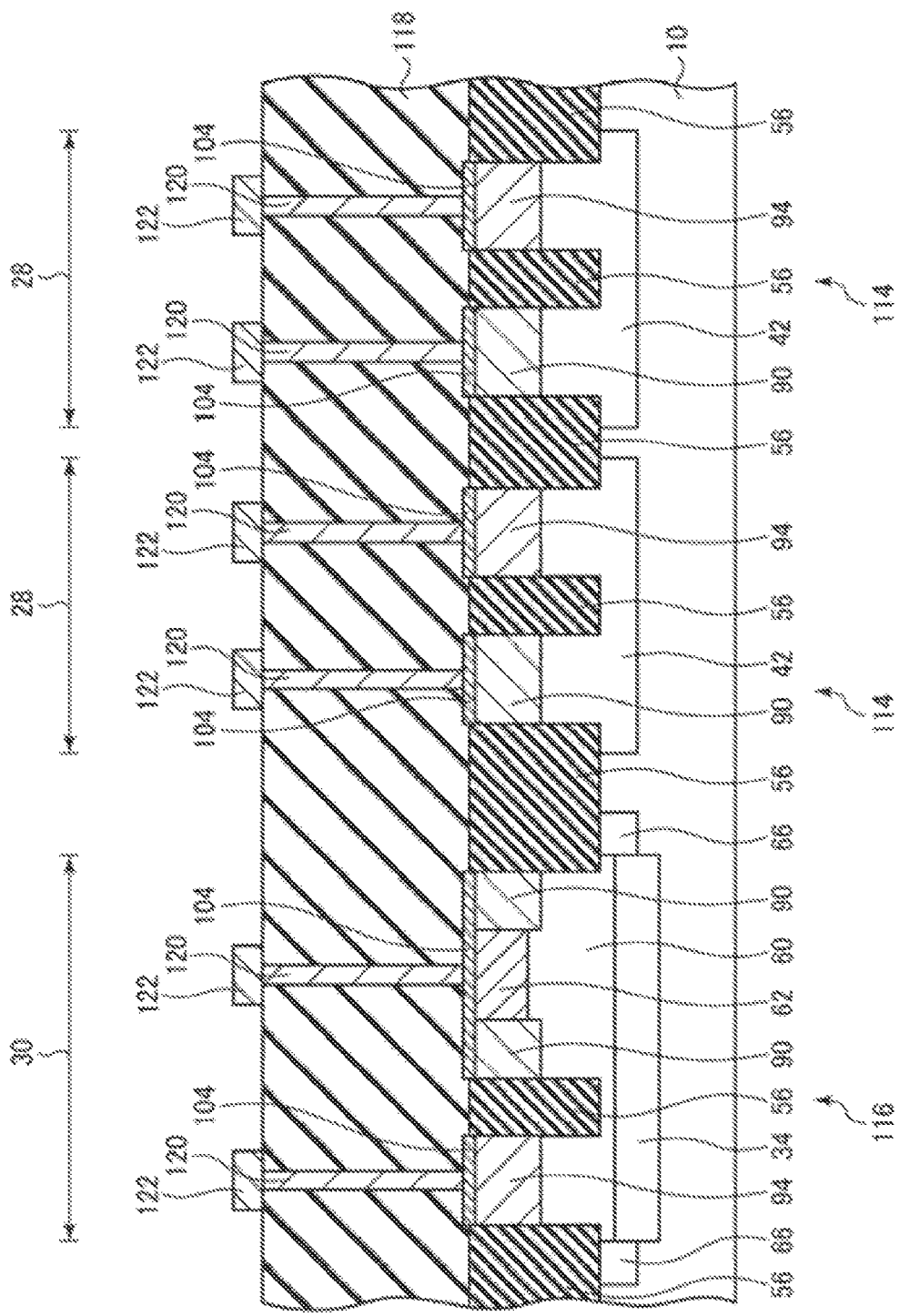
FIG. 36 is a schematic cross sectional view illustrating a configuration of a semiconductor device according to a second embodiment.
Figure 37:
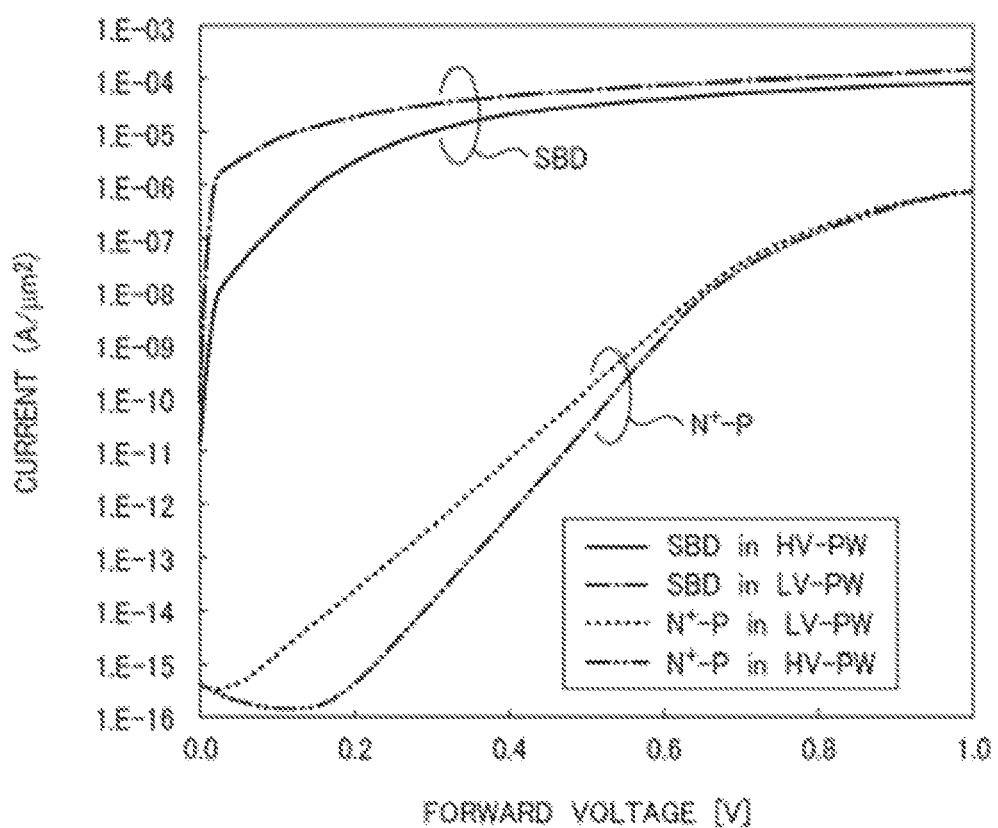
FIG. 37 is a graph (part 2) illustrating forward I-V characteristics of the PN junction diode and the Schottky barrier diode.
Figure 38:
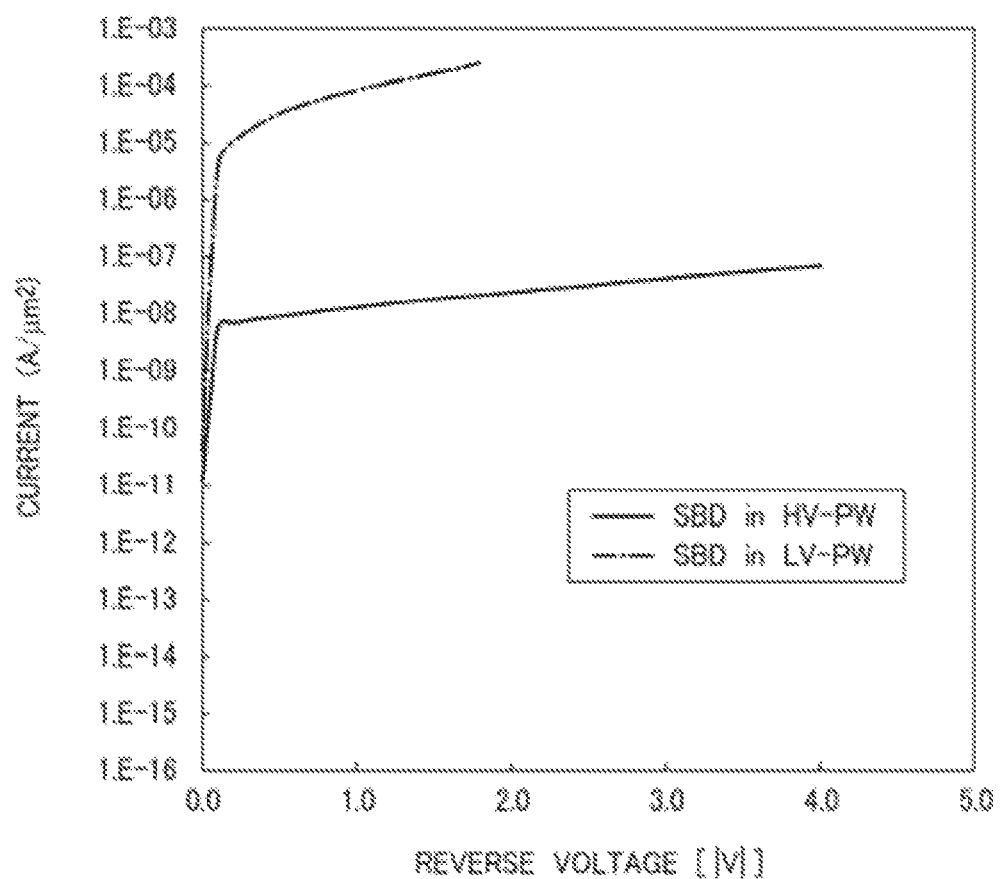
FIG. 38 is a graph (part 2) illustrating reverse I-V characteristics of the Schottky barrier diode.
Figure 39:
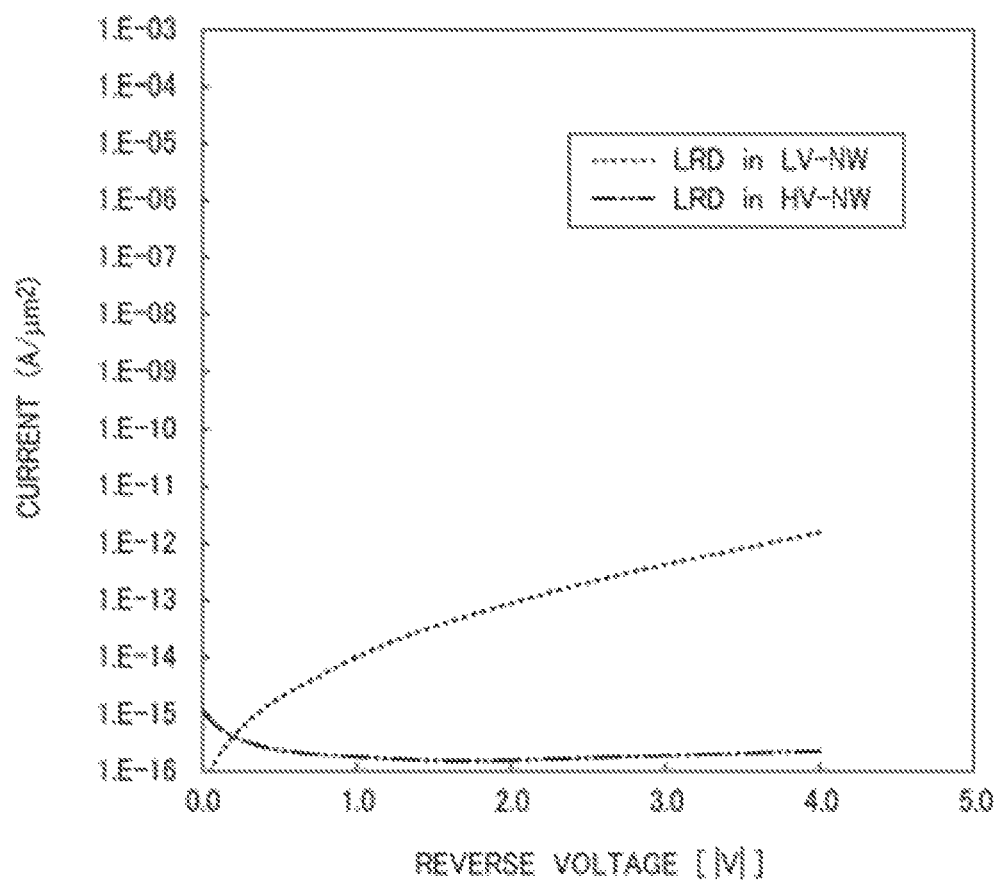
FIG. 39 is a graph (part 2) illustrating reverse I-V characteristics of the PN junction diode.

FIG. 36 is a schematic cross sectional view illustrating a configuration of the semiconductor device of this embodiment. FIG. 37 to FIG. 39 are graphs illustrating I-V characteristics of the PN junction diodes and the Schottky barrier diodes. FIG. 40 to FIG. 50 are cross sectional process diagrams illustrating the method of manufacturing the semiconductor device of this embodiment.

First, the configuration of the semiconductor device of this embodiment will be explained referring to FIG. 36.

While, in the first embodiment, the LRD 114 was formed in the P-well 36, and the SBD 116 was formed in the N-well 66, combination of the wells and the LRD 114 and the SBD 116 formed therein are not limited thereto, provided that desired diode characteristics may be obtained.

The semiconductor device of this embodiment is configured similarly to the semiconductor device of the first embodiment, except that, as illustrated in FIG. 36, the LRD 114 and the SBD 116 are respectively formed in the wells having conductivity types reverse so those in the first embodiment.

More specifically, the N-well 42 is formed in the LRD region 28. The N-well 42 is formed at the same time with the N-well 42 is the DDC-PMOS transistor region 22.

In the N-well 42 in the LRD region 28, an active region (left in the drawing) which serves as an electrode lead-out portion from the cathode region, and an active region (right in the drawing) which serves as an electrode lead-out portion from the anode region are demarcated by the element isolation insulating film 56. In the active region which serves as an electrode lead-out portion from, she cathode region, the N-type impurity layer 90 is formed as a contact layer to the N-well 42. In the active region which serves as an electrode lead-out portion from the anode region, the P-type impurity layer 94 is formed as an anode region.

The P-type impurity layer 94 is formed at the same time with the high-concentration portions of the P-type source/drain regions 98 of the DDC-PMOS transistor 108, and of the P-type source/drain regions 102 of the high-voltage PMOS transistor 112. Meanwhile, the N-type impurity layer 90 is formed at the same time with the high-concentration, portions of the N-type source/drain, regions 96 of the DDC-NMOS transistor 106, and of true N-type source/drain regions 94 of the high-voltage NMOS transistor 110.

Over the N-type impurity layer 90 and the P-type impurity layer 94, the metal silicide film 104 is formed.

As a consequence, in the LRD region 28, line LRD 114 configured by a PN junction formed between, the P-type impurity layer 94 and the N-well 42 is formed.

In the SBD region 30, formed are the P-well 60, and the buried N-well 34 provided below the bottom of the P-well 60. In the circumference of the P-well 60, the N-well 66 is formed. The P-well 60 is thus configured as a double well surrounded by the buried N-well 34 and the N-well 66. The P-well 60 is formed at the same time with the P-well 60 an the high-voltage NMOS transistor region 24. Accordingly, the P-well 60 has in the surficial portion thereof the P-type impurity layer 62, like the P-well 60 of the high-voltage NMOS transistor.

In the P-well 60 in the SBD region 30, an active region (right in the drawing) which serves as an electrode lead-out portion from the cathode region, and an active region (left in the drawing) which serves as an electrode lead-out portion from the anode region are demarcated by the element isolation insulating film 56. Around, the surficial portion of the active region which serves as the electrode lead-out portion of the cathode region, the N-type impurity layer 90 is formed as a guard ring. In the surficial portion of the active region which serves as an electrode lead-out portion from the anode region, the P-type impurity layer 34 is formed as a contact layer to the P-well 60.

The P-type impurity layer 94 is formed at the same time with the high-concentration portions of the P-type source/drain regions 98 of the DDC-PMOS transistor 108, and of the P-type source/drain regions 102 of the high-voltage PMOS transistor 112. Meanwhile, the N-type impurity layer 90 is formed at the same time with the high-concentration portions of the N-type source/drain regions 96 of the DDC-NMOS transistor 106, and of the N-type source/drain regions 94 of the high-voltage NMOS transistor 110.

Over the P-type impurity layer 94 and over the P-type impurity layer 62, the metal silicide film 104 is formed.

As a consequence, in the SBD region 30, the SBD 116 configured by a Schottky junction formed between the P-type impurity layer 62 and the metal silicide film 104 is formed.

Note that when the LRD 114 and the SBD 116 are formed in the P-well, the P-well is configured as a double well surrounded by an N-well, like the P-well 36 having formed therein the LRD 114 in the first embodiment, or like the P-well 60 having formed therein the SBD 116 in this embodiment. The individual diodes are respectively formed in independent wells. The same will apply also to other embodiments.

Next, characteristics of the LRD 114 and the SBD 116 in the semiconductor device of this embodiment will be explained, referring to FIG. 37 to FIG. 39.

FIG. 37 is a graph illustrating measured forward I-V characteristics of the SBD 116 and N⁺-P junction diode formed in the P-wells 36, 60.

In the drawing, the solid line represents the SBD (SBD in HV-PW) formed in the P-well 60 of the high-voltage transistor. The chain single-dashed line represents the SBD (SBD in LV-PW) formed in the P-well 36 of the low-voltage transistor. The dotted line represents an N⁺-P junction diode (N⁺-P in LV-PW) formed in the P-well 36 of the low-voltage transistor. The chain double-dashed line represents an N⁺-P junction diode (N⁺-P in HV-PW) formed in the P-well 36 of the high-voltage transistor. Current and voltage values are given in absolute values.

As may be understood from the forward characteristics illustrated in FIG. 37, the SBD turns ON with a lower voltage than the P⁺-N junction diode does, irrespective of in which P-well the SBD was formed, so that the SBD can release electric charge induced by noise or the like, before the forward current induced by noise or the like flows through the P⁺-N junction diode to cause latch-up, and thereby the latch-up is avoidable.

FIG. 38 comparatively illustrates reverse characteristics of the SBD 116. In the drawing, the solid line represents the SBD (SBD in HV-PW) formed in the P-well 60 of the high-voltage transistor. The chain single-dashed line represents the SBD (SBD in LV-PW) formed in the P-well 36 of the low-voltage transistor. Current and voltage values are given in absolute values.

As seen in FIG. 38, the reverse leakage current is much larger in SBD formed in the P-well 36 of the low-voltage transistor, than in the SBD formed in the P-well 66 of the high-voltage transistor.

It was verified from these results that, by forming the SBD 116 in the P-well 60 of the high-voltage transistor, electrical characteristics suitable for the Schottky barrier diode for preventing latch-up, exemplified by that it can turn ON with a low forward voltage and causes only a small reverse current, may be obtained.

FIG. 39 comparatively illustrates reverse characteristics of the LRD 114. In the drawing, the dotted line represents the LRD (LRD in HV-NW) formed in the N-well 66 of the high-voltage transistor. The chain double-dashed line represents the LRD (LRD in LV-PP) formed in the N-well 42 of the low-voltage transistor. Current and voltage values are given in absolute values.

As may be understood from FIG. 39, the LRD 114 when formed in the N-well 66 of the high-voltage transistor shows only a very small voltage dependence of the reverse current, so that current does not flow therethrough even applied with a very high voltage, indicating that the LRD 114 cannot discharge a high surge voltage applied thereto. On the other hand, the LRD 114 when formed in the N-well 42 of the low-voltage transistor shows a large voltage dependence of the reverse current, and a low breakdown voltage, indicating that the LRD 114 can rapidly discharge a high surge voltage even if applied thereto.

It was verified from these results that, by forming the LRD 114 in the N-well 42, electrical characteristics suitable for the PN junction diode used as a surge protection element, exemplified by a low voltage at which forward current rises up, may be obtained.

As is clear from comparison between FIG. 14 and FIG. 38, at least for the case where the metal electrode was composed of CoSi, the SBD 116 showed better characteristics, exemplified by smaller leakage current, when formed in the N-well, rather than formed in the P-well.

Next, a method of manufacturing the semiconductor device of this embodiment will be explained, referring to FIG. 40 to FIG. 50. Note that, in FIG. 40 to FIG. 50, the LRD 114 is represented only by the PN junction portion (the right active region in FIG. 36) out from the LRD region 28. The SBD 116 is represented only by a Schottky junction portion (the right active region in FIG. 36) out from the SBD region 30.

First, similarly to the method of manufacturing the semiconductor device according to the first embodiment illustrated in FIG. 16 and FIG. 17, the trench 16 which serves as a mask alignment mark, and the silicon oxide film 13 are formed in, and over, the P-type silicon substrate 10.

Next, a photoresist film 31 is formed by photolithography, so as to expose the DDC-NMOS transistor region 20 and the SBD region 30, and to cover the residual region. The trench 10 is used as a mask alignment mark in the photolithography.

Figure 40:
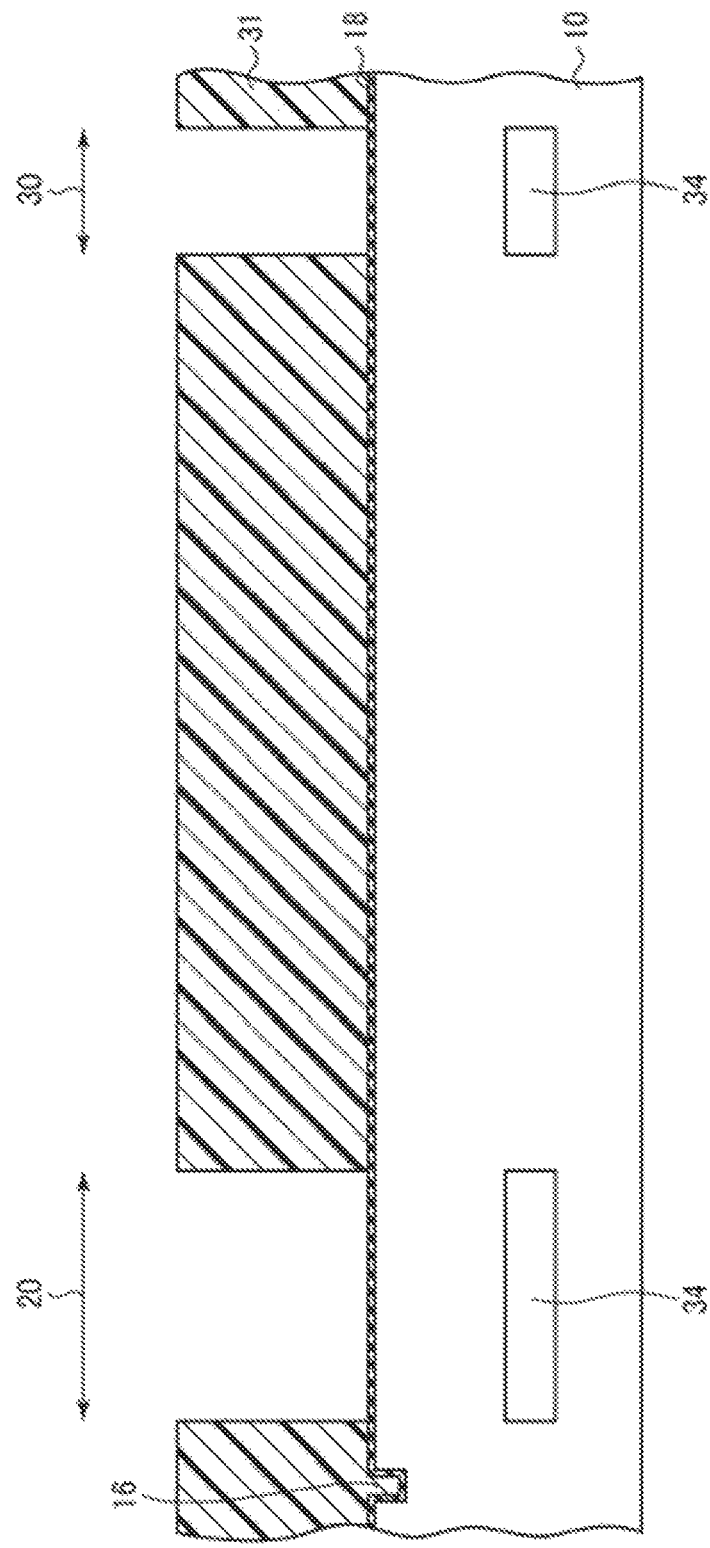
FIG. 40 to FIG. 50 are cross sectional process diagrams (part 1 to part 11) illustrating a method of manufacturing the semiconductor device of the second embodiment.

Next, ion implantation is conducted using the photoresist film 31 as a mask, to thereby form the buried N-well 34 in the DDC-NMOS transistor region 20 and the SBD region 30 (FIG. 40).

Next, the photoresist film 31 is removed typically by ashing.

Next, a photoresist film 32 is formed by photolithography, so as to expose the DDC-NMOS transistor region 20, and to cover the residual region. The trench 16 is used as a mask alignment mark: in the photolithography.

Figure 41:
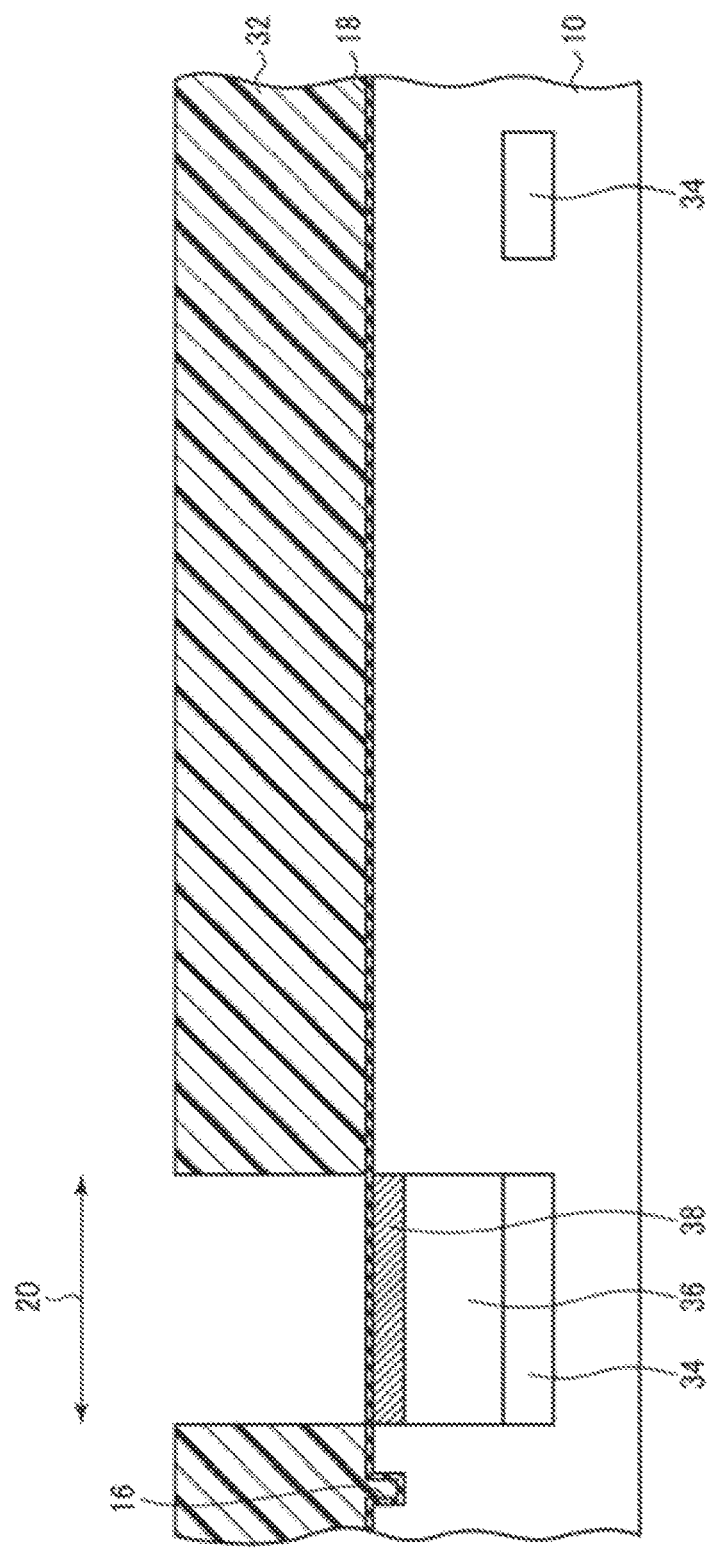

Next, ion implantation is conducted using the photoresist film 32 as a mask, to thereby form the P-well 36 and the P-type impurity layer 38 in the DDC-NMOS transistor region 20 (FIG. 41).

Next, the photoresist film 32 is removed typically by ashing.

Next, a photoresist film 40 is formed by photolithography, so as to expose the DDC-PMOS transistor region 22, the LRD region 28, and a region surrounding the P-well 36 in the DDC-NMOS transistor region 20, and to cover the residual region. The trench 16 is used as a mask alignment mark in the photolithography.

Figure 42:
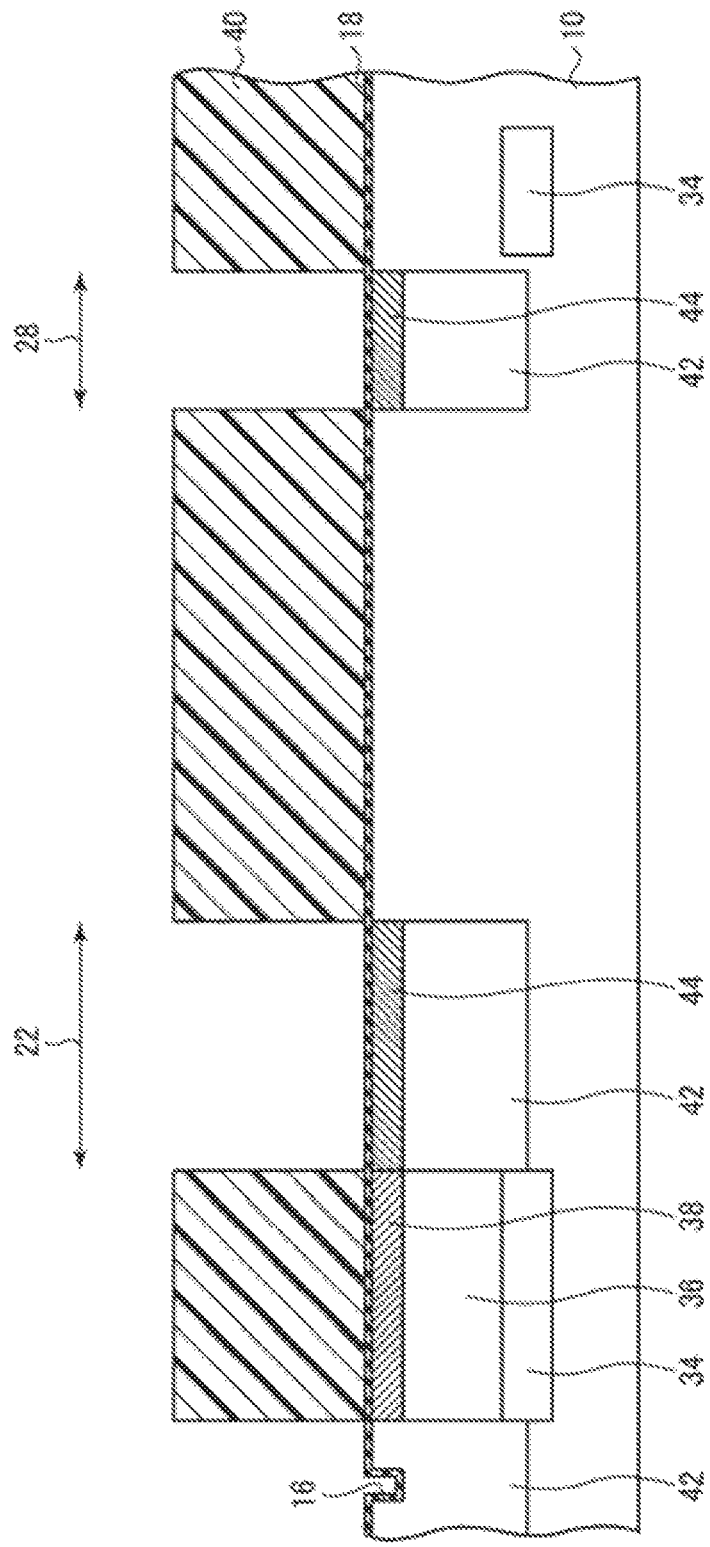

Next, ion implantation is conducted using the photoresist film 40 as a mask, to thereby form the N-well 42 and the N-type impurity layer 44, in the DDC-PMOS transistor region 22, the LRD region 28, and the region surrounding the P-well 36 (FIG. 42).

Now, the P-well 36 is thus configured as a double well surrounded by the buried N-well 42 and the buried N-well 34. The N-well surrounding the P-well 36 may alternatively be fine N-well 65 described later.

Next, the photoresist film 40 is removed typically by ashing.

Next, the product is annealed in an inert atmosphere, so as to restore damaged portions induced in the silicon substrate 10 by ion implantation, and to activate the implanted impurities. The annealing is conducted typically in a nitrogen atmosphere at 600° C. for 150 seconds.

Next, the silicon oxide film 18 is removed typically by wet etching using an aqueous hydrofluoric acid solution.

Figure 43:
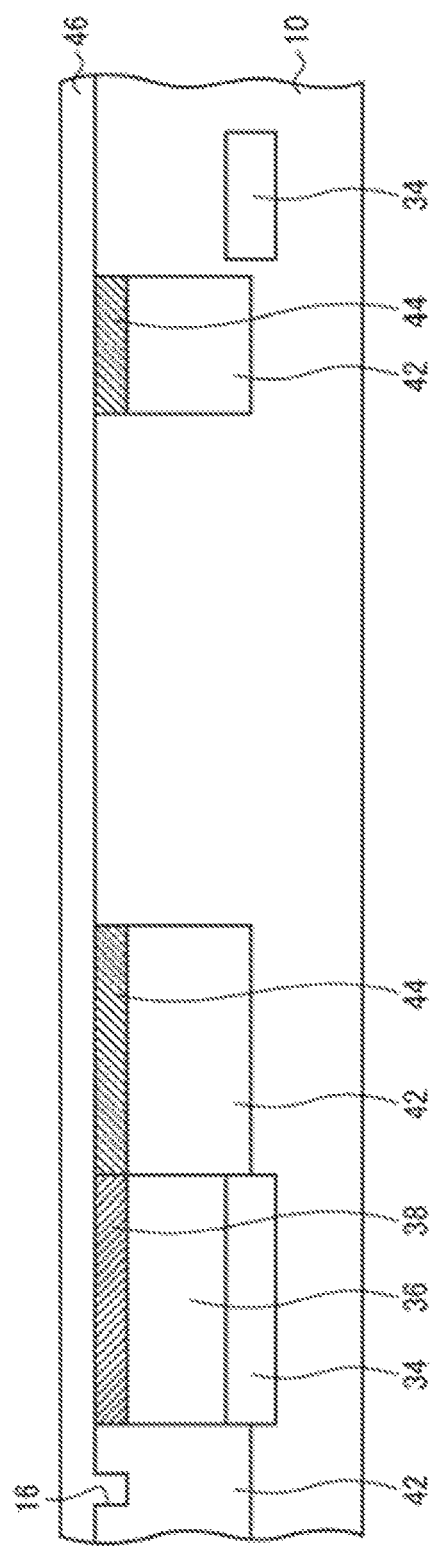

Next, over the surface of the silicon substrate 10, the non-doped epitaxially-grown silicon layer 46 of, for example, 25 nm thick is formed typically by CVD (FIG. 43).

Figure 44:
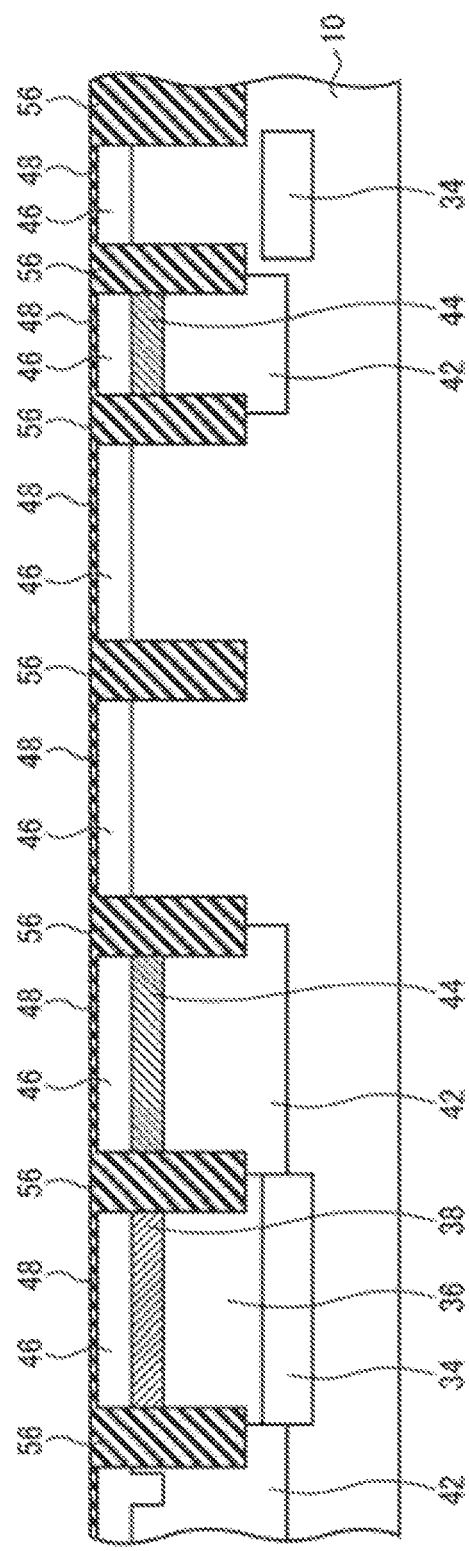

Next, similarly to the method of manufacturing the semiconductor device according to the first embodiment illustrated in FIG. 21 to FIG. 23, the element isolation insulating film 56 which demarcates the active region is formed in the silicon substrate 10 and the epitaxially-grown silicon layer 46 (FIG. 44).

Next, a photoresist film 58 is formed by photolithography, so as to expose the high-voltage NMOS transistor region 24 and the SBD region 30, and to cover the residual region.

Figure 45:
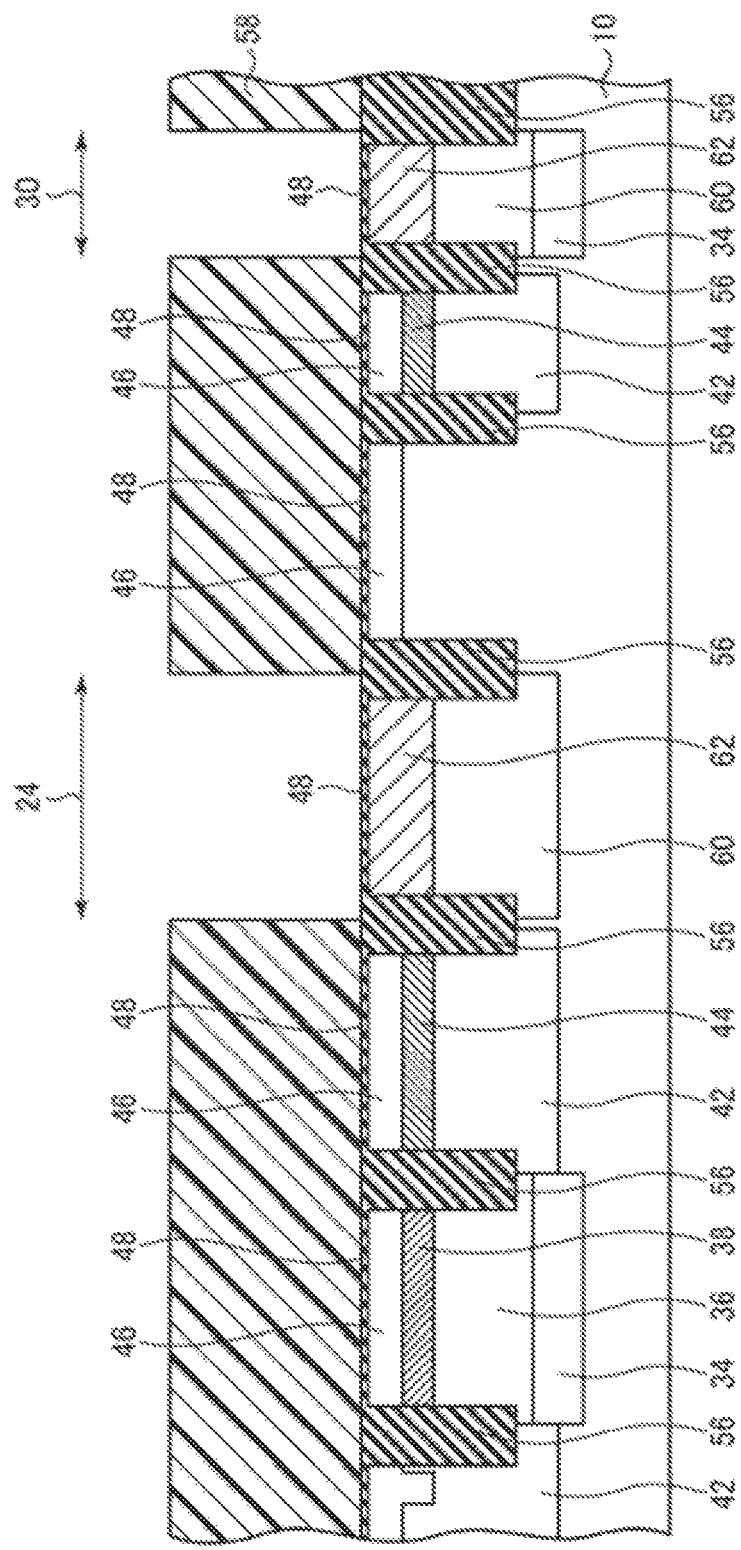

Next, ion implantation is conducted using the photoresist film 58 as a mask, to thereby form the P-well 60 and the P-type impurity layer 62 both in the high-voltage NMOS transistor region 24 and the SBD region 30 (FIG. 45).

Next, the photoresist film 38 is removed typically by ashing.

Next, a photoresist film 64 is formed by photolithography, so as to expose the high-voltage PMOS transistor region 26, and a region surrounding the P-well 60 of the SBD region 30.

Figure 46:
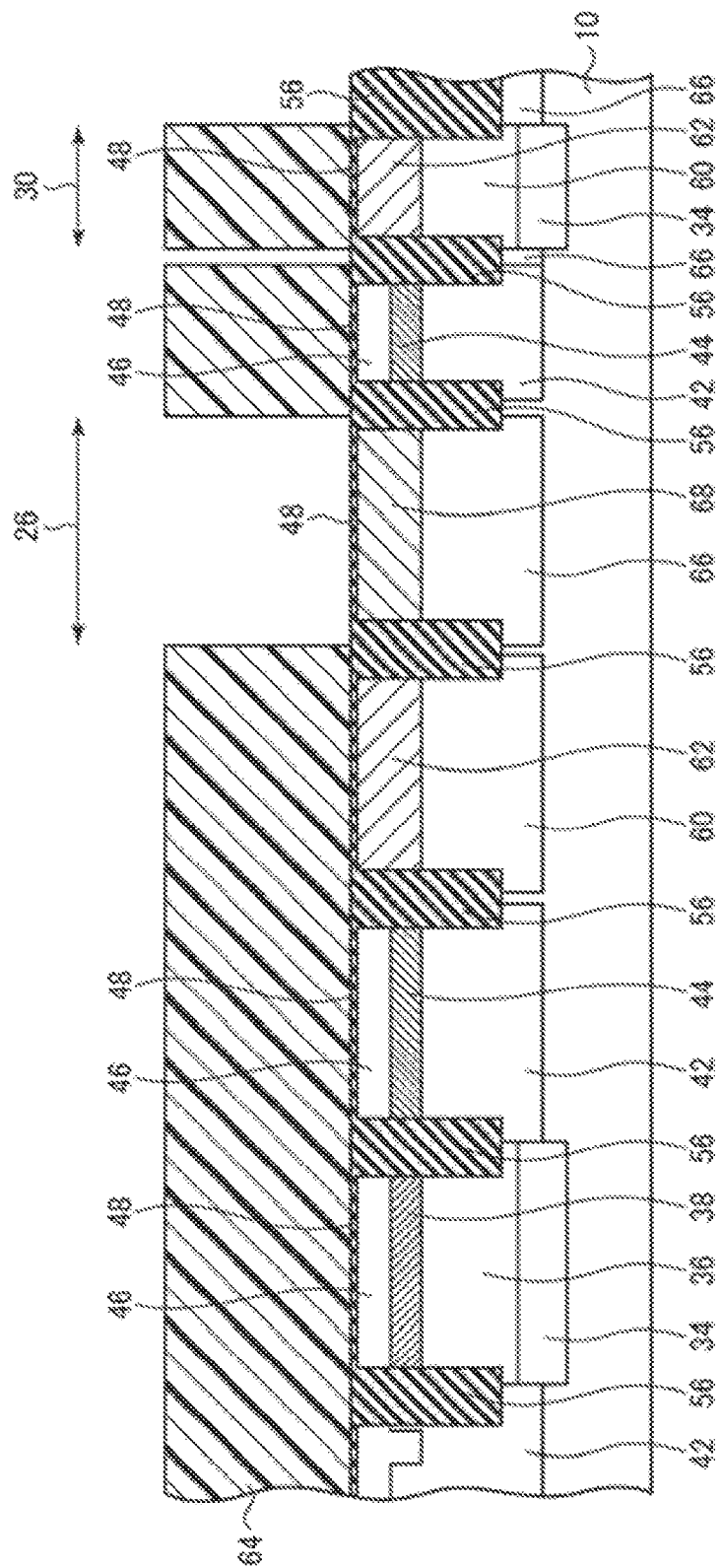

Next, ion implantation is conducted using the photoresist film 64 as a mask, to thereby form the N-well 66 and the N-type impurity layer 68 in the high-voltage PMOS transistor region 26 and around the P-well 60 in the SBD region 30 (FIG. 46).

The P-well 60 is now configured as a double well surrounded by the N-well 66 and the buried N-well 34. The N-well which surrounds the P-well 60 may alternatively be the N-well 42 described previously.

Figure 47:
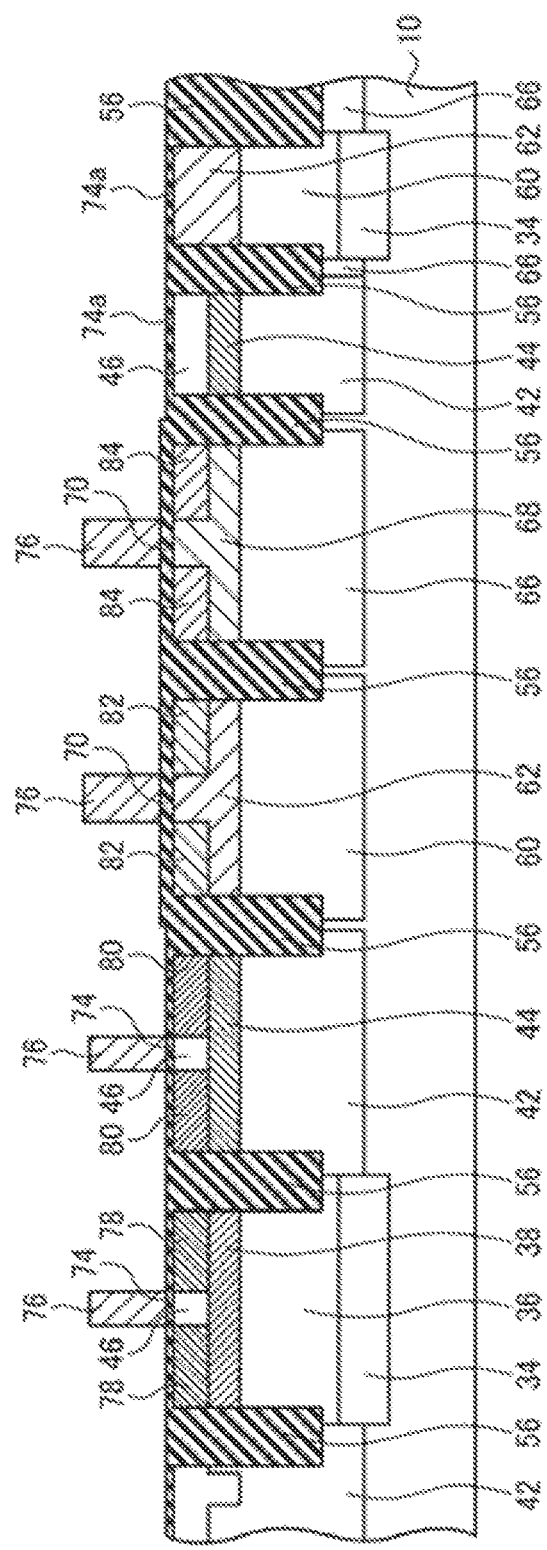

Next, similarly to the method of manufacturing the semiconductor device according to the first embodiment illustrated in FIG. 26 to FIG. 30, the gate insulating films 70, 74, the gate electrodes 76, the N-type impurity layers 78, 82 and the P-type impurity layers 80, 84 are formed (FIG. 47).

Next, a silicon oxide film of, for example, 74 nm thick is formed typically by reduced-pressure CVD. The growth, temperature is set to 520° C. for example.

Next, the silicon oxide film, is anisotropically etched, to thereby form the sidewall insulating films 86 composed of a silicon oxide film, on the sidewall portions of the gate electrodes 76.

Next, a photoresist film 88 is formed by photolithography, so as to expose the DDC-NMOS transistor region 20, the high-voltage NMOS transistor region 24, the cathode region of the LRD 114, and the portion around the SBD region 30, and to cover the residual region. Now, the cathode region of the LRD 114 corresponds to the left, active region in FIG. 36.

Figure 48:
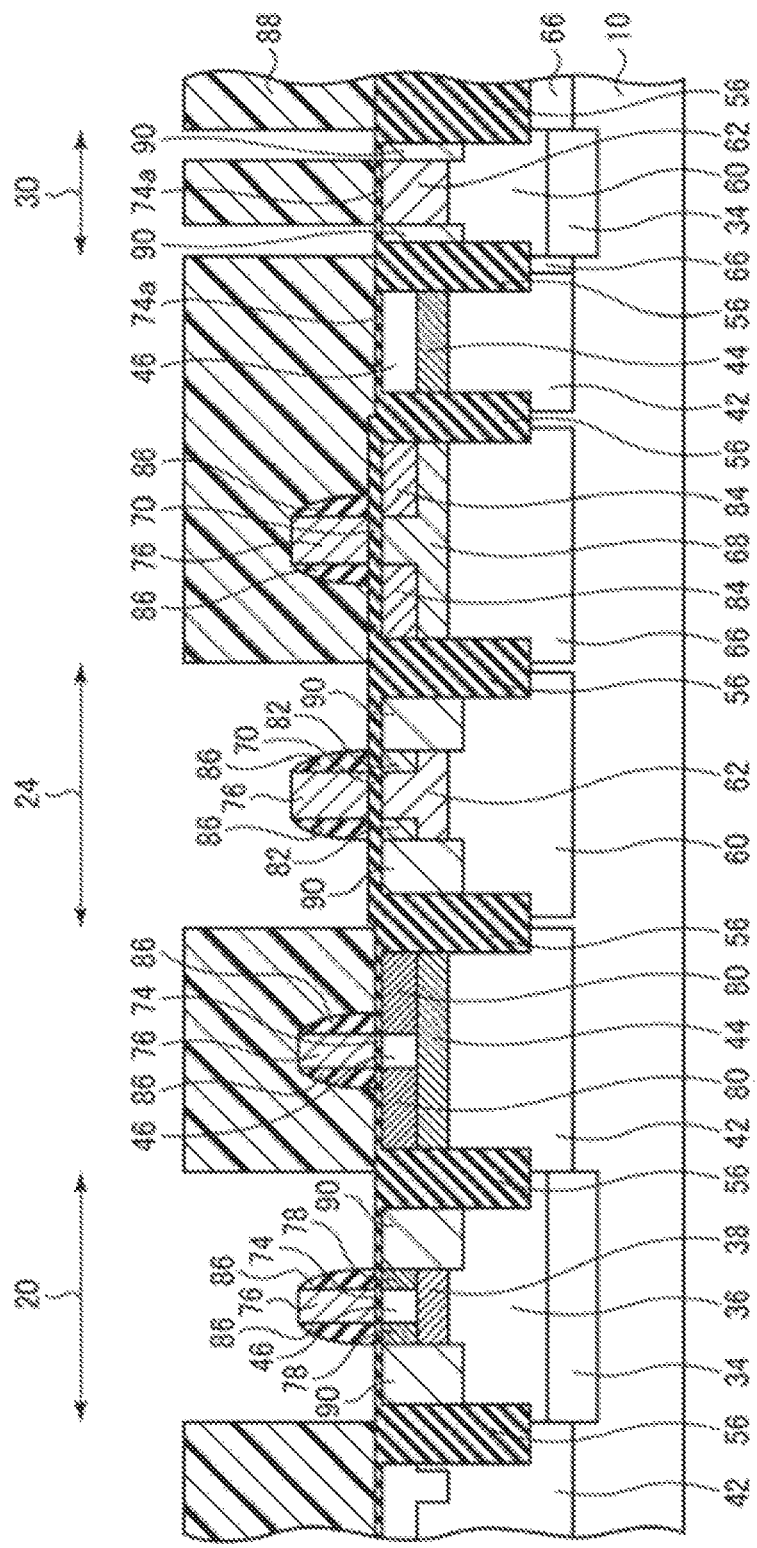

Next, ion implantation is conducted using the photoresist film 88, the gate electrode 76 and the sidewall insulating films 36 as a mask. The N-type impurity layers 90 are thus formed in the DDC-NMOS transistor region 20, the high-voltage NMOS transistor region 24, the cathode region of the LRD 114, and the SBD region (FIG. 48).

The N-type impurity layers 90 in the DDC-NMOS transistor region 20 and in the high-voltage NMOS transistor region 24 serve as the high concentration portions of the source/drain regions. The N-type impurity layer 30 in the LRD region 23 serves as the cathode region of LRD. The N-type impurity layer 90 in the SBD region 30 serves as the guard ring of SBD (see FIG. 36).

Next, the photoresist film 88 is removed typically by ashing.

Next, a photoresist film 92 is formed by photolithography, so as to expose the DDC-PMOS transistor region 22, the high-voltage PMOS transistor region 26, the anode region of the LRD 114, and the well contact region of the SBD 116, and to cover the residual region. The anode region of the LRD 114 corresponds to the right active region in FIG. 36. The well contact region of the SBD 116 corresponds to the left active region in FIG. 36.

Figure 49:
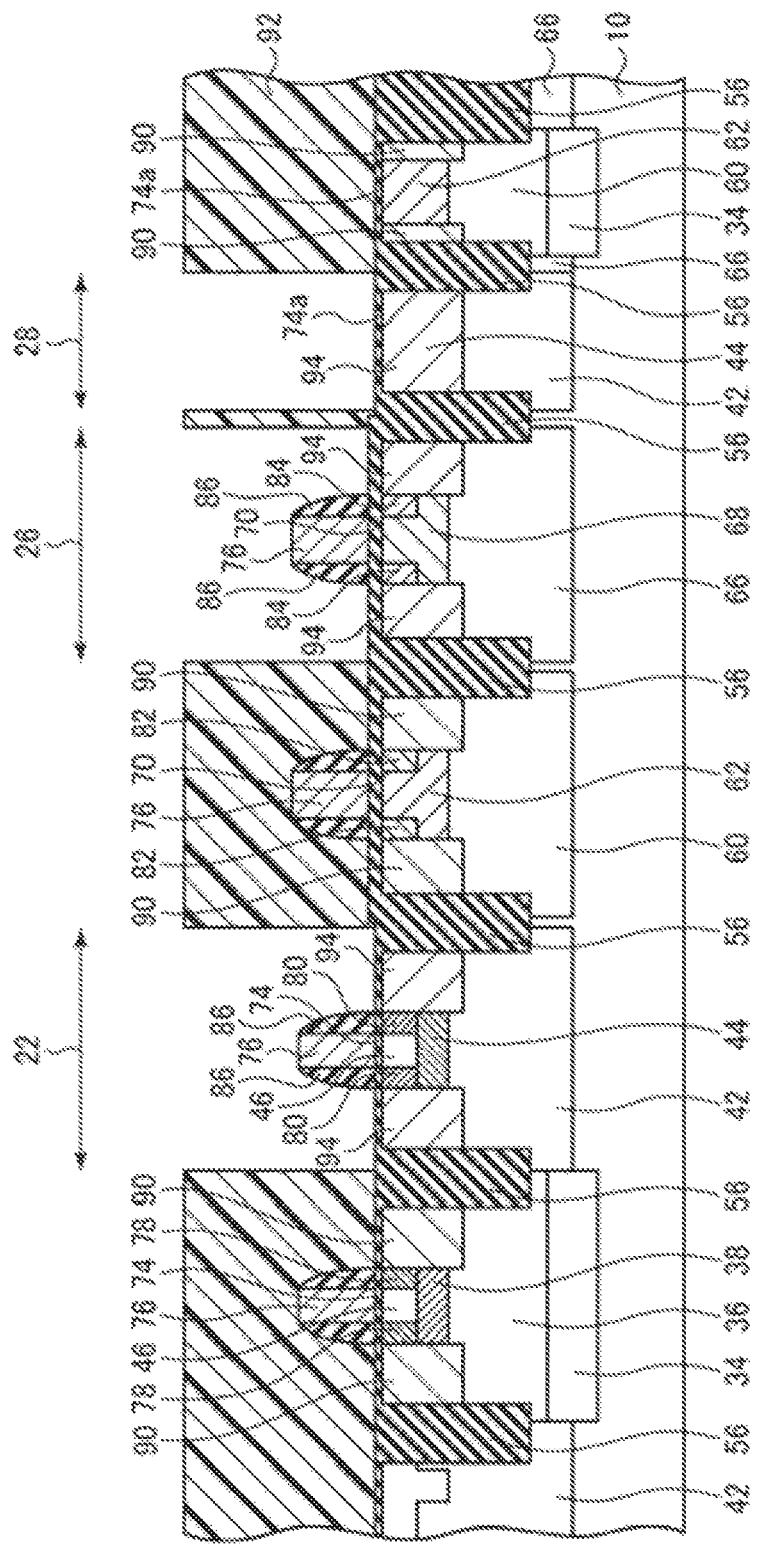

Next, ion implantation is conducted using the photoresist film 92, the gate electrodes 76 and the sidewall insulating films 86 as a mask. The P-type impurity layers 94 are thus formed in the DDC-PMOS transistor region 22, the high-voltage PMOS transistor region 26, the anode region of the LRD 114, and the well contact region of the SBD 116 (FIG. 49).

The P-type impurity layers 94 in the DDC-PMOS transistor region 22 and the high-voltage PMOS transistor region 26 serve as the high concentration portions of the source/drain regions. The P-type impurity layer 34 in the LRD region 28 serves as the anode region of LRD. The P-type impurity layer 94 in the SBD region 30 serves as the well contact, layer of SBD (see FIG. 36).

Next, the photoresist film 92 is removed typically by ashing.

Next, the product is annealed within a short time in an inert atmosphere typically at 1025° C. for 0 seconds, to thereby activate the implanted impurities, and to allow them to diffuse in the gate electrodes 76.

By the annealing, in the DDC-NMOS transistor region 20, the N-type source/drain regions 96 composed of the N-type impurity layers 78, 90 are formed. In the DDC-PMOS transistor region 22, the P-type source/drain regions 98 composed of the P-type impurity layers 80, 94 are formed. In the high-voltage NMOS transistor region 24, the N-type source/drain regions 100 composed of the N-type impurity layers 82, 90 are formed. In the high-voltage PMOS transistor region 26, the P-type source/drain regions 102 composed, of the P-type impurity layers 84, 04 are formed.

Figure 50:
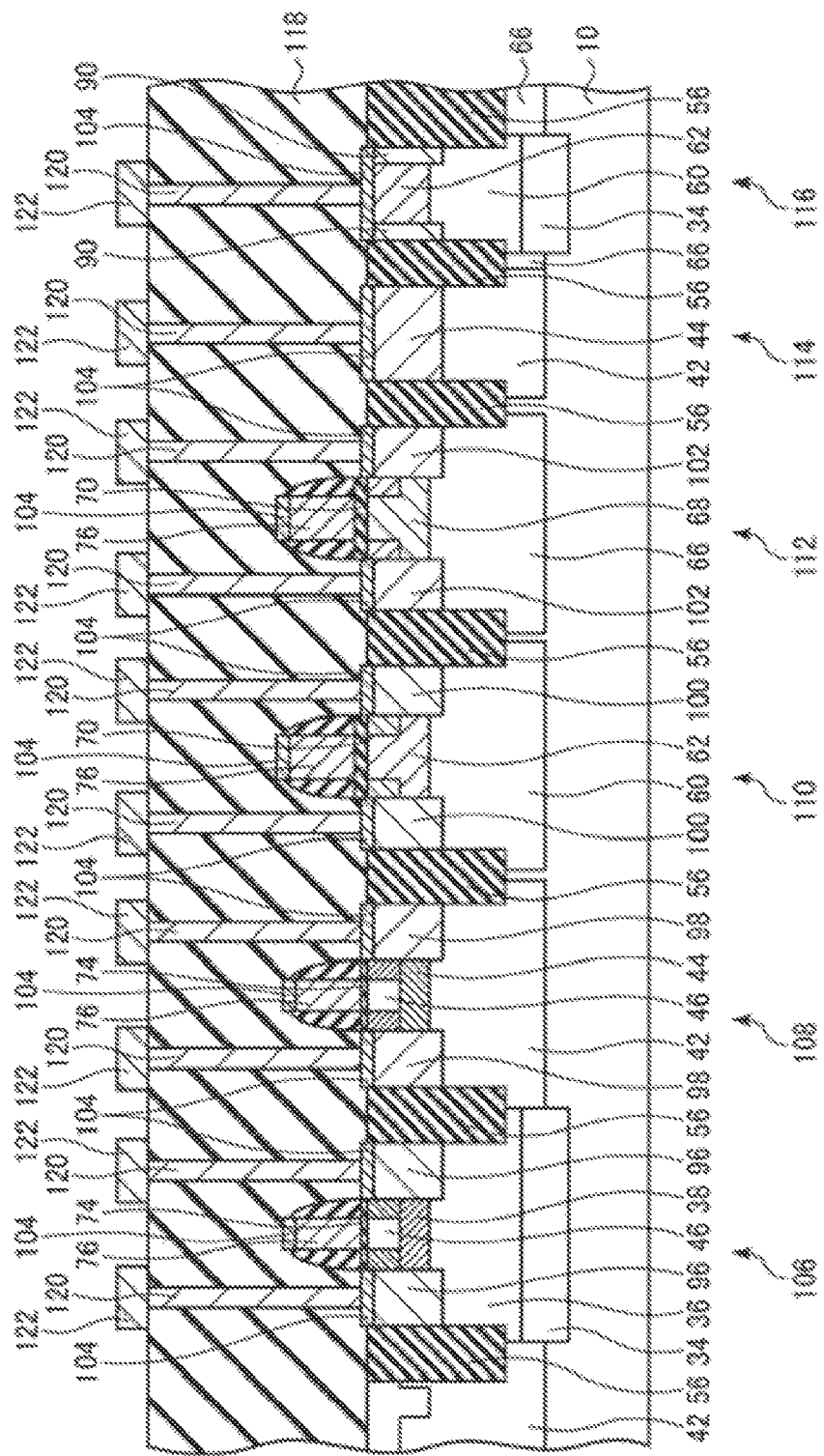

Next, similarly to the method of manufacturing the semiconductor device according to the first embodiment illustrated in FIG. 34 and FIG. 35, the metal silicide film 104, the inter layer insulating film 118, the contact plugs 120, the interconnects 122 and so forth are formed (FIG. 50).

After some necessary back end process, the semiconductor device of this embodiment, is completed.

As described above, according to this embodiment, the Schottky barrier diode for preventing latch-up is incorporated in a semiconductor chip, so that the latch-up is effectively avoidable even if the DDC transistor is back-biased. The semiconductor device of this embodiment is therefore improved in the reliability.

Third Embodiment

A semiconductor device and a method of manufacturing the same according to a third embodiment will be explained, referring to FIG. 51. Note that ail constituents, same as those of the semiconductor devices and the methods of manufacturing the same in the first and second embodiments illustrated in FIG. 1 to FIG. 50, are given same reference numerals or symbols, in order to avoid, the explanation or to skip the detail.

Figure 51:
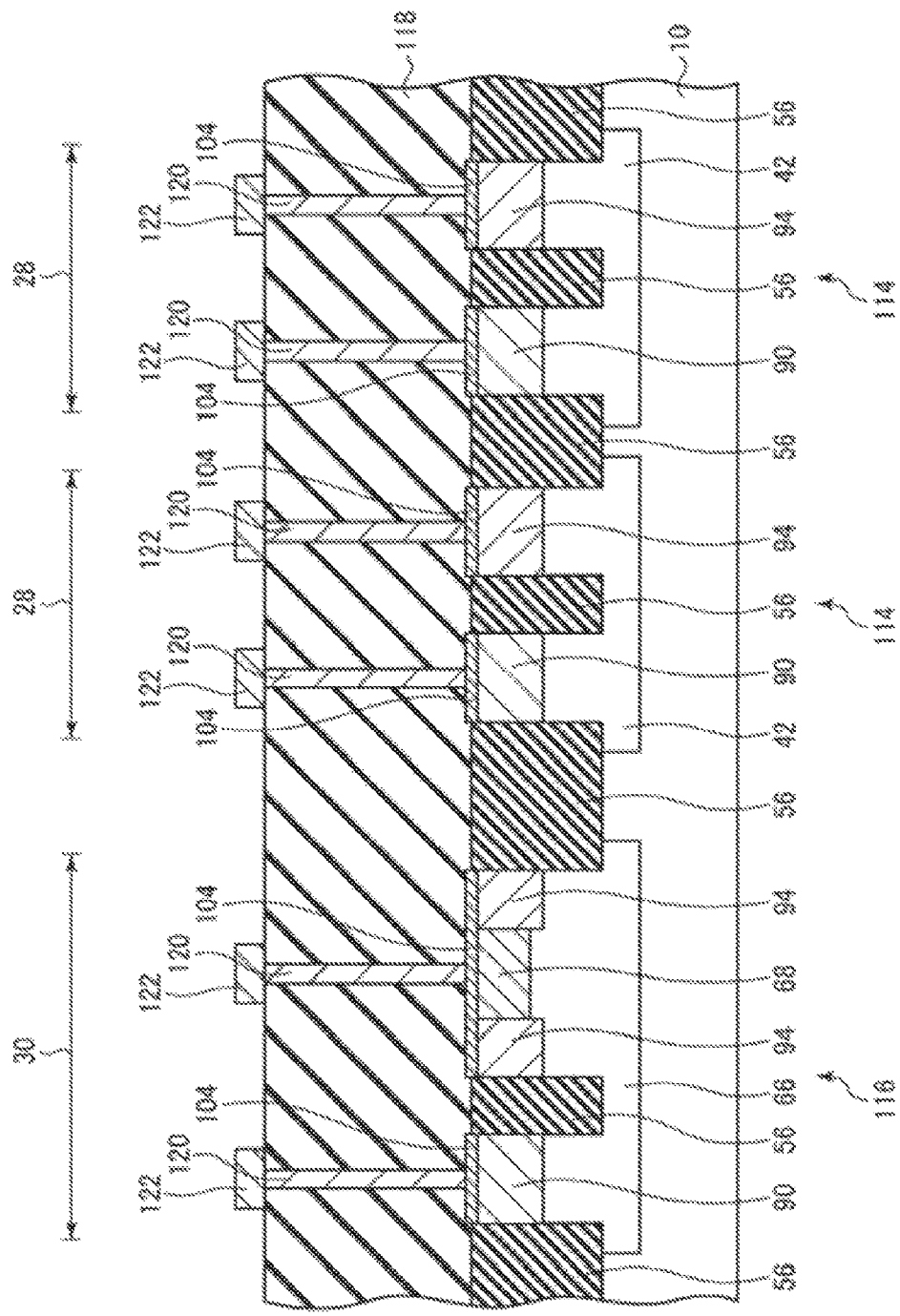
FIG. 51 is a schematic cross sectional view illustrating a configuration of a semiconductor device according to a third embodiment.

FIG. 51 is a schematic cross sectional view illustrating a configuration of the semiconductor device of this embodiment.

The semiconductor device of this embodiment is configured, similarly to the semiconductor device of the first embodiment, except that, as illustrated in FIG. 51, the LRD 114 is formed in the well having a conductivity type reverse to that in the first embodiment.

More specifically, in the LRD region 28, the N-well 42 is formed. The N-well 42 is formed at the same time with the N-well 42 in the DDC-PMOS transistor region 22.

In the N-well 42 in the LED region 28, the active region (left, in the drawing) which serves as an electrode lead-out portion from the cathode region, and the active region (right in the drawing) which serves as an electrode lead-out portion from the anode region are demarcated by the element isolation insulating film 56. In the active region which serves as the electrode lead-out portion from the cathode region, the N-type impurity layer 90 is formed as a contact layer to the N-well 42. In the active region which serves as the electrode lead-out portion from the anode region, the P-type impurity layer 94 is formed as the anode region.

Note that the P-type impurity layer 94 is formed at the same time with the high concentration portions of the P-type source/drain regions 98 of the DDC-PMOS transistor 108, and of the P-type source/drain regions 102 of the high-voltage PMOS transistor 112. On the other hand, the N-type impurity layer 90 is formed at the same time with the high concentration portions of the N-type source/drain regions 96 of the DDC-NMOS transistor 106, and of the N-type source/drain regions 94 of the high-voltage NMOS transistor 110.

Over the N-type impurity layer 90 and over the P-type impurity layer 94, the metal silicide film 104 is formed.

In the LRD region 28, the LSD 114 composed of a PN junction between the P-type impurity layer 94 and the N-well 42 is thus formed.

In the SBD region 30, the N-well 66 is formed. The N-well 66 is formed at the same time with the N-well 66 of the high-voltage PMOS transistor. Accordingly, the N-well 66 has the surficial portion thereof the N-type impurity layer 68, like the N-well 66 of the high-voltage PMOS transistor.

In the N-well 66 of the SBD region 30, the active region which serves as the electrode lead-out portion from the anode region (right in the drawing), and the active region (left in the drawing) which serves as an electrode lead-out portion from the cathode region are demarcated by the element isolation insulating film 56. Around the surficial portion of the active region which serves as an electrode lead-out portion from the anode region, the P-type impurity layer 94 is formed as a guard ring. In the surficial portion of the active region which serves as the electrode lead-out portion from the cathode region, the N-type impurity layer 90 is formed as a contact layer to the N-well 66.

The P-type impurity layer 94 is formed at the same time with the high concentration portions of the P-type source/drain regions 98 of the DDC-PMOS transistor 108, and of the P-type source/drain regions 102 of the high-voltage PMOS transistor 112. On the other hand, the N-type impurity layer 90 is formed at the same time with the high concentration portions of the N-type source/drain regions 96 of the DDC-PMOS transistor 106, and of the N-type source/drain regions 94 of the high-voltage NMOS transistor 110.

Over the N-type impurity layer 90 and over the N-type impurity layer 68, the metal silicide film 104 is formed.

As a consequence, in the SBD region 30, the SBD 116 configured by a Schottky junction formed between the N-type impurity layer 68 and the metal silicide film 104 is formed.

As has been explained in the first embodiment, the LRD 114 formed in the N-well 42 has characteristics suitable for the PN junction diode for surge protection. On the other hand, as has been explained in the second embodiment, the SBD 116 formed in the N-well 66 has characteristics suitable for the Schottky diode for avoiding latch-up. Accordingly, also by configuring the protection circuit using the LRD 114 and the SBD 116 of this embodiment, the semiconductor device with high surge resistance and latch-up immunity may be embodied.

Characteristics and a method of manufacturing of the LRD 114 in this embodiment are as explained in the second embodiment. Characteristics and a method of manufacturing of the SBD 116 in this embodiment are as explained in the first embodiment.

As described above, according to this embodiment, the Schottky barrier diode for preventing latch-up is incorporated in a semiconductor chip, so that the latch-up is effectively avoidable even if the rid transistor is back-biased. The semiconductor device of this embodiment is therefore improved in the reliability.

Fourth Embodiment

A semiconductor device and a method of manufacturing the same according to a fourth, embodiment will be explained referring to FIG. 52. Note that all constituents, same as those of the semiconductor devices and the methods of manufacturing the same in the first to third embodiments illustrated in FIG. 1 to FIG. 51, are given same reference numerals or symbols, in order to avoid, the explanation or to skip the detail.

FIG. 52 is a schematic cross sectional view illustrating a configuration of the semiconductor device of this embodiment.

The semiconductor device of this embodiment is configured similarly to the semiconductor device of the first embodiment, except, that, as illustrated in FIG. 52, the SBD 116 is formed in the well having a conductivity type reverse to that in the first embodiment.

More specifically, in the LRD region 28, formed are the P-well 36, and the buried N-well 34 provided, below the bottom of the P-well 36. Around the P-well 36, the N-well 42 is formed. In this way, the P-well 36 is now configured as a double well surrounded by the buried N-well 34 and the N-well 42. The P-well 36 is formed at the same time with the P-well 36 in the DDC-NMOS transistor region 20.

In the P-well 36 in the LRD region 23, an active region (left in the drawing) which serves as an electrode lead-out portion from, the anode region, and an active region (right in the drawing) which serves as an electrode lead-out portion from the cathode region are demarcated by the element isolation insulating film 56. In the active region which serves as the electrode lead-out portion from the anode region, the P-type impurity layer 94 is formed as a contact layer to the P-well 36. In the active region which serves as the electrode lead-out portion from the cathode region, the N-type impurity layer 90 is formed as the cathode region.

The P-type impurity layer 94 is formed at the same time with the high concentration portions of the P-type source/drain regions 98 of the DDC-PMOS transistor 108, and of the P-type source/drain regions 102 of the high-voltage PMOS transistor 112. On the other hand, the N-type impurity layer 90 is formed at the same time with the high concentration portions of the N-type source/drain regions 96 of the DDC-NMOS transistor 106, and of the N-type source/drain regions 94 of the high-voltage NMOS transistor 110.

Over the N-type impurity layer 90 and over the P-type impurity layer 94, the metal silicide film 104 is formed.

As a consequence, in the LRD region 28, fine LRD 114 configured by a PN junction, formed be tee en the P-well 36 and the N-type impurity layer 90 is formed.

In the SBD region 30, formed are the P-well 60, and the buried N-well 34 provided below the bottom of the P-well 60. Around the P-well 60, the N-well 66 is formed. In this way, the P-well 60 is now configured as a double well surrounded by the buried N-well 34 and the N-well 66. The P-well 60 is formed at the same time with the P-well 60 in the high-voltage NMOS transistor region 24. Accordingly, the P-well 60 has in the surficial portion thereof the P-type impurity layer 62, like the P-well 60 of the high-voltage NMOS transistor.

In the P-well 60 in the SBD region 30, an active region (right in the drawing) which serves as an electrode lead-out portion from the cathode region, and an active region (left in the drawing) which serves as an electrode lead-out portion from the anode region are demarcated by the element isolation insulating film 56. Around the surficial portion of the active region which serves as the electrode lead-out portion from the cathode region, the N-type impurity layer 30 is formed as a guard ring. In the surficial portion of the active region which serves as an electrode lead-out portion from the anode region, the P-type impurity layer 94 is formed as a contact layer to the P-well 60.

The P-type impurity layer 94 is formed at the same time with the high concentration portions of the P-type source/drain regions 98 of the DDC-PMOS transistor 108, and of the P-type source/drain regions 102 of the high-voltage PMOS transistor 112. On the other hand, the N-type impurity layer 90 is formed as the same time with the high concentration portions of the N-type source/drain regions 96 of the DDC-NMOS transistor 106, and of the N-type source/drain regions 94 of the high-voltage NMOS transistor 110.

Over the P-type impurity layer 94 and ever the P-type impurity layer 62, the metal silicide film 104 is formed.

As a consequence, in flue SBD region 30, the SBD 116 configured by a Schottky junction formed between the P-type impurity layer 62 and the metal silicide film 104 is formed.

As has beers explained in the second embodiment, the LRD 114 formed in the P-well 36 has characteristics suitable for the PN junction diode for surge protection. On the other hand, as has been explained in the first embodiment, the SBD 116 formed in the P-well 60 has characteristics suitable for the Schottky diode for avoiding latch-up. Accordingly, also by configuring the protection circuit using the LRD 114 and the SBD 115 of this embodiment, the semiconductor device with high surge resistance and latch-up immunity may be embodied.

Characteristics and a method of manufacturing of the LRD 114 of this embodiment are as explained in the first embodiment. Characteristics and a method of manufacturing of the SBD 116 of this embodiment are as explained in the second embodiment.

As described above, according to this embodiment, the Schottky barrier diode for preventing latch-up is incorporated in a semiconductor chip, so that the latch-up is effectively avoidable even if the DDC transistor is back-biased. The semiconductor device of this embodiment is therefore improved in the reliability.

Modified Embodiment

The present invention may be embodied in various ways, without limited by the embodiments above.

For example, the guard ring provided to the Schottky junction of the Schottky barrier diodes described in the first, to fourth embodiments explained above, is not always necessary.

The PN junction diode for surge protection, formed according to the embodiments above in the well of the low-voltage transistor, may alternatively be formed in the well of the high-voltage transistor. Depending on the voltage resistance relative to that of an element to be protected, characteristics of a PN junction diode formed in the well of the high-voltage transistor may suffice in some cases. In these cases, both of the Schottky barrier diode and the PN junction diode may be formed in the well of the high-voltage transistor.

While the protection circuit, exemplified in the embodiments described above, had both of the Schottky barrier diode for avoiding latch-up and the PN junction diode for surge protection, it is not always necessary for the protection circuit to have both of them, and may have only either one of them.

All of configurations, constitutive materials, conditions for manufacturing and so forth of the semiconductor devices described in the embodiments above are merely illustrative, and may be modified or altered in appropriate ways in view of common general technical knowledge of those skilled in the art.

According to the semiconductor device disclosed herein, the semiconductor device having a transistor with the DDC structure may be improved in the latch-up immunity. As a consequence, the reliability of the semiconductor device may be improved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority a no inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
    a first well provided in a semiconductor substrate;
    a second well provided in the semiconductor substrate, so as to be isolated from the first well;
    a Schottky barrier diode formed in the first well; and
    a first PN junction diode formed in the second well, with an impurity concentration of the PN junction thereof set higher than an impurity concentration of the Schottky junction of the Schottky barrier diode, acid being connected antiparallel with the Schottky barrier diode.

2. The semiconductor device of claim 1, further comprising:
    a first signal line connected to one terminal of an antiparallel set of the Schottky barrier diode and the first PN junction diode, and through which a source voltage or a reference voltage is applied; and
    a second signal line connected to the other terminal, of the antiparallel set, and through which a voltage different from the source voltage and from the reference voltage is applied.

3. The semiconductor device of claim 2, further comprising:
    a third well provided in the semiconductor substrate, so as to be isolated from the first, well and the second well; and
    a first transistor formed in the third well,
    the second signal line being connected to the third well.

4. The semiconductor device of claim 3,
    wherein the semiconductor substrate has, in the surficial portion thereof, an epitaxially-grown semiconductor layer, and
    the third well is located deeper than the epitaxially-grown semiconductor layer.

5. The semiconductor device of claim 3, further comprising:
a fourth well provided in the semiconductor substrate, so as to be isolated from the first well and the second well;
a second transistor provided in the fourth well, and having a gate insulating film, thicker than that of the first transistor.

6. The semiconductor device of claim 5,
wherein the semiconductor, substrate has, in the surficial portion thereof, an epitaxially-grown semiconductor layer, and
the fourth well extends from surface of the epitaxially-grown semiconductor layer.

7. The semiconductor device of claim 1,
wherein the semiconductor substrate has, in the surficial portion thereof, an epitaxially-grown semiconductor layer,
the first well extends from the surface of the epitaxially-grown semiconductor layer, and
the second well is located deeper than the epitaxially-grown semiconductor layer.

8. The semiconductor device of claim 1,
wherein the Schottky diode is formed by a Schottky junction between the first well, and an electrode formed over the first well.

9. The semiconductor device of claim 1,
wherein the first PN junction diode is formed by a PN junction between the second well, and an imparity layer formed in the surficial portion of the second well and having a conductivity type reverse to chat of the second well.

10. The semiconductor device of claim 1, further comprising:
a fifth well provided in the semiconductor substrate, so as to be isolated from the first well and the second well; and
a second PN junction diode formed in the fifth well, with an impurity concentration of the PN junction thereof set higher than an impurity concentration of the Schottky junction of the Schottky barrier diode, and being connected antiparallel with the Schottky barrier diode,
a series-connected body of the first PN junction diode and the second PN junction diode, and the Schottky barrier diode being connected antiparallel.

11. The semiconductor device of claim 1, further comprising:
a sixth well provided in the semiconductor substrate, so as to be isolated from the first well and the second well, and
a third PN junction diode formed in the sixth well, with an impurity concentration of the PN junction thereof set higher than an impurity concentration of the Schottky junction of the Schottky barrier diode, and being connected antiparallel with, the Schottky barrier diode.

* * * * *